United States Patent
Nishizaka et al.

(10) Patent No.: US 6,788,562 B2
(45) Date of Patent: Sep. 7, 2004

(54) SEMICONDUCTOR MEMORY DEVICE AND WRITE/READOUT CONTROLLING METHOD ERROR CORRECTION CODE DECODING DEVICE

(75) Inventors: Teiichiro Nishizaka, Kanagawa (JP); Toshikatsu Jinbo, Kanagawa (JP); Takaki Kohno, Kanagawa (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 10/328,435

(22) Filed: Dec. 23, 2002

(65) Prior Publication Data

US 2003/0117827 A1 Jun. 26, 2003

(30) Foreign Application Priority Data

Dec. 26, 2001 (JP) ......................................... 2001-394216
Sep. 5, 2002 (JP) ......................................... 2002-259892

(51) Int. Cl.$^7$ ............................................... G11C 7/00
(52) U.S. Cl. .......................................... 365/63; 365/51
(58) Field of Search ..................................... 365/63, 51

(56) References Cited

U.S. PATENT DOCUMENTS 5,822,248 A * 10/1998 Satori et al. ............ 365/185.21
6,115,288 A * 9/2000 Amanai et al. ......... 365/185.17

FOREIGN PATENT DOCUMENTS

| JP | 06-283689 | 7/1994 | ......... H01L/27/112 |
| JP | 08-032035 | 2/1996 | ......... H01L/27/115 |
| JP | 2001-512290 | 8/2001 | ......... H01L/21/8247 |

* cited by examiner

*Primary Examiner*—Vu A. Le
(74) *Attorney, Agent, or Firm*—Hayes Soloway P.C.

(57) ABSTRACT

Disclosed is a device and a method for enabling a programmable semiconductor memory device to provide a block selection transistor of a high voltage withstand type, to prevent the voltage from being decreased at the time of programming, to prevent the readout current from being decreased and to provide a constant sum resistance of the electrically conductive regions without dependency upon the memory cell locations.

45 Claims, 33 Drawing Sheets

Program1

Program2

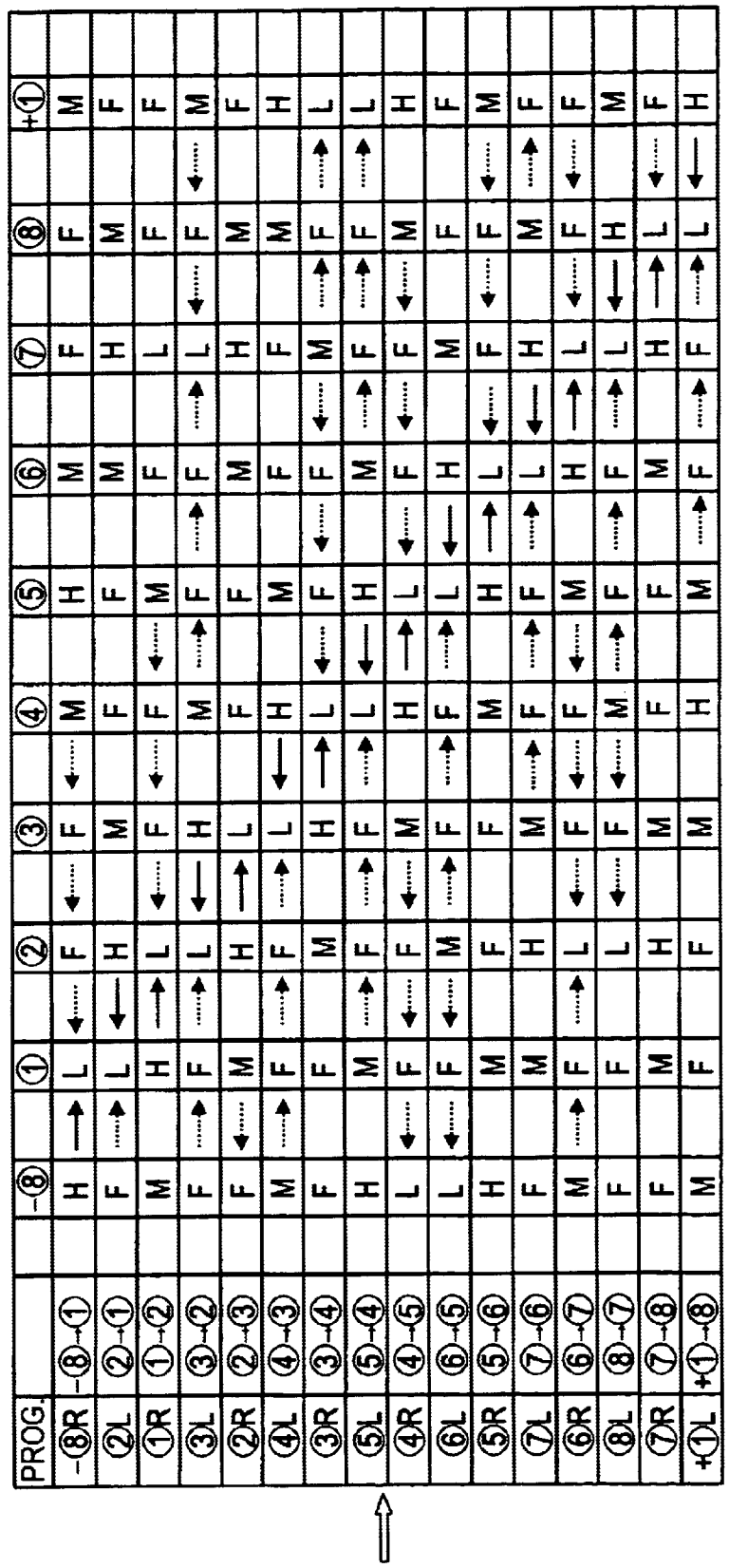

FIG. 7b

SEMICONDUCTOR MEMORY DEVICE AND WRITE/READOUT CONTROLLING METHOD ERROR CORRECTION CODE DECODING DEVICE

FIELD OF THE INVENTION

This invention relates to a semiconductor memory device and, more particularly, to an electrically programmable non-volatile semiconductor memory device and a write/read controlling method for the semiconductor memory device.

BACKGROUND OF THE INVENTION

A semiconductor memory device, in which bit lines of a memory cell array are formed by impurity electrically conductive areas provided on a substrate surface, lends itself to increasing the memory capacity, because there is no isolation area between neighboring transistors separating the memory cells and hence the memory cell can be reduced in size. However, such semiconductor memory device is not up to high-speed operations, due to bit-line resistance or stray capacitance, because the bit lines are formed by impurity doped electrically conductive areas provided on a silicon substrate. The bit line length is increased due to increased storage capacity to render the high speed operation difficult. Moreover, since the bit line length is increased, the write voltage applied to a memory cell tends to be lowered due to bit line resistance.

In JP Patent Kokai Publication JP-A-6-283689, for example, there is disclosed a mask ROM configuration in which the resistance of a bit line formed by an electrically conductive region is lowered to provide for a high-speed operation. FIG. 16 shows a plan view of a memory cell of a semiconductor memory device. FIG. 17 shows its circuit configuration. On a major surface of a p-type silicon substrate 10, a plural number of n-type electrically conductive regions (N+ diffusion layers) 11, operating as source or drain of the memory cell transistor, are arranged parallel to one another at a preset interval in-between. The electrically conductive regions 11 are arranged for traversing the memory cell region and are in the form of a letter U with the web of the letter U being connected with an n-type connecting electrically conductive region 12 for a length equal to two columns. On the outer side of each conducting electrically conductive region 12 is arranged an isolated n-type auxiliary electrically conductive region 13 at a preset distance from each connecting electrically conductive region 12. On the silicon substrate 10, carrying these electrically conductive region 11, 12 and 13, a plural number of gate electrodes 15 of polycrystalline silicon are arrayed parallel to one another, with the interposition of gate insulating films, for intersecting the electrically conductive regions 11. The gate electrodes operate as word lines, such that a preset voltage is selectively applied to a row specified by row address data. On both sides of these gate electrodes 15 are arrayed selecting gate electrodes 16, similarly of polycrystalline silicon, so as to be astride the conducting electrically conductive regions 12 and the auxiliary electrically conductive regions 13. This forms a selecting transistor T2 having the selecting gate electrode 16, connecting electrically conductive regions 12 and the auxiliary electrically conductive regions 13 as its gate, source and drain, respectively. Since this selecting transistor T2 is provided every four columns on one side of the electrically conductive region 11, the gate width can be set to a broader value, depending on the size of the auxiliary electrically conductive regions 13, such that the resistance can be set to a sufficiently small value.

Since the neighboring ones of these selecting transistors T2 are driven with the common gate electrode, a P-type impurity region 19 is formed between the neighboring selecting transistors T2 to prevent current conduction across the neighboring selecting transistors T2. This device-to-isolation is achieved by for example ion implantation.

In the transistor T1, forming each memory cell, the gate electrodes, consecutive from row to row, each form a word line WL. The gate electrodes are selectively activated by selection signals derived from row address data. Similarly, in the selection transistor T2, the selecting gate electrodes 16 are common on both sides of the gate electrodes 15 such that the selecting gate electrodes 16 each form a selecting control line SL. An aluminum line 18 forms a main bit line BI, and is selectively activated on receipt of a selection signal derived from column address data. That is, when two of the aluminum lines 18 are specified in dependence upon address data, and the source voltage and the grounding voltage are applied to the so specified aluminum lines, while the selection transistor T2 connecting to the specified aluminum lines 18 is turned on in order to connect its electrically conductive region 11 to the aluminum lines 18, the two neighboring columns of the electrically conductive regions 11 are selectively activated. With the two aluminum lines, the voltage applied in the selected state is not fixed to one of the source voltage or to the ground voltage, such that the source voltage is switched to the ground voltage or vice versa depending on the combination of the selected bit lines BL.

In selecting the bit lines BL, either a neighboring pair of the bit lines or a pair of a bit line and a bit line next to the next bit line is selected. Thus, one of the transistors T1 arranged in a matrix configuration is specified in dependence upon address data and potential variations in the electrically conductive region 11 due to on/off of the MOS transistor T1 are checked by a sense amplifier, not shown, selectively connected to the aluminum line (main bit line).

Meanwhile, the memory cell of the semiconductor memory device, shown in FIGS. 16 and 17, is read-only, such that it does not allow for writing. In a configuration which allows for writing, as in an EEPROM (Electrically Erasable and Programmable Read-Only Memory), a high voltage is applied to the source or to the drain of the memory cell transistor. If the transistor is of the high voltage withstand type to diminish the on-resistance and to suppress the lowering of the current at the time of writing, the junction withstand voltage characteristics are lowered in an impurity layer serving for device isolation across the selecting transistors, thus causing breakdown of the selecting transistor.

In JP Patent Kokai Publication No. JP-A-8-32035, for example, there is disclosed a semiconductor device having two layer gate structure type memory cells, in which a diffusion layer forming local data lines (LDL0 and LDL1) of the memory cell are shared by memory cell MCs provided on a identical column and a diffusion layer forming a local source line (LSL0) is shared by memory cell MCs provided on neighboring two columns, and in which there are provided sub data lines (SDL0 and SDL1) and sub source line (SSL0), which are made up of metal wiring layer having a small sheet resistance, and being arranged in parallel corresponding to the diffusion layers composing common drain and source for coupling between the associated diffusion layer by preset number of contacts (CB and CC).

SUMMARY OF THE DISCLOSURE

Accordingly it is an object of the present invention to provide a programmable semiconductor memory device, employing an electrically conductive layer as an impurity layer, in which the resistance value of the electrically conductive layer by the impurity layer may be diminished and in which the selecting transistors may be of the high voltage withstand type.

It is another object of the present invention to provide a semiconductor memory device in which the voltage may be prevented from being lowered at the time of writing in a memory cell and in which the memory cell readout current may be prevented from being decreased, and a method for writing and readout for the semiconductor memory device. It is yet another object of the present invention to provide a semiconductor memory device in which the sum of the resistance values of the electrically conductive layers by an impurity layer connecting to a memory cell may be kept constant without dependency on the arrangement of the memory cells in the memory cell array.

The above and other objects are attained by a semiconductor memory device, according to one aspect of the present invention, providing means for accomplishing at least one of the above objects, comprises a plurality of electrically conductive regions extending parallel to one another on a substrate surface forming a memory cell array area, wherein the electrically conductive regions are connected two by two by wiring to form a plurality of sets of sub bit lines, each set of the sub bit lines being connected to a main bit line via a selection transistor, a plurality of the selection transistors are arranged on both ends of the memory cell array in a facing relation to one another, and wherein a plural number of sets of the sub bit lines respectively connected to plural selection transistors on one end of the memory cell array and a plural number of sets of the sub bit lines respectively connected to plural selection transistors on the opposite end of the memory cell array are arranged in an interchanged fashion relative to one another.

According to the present invention, there are arranged, in a region in the memory cell array area defined between the sub bit lines of the set of sub bit lines, each one of two sets of sub bit lines respectively connected via selection transistors to two neighboring main bit lines on both sides of a main bit line to which is connected the set of sub bit lines, and each one of two sets of sub bit lines respectively connected to the two neighboring main bit lines via selection transistors on the opposite side of the memory cell array, totaling at four sub bit lines.

According to the present invention, isolation between the selection transistors is by a field oxide film.

Of respective longitudinal ends of the paired electrically conductive regions of the set of sub bit lines, the respective ends lying on the side of the selection transistor associated with the set of the sub bit lines lying on the side of the selection transistor associated with the set of sub bit lines (referred to as one side ends) are interconnected via a wiring of an upper substrate layer.

According to the present invention, one side ends of the paired electrically conductive regions forming the set of sub bit lines, lying on the side of the selection transistors associated with the set of the sub bit lines, are interconnected by a wiring forming an upper substrate layer, while the side ends of the paired electrically conductive regions longitudinally opposite to the aforementioned on side ends are interconnected by a wiring forming an upper substrate layer.

According to the present invention, one side ends lying on the side of the selection transistors associated with the set of the sub bit lines, of one or both of the paired electrically conductive regions forming the set of sub bit lines, interconnected by the wiring, are connected to the longitudinally opposite ends thereof by an upper substrate layer.

According to the present invention, the paired electrically conductive regions forming the set of sub bit lines, interconnected by the wiring, are divided into plural stages from one longitudinal end of the memory cell array to the opposite side thereof, while thee is provided a wiring formed on an upper layer on the substrate in association with the set of the sub bit lines, so as to straddle the plural stages of the paired electrically conductive regions from the one ends connected to the selection transistors to the opposite sides. The wiring extending astride the plural stages of the paired electrically conductive regions is connected to the wiring interconnecting the paired electrically conductive regions of the respective stages.

Of respective longitudinal ends of the paired electrically conductive regions of the set of sub bit lines, the ends lying on the side of the selection transistor associated with the set of sub bit lines (referred to as one side ends) are interconnected via a first wiring of an upper substrate layer, and wherein the ends longitudinally opposite to the one lateral side end, are interconnected by a second wiring on an upper layer on the substrate, while the first wiring and the second wiring are interconnected via a third wiring on an upper layer on the substrate.

Of respective longitudinal ends of the paired electrically conductive regions of the set of sub bit lines, the ends lying on the side of the selection transistor associated with the set of sub bit lines (referred to as one side ends) are interconnected via a first wiring of an upper substrate layer, and wherein the ends longitudinally opposite to the one lateral side end, are interconnected by a second wiring on an upper layer on the substrate, both longitudinal ends of the electrically conductive regions being interconnected via a third wiring on an upper layer on the substrate.

According to the present invention, one end of one of the paired electrically conductive regions forming the set of sub bit lines, is connected to the longitudinally opposite end of the other electrically conductive region by a wiring provided on an upper layer on the substrate. Preferably, one end on one side connected to the selection transistor of one of the paired two electrically conductive regions forming the set of sub bit lines is connected to the longitudinally opposite end of the other electrically conductive region by a wiring provided on an upper layer on the substrate.

According to the present invention, there are provided a plurality of electrically conductive regions extending parallel to one another on a substrate surface forming a memory cell region, two of the electrically conductive regions are connected as a pair to form a set of sub bit lines; the one set of the sub bit lines being connected to a main bit line via a selection transistor, a plurality of the selection transistors are arranged facing to one another on both longitudinal end sides of the memory cell array, the memory cell array is formed by a plurality of (M) sets, each set being composed of a plurality of (N) word lines, and the pairs of electrically conductive regions each forming the set of sub bit lines being M sets of electrically conductive regions in keeping with the M sets forming the memory cell array. For each of the M sets of paired electrically conductive regions, the end on one longitudinal end side of one of the paired electrically conductive regions and the end on the other longitudinal end side of the other of the paired electrically conductive regions are interconnected via a wiring on an upper layer on the substrate. The paired electrically conductive regions of each of the M sets are connected common to one of the selection transistors via the wiring on an upper layer on the substrate.

The present inventors have recognized that when the structure of the U-shaped electrically conductive regions is applied to for example a programmable non-volatile semiconductor storage device, it is necessary to take suitable measures such as decreasing the write current. Another aspect-related method of the present invention is a method for controlling the writing in a semiconductor storage device in which a set of sub bit lines are formed by interconnecting a pair of electrically conductive regions extending parallel to each other on a substrate surface, a plurality of selection transistors for connecting a set of sub bit lines to an associated main bit line are arranged on both longitudinal end sides of a memory cell array, and in which a plurality of sets of sub bit lines respectively connected to the selection transistors arranged on one and on the other longitudinal end sides of the memory cell array are arranged in an interchanged fashion. The method comprises applying a ground potential to a first one of two neighboring electrically conductive regions associated with a selected memory cell, a preset positive voltage to a gate electrode associated with the selected memory cell and for applying, when writing in the memory cell, a voltage intermediate the positive voltage applied to the second electrically conductive region and the ground potential to a third electrically conductive region neighboring to the second electrically conductive region to which the positive voltage is applied, the third electrically conductive region lying on the opposite side to the second electrically conductive region to which the positive voltage is applied.

In the write controlling method according to the present invention, there are applied a ground potential to a first one of two neighboring electrically conductive regions associated with a selected memory cell, a preset positive voltage to a gate electrode associated with the selected memory cell and, when writing in the memory cell, a voltage of the same level as the second electrically conductive region to a third electrically conductive region neighboring to the second electrically conductive region to which the positive voltage is applied, the third electrically conductive region lying on the opposite side to the first electrically conductive region. There is also applied a ground potential to a first one of two electrically conductive regions associated with a selected memory cell, a preset positive voltage to a gate electrode associated with the selected memory cell and for applying, when writing in the memory cell, a positive voltage of the same level as that of the second electrically conductive region, to an electrically conductive region neighboring to the second electrically conductive region supplied with the positive voltage, and to an electrically conductive region forming sub bit lines having an electrically conductive region other than the first electrically conductive region, the electrically conductive region forming sub bit lines having an electrically conductive region other than the first electrically conductive region being from the electrically conductive regions neighboring to a third by being electrically conductive region forming a set of the sub bit lines by paired to the second electrically conductive region. There is also applied a voltage intermediate the positive voltage supplied with the positive voltage and the ground voltage to at least one of the first electrically conductive region and an electrically conductive region arranged between a fourth electrically conductive region forming a set of sub bit lines by being paired with the first electrically conductive region and the electrically conductive region to which is applied the positive voltage.

In accordance with another aspect of the present invention, there is provided a method of controlling read operation in a semiconductor storage device in which a set of sub bit lines are formed by interconnecting a pair of electrically conductive regions extending parallel to each other on a substrate surface, a plurality of selection transistors for connecting a set of sub bit lines to an associated main bit line are arranged on both longitudinal end sides of a memory cell array, and in which a plurality of sets of sub bit lines respectively connected to the selection transistors arranged on one and on the other longitudinal end sides of the memory cell array are arranged in an interchanged fashion. The method comprises applying a ground potential to a first one of two neighboring electrically conductive regions associated with a selected memory cell, a preset positive voltage to a gate electrode associated with the selected memory cell and for applying, when writing in the memory cell, a voltage of the same level as the second electrically conductive region to a third electrically conductive region neighboring to the second electrically conductive region to which the positive voltage is applied, the third electrically conductive region lying on the opposite side to the first electrically conductive region.

In accordance with another aspect of the present invention, a method of controlling read operation in a semiconductor storage device comprises applying a ground potential to a first one of two neighboring electrically conductive regions associated with a selected memory cell, a preset positive voltage to the second electrically conductive region and a preset positive voltage to a gate electrode associated with the selected memory cell, and for applying, when reading out from the memory cell, a positive voltage of the same level as that of the second electrically conductive region, to an electrically conductive region neighboring to the second electrically conductive region supplied with the positive voltage, and to an electrically conductive region forming sub bit lines having an electrically conductive region other than the first electrically conductive region, the electrically conductive region forming sub bit lines having an electrically conductive region other than the first electrically conductive region being from the electrically conductive regions neighboring to a third by being electrically conductive region forming a set of the sub bit lines by paired to the second electrically conductive region, and applying a ground voltage to at least one of the first electrically conductive region and an electrically conductive region arranged between a fourth electrically conductive region forming a set of sub bit lines by being paired with the first electrically conductive region and the electrically conductive region to which is applied the positive voltage.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 6a and 6b illustrate write operation in an embodiment of the present invention.

FIGS. 7a and 7b illustrate write operation in an embodiment of the present invention.

PREFERRED EMBODIMENTS OF THE INVENTION

Figure 1:
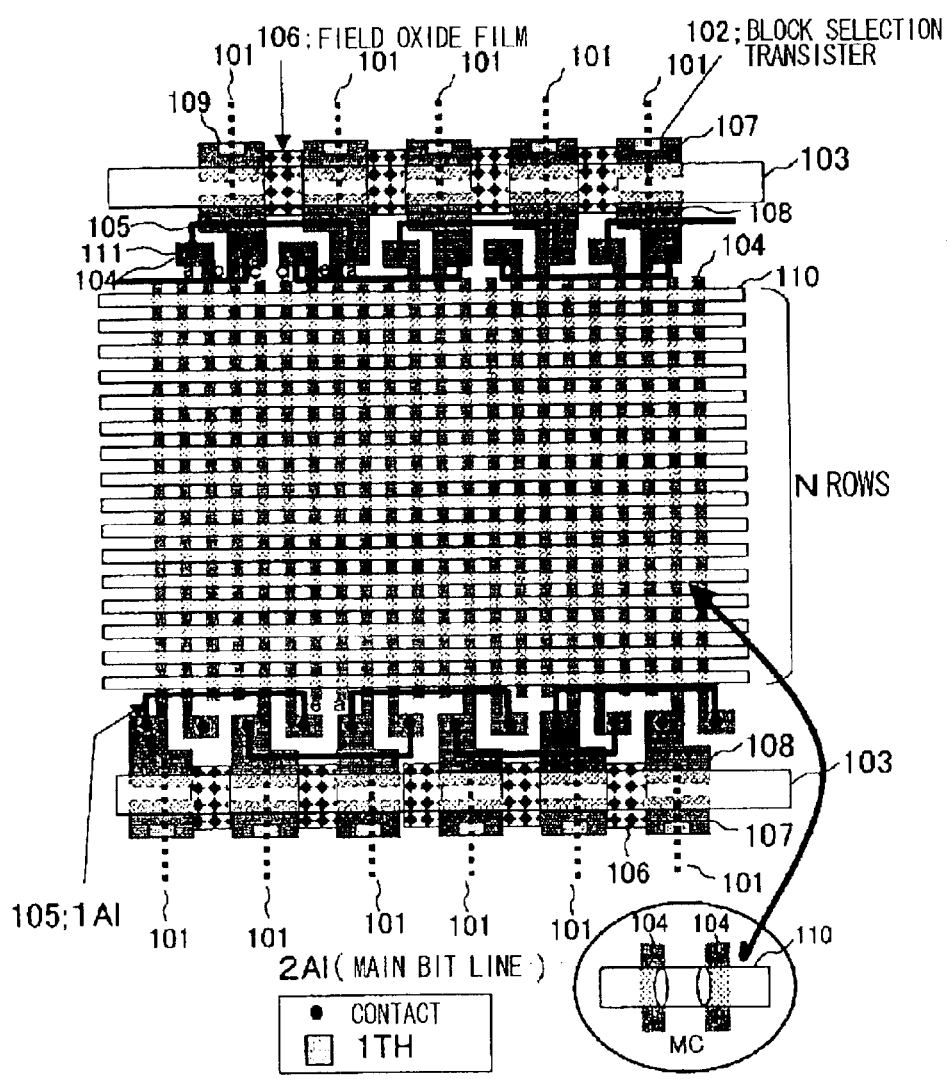
FIG. 1 is a diagram showing a layout according to an embodiment of the present invention.

The embodiments of the present invention are now explained with reference to the above-described Figures. As shown in FIG. 1, in a semiconductor memory device according to the invention, two of plural electrically conductive regions, each extending parallel to one another on a substrate surface along a direction and which are fored by impurity doped diffusion layers, such as N+ diffusion layers, such as (a, a), are paired to form a pair of the electrically conductive regions, with the paired electrically conductive regions being interconnected by a wiring (105) provided on an upper substrate layer, such as an aluminum wiring layer, to compose a set of sub bit lines. A plural number of selection transistors (102), each connecting a set of the sub bit lines to an associated main bit line (101), are arranged on both sides of the memory cell array. A plural number of sets of the sub bit lines respectively connected to plural selection transistors on one end of the memory cell array and a plural number of sets of the sub bit lines respectively connected to plural selection transistors on the opposite end of the memory cell array are arranged alternately.

If attention is directed to the paired electrically conductive regions (a, a), connected to the main bit line (101) via selection transistor (102) on one side of the memory cell array, each one (b, e) of the paired electrically conductive regions, forming two sets of the sub bit lines on both sides of the main bit line, and each one (c, d) of the paired electrically conductive regions, forming two sets of the sub bit lines, respectively connected to two neighboring main bit lines via selection transistor on the opposite side of the memory cell array, totaling at four electrically conductive regions, are arranged in the sequence of b, c, d and e:

The paired electrically conductive regions (104), forming a set of sub bit lines, are connected to one wiring (105) of the wiring layer (1A1) on the substrate by a contact (111) at each end on the side of the selection transistors (102) associated with the set of the sub bit lines.

A pair of two electrically conductive regions (104), spaced apart from each other along one direction on the substrate surface and extending parallel to each other are interconnected by an upper substrate layer wiring (105) to form a set of the sub bit lines in a layout structure such that each one b, e of a plural number of sets of the sub bit lines respectively connected to plural selection transistors on one end of the memory cell array and each one c, d of a plural number of sets of the sub bit lines respectively connected to plural selection transistors on the opposite end of the memory cell array are arranged alternately to reduce the resistance of the electrically conductive regions forming sub bit lines as well as to increase the storage capacity and to reduce the chip area, in this embodiment, the distance from the remote end of the selection transistor is one half as large as that in case one bit line forms the sub bit line, with the resistance being also halved.

In a preferred embodiment of the present invention, isolation between the neighboring selection transistors is accomplished by a field oxide film (106).

Figure 10:
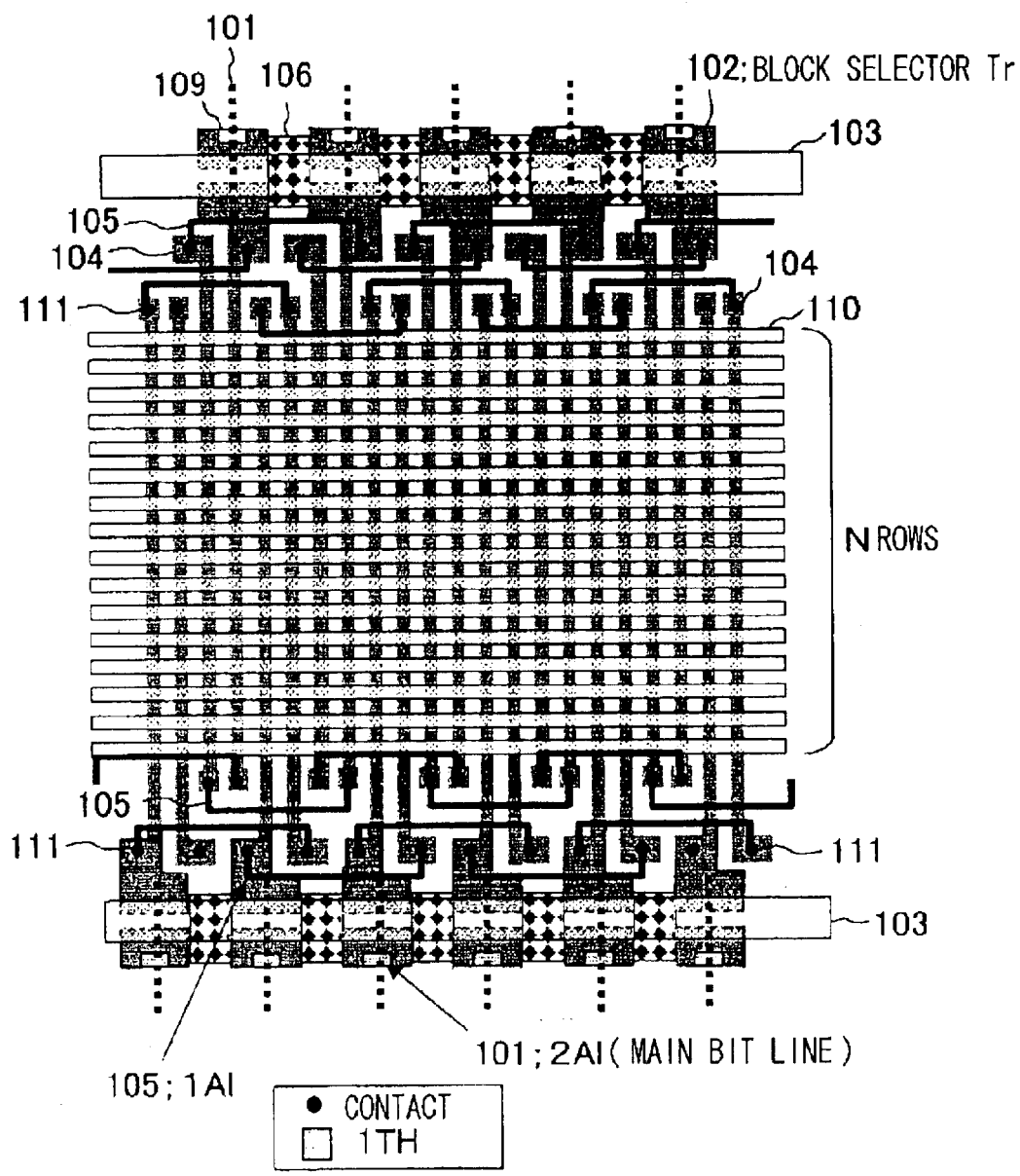
FIG. 10 is a diagram showing a layout according to a second embodiment of the present invention.
Figure 11:
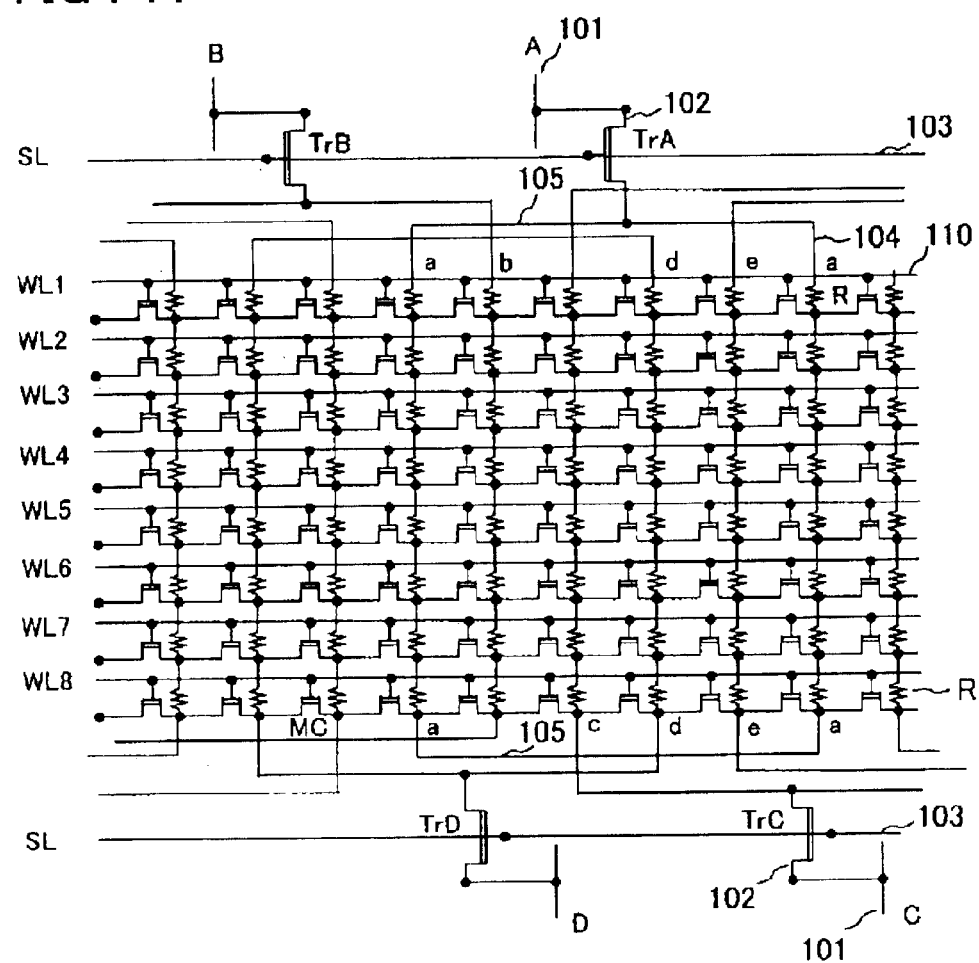
FIG. 11 is a diagram showing a circuit configuration according to a second embodiment of the present invention.

In a further embodiment of the present invention, shown in FIGS. 10 and 11, paired electrically conductive regions (104), forming one set of sub bit lines, have one ends on the side towards the selection transistors 102 (termed one side end), interconnected by a wiring (105) and the ends longitudinally opposite to the one side end also interconnected by wiring (105).

Figure 12:
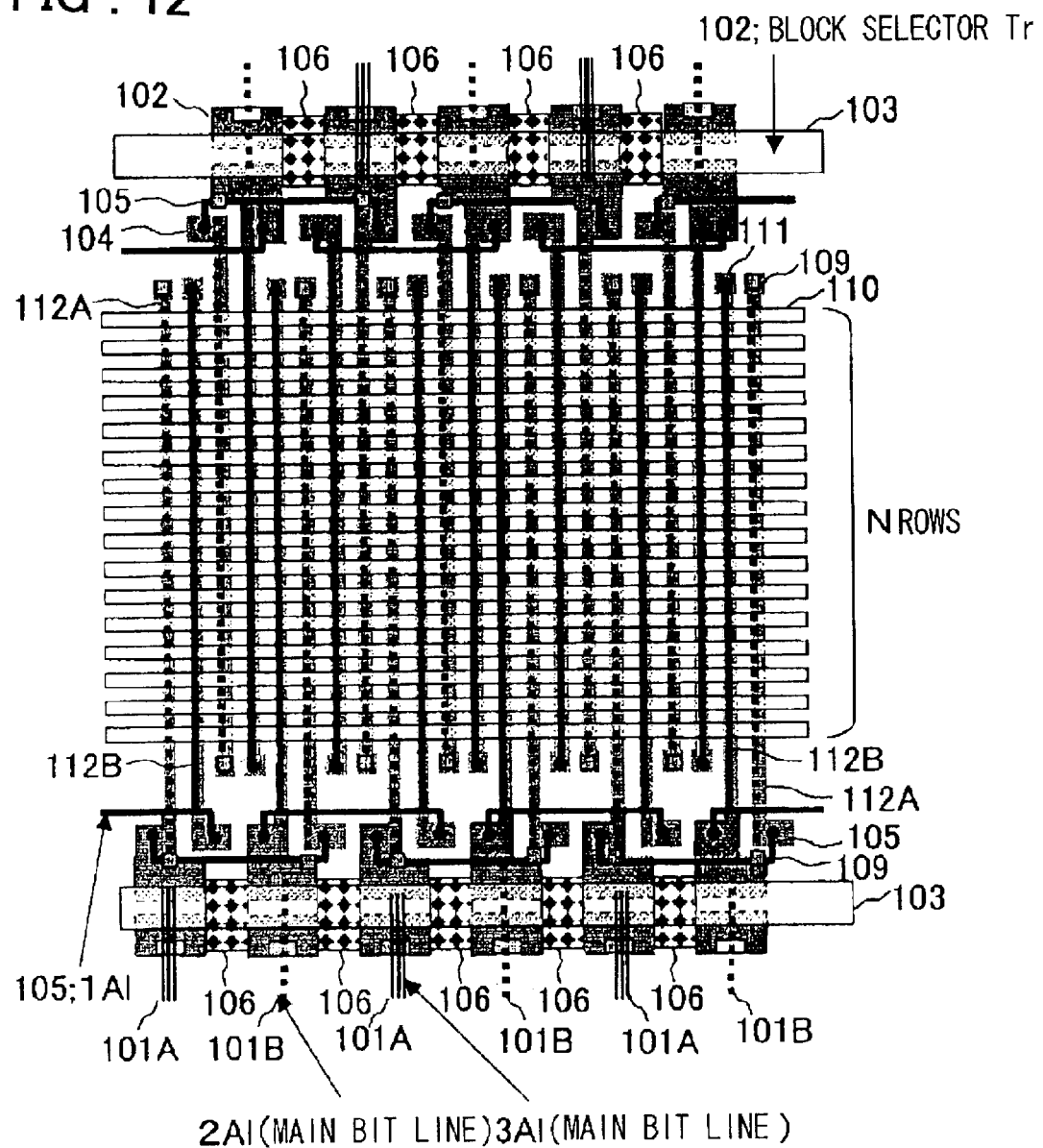
FIG. 12 is a diagram showing a layout according to a third embodiment of the present invention.
Figure 13:
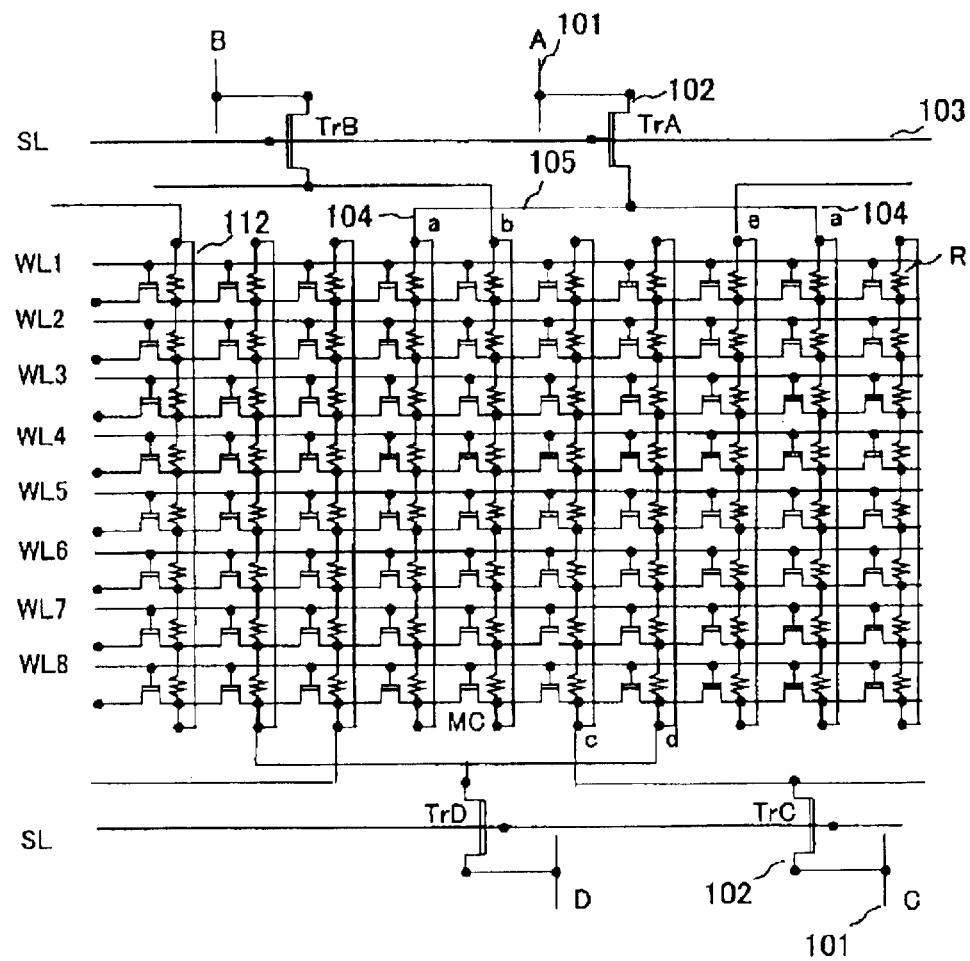
FIG. 13 is a diagram showing a circuit configuration according to a third embodiment of the present invention.

In a further embodiment of the present invention, as shown in FIGS. 12 and 13, one end of the paired electrically conductive regions (104), forming a set of sub bit lines, on the side towards the selection transistors 102 (termed one side end), and the other end longitudinally opposite to the one side end, is interconnected by a wiring (112) formed in a wiring layer on the substrate.

Figure 14:
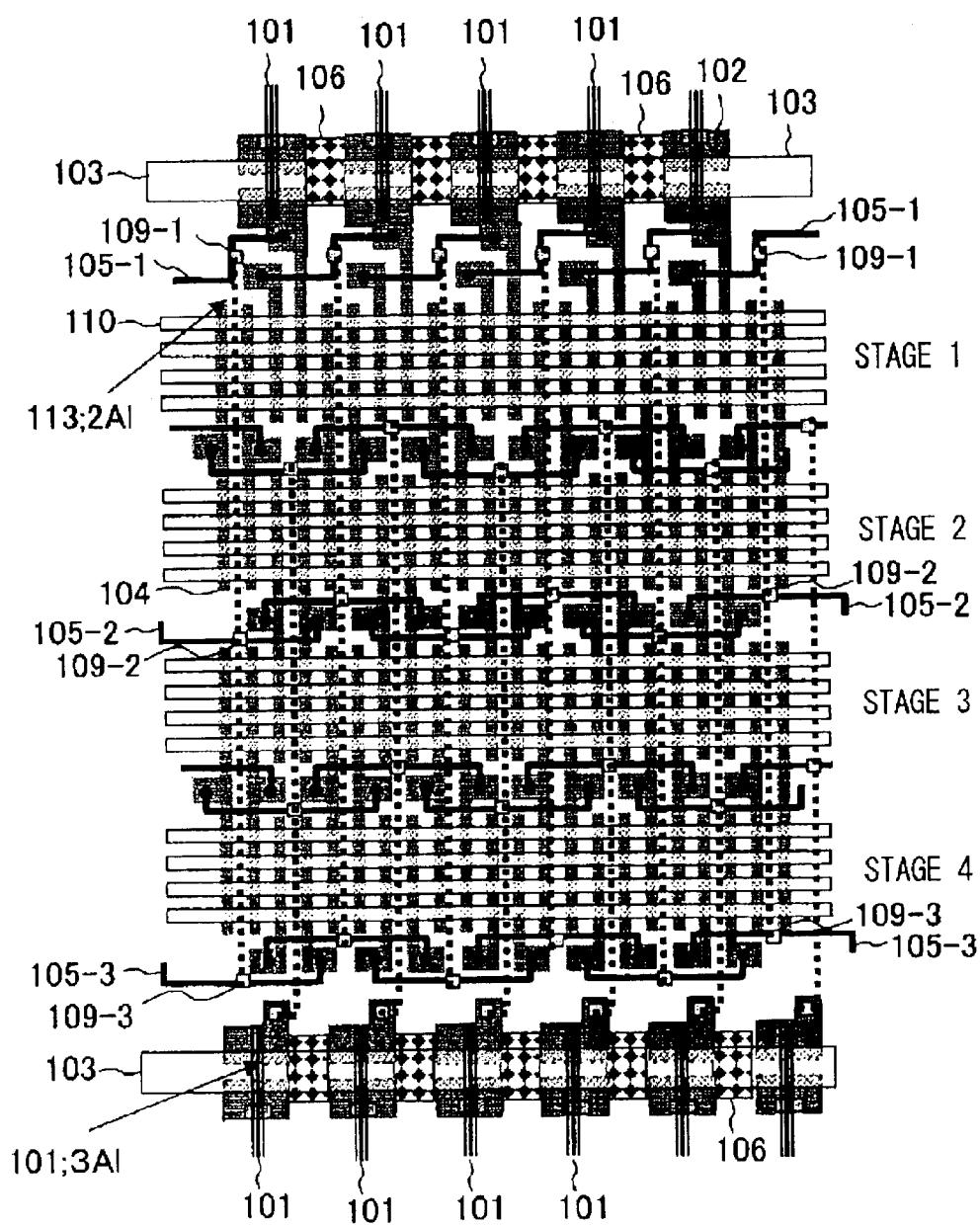
FIG. 14 is a diagram showing a layout according to a fourth embodiment of the present invention.
Figure 15:
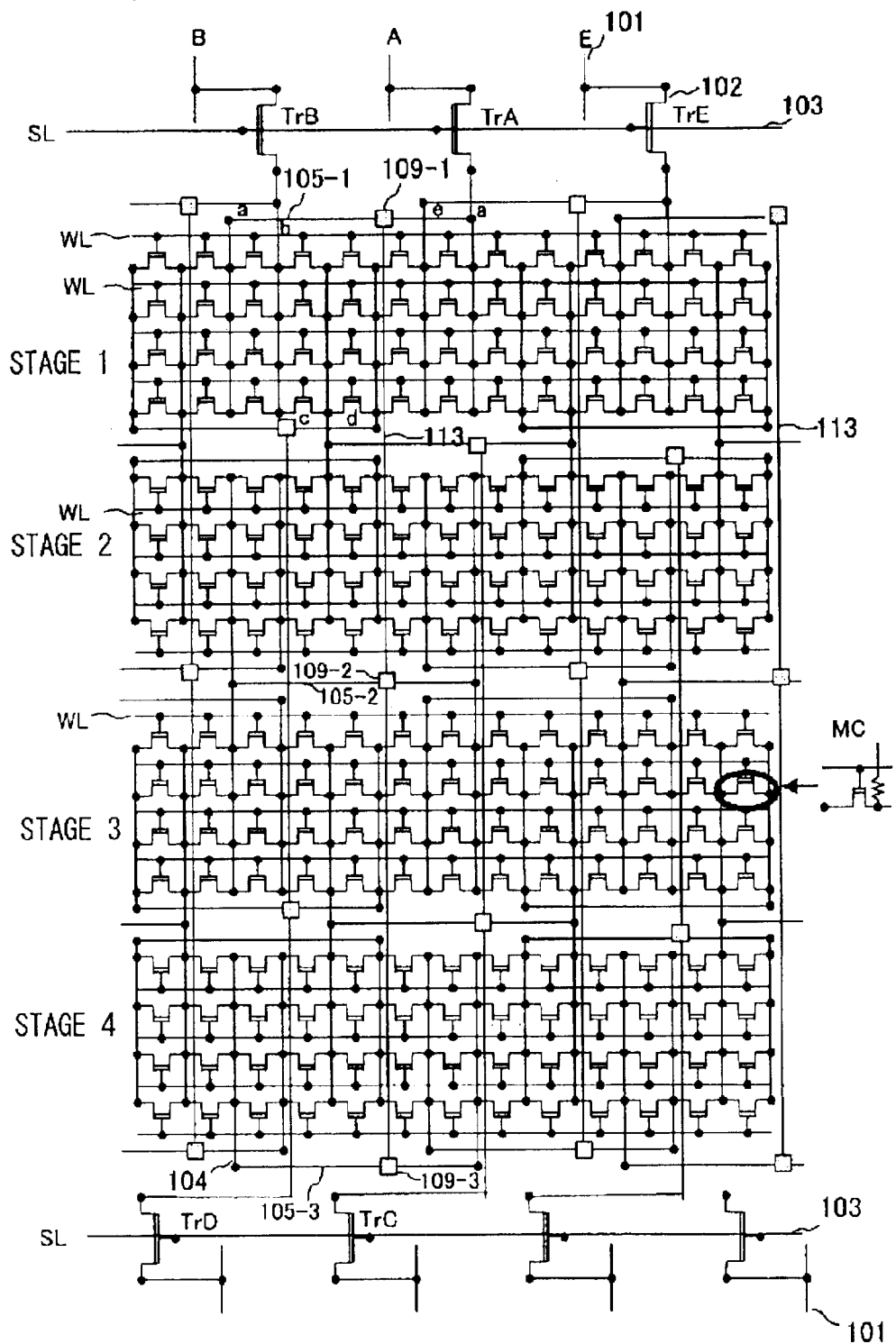
FIG. 15 is a diagram showing a circuit configuration according to the fourth embodiment of the present invention.
Figure 16:
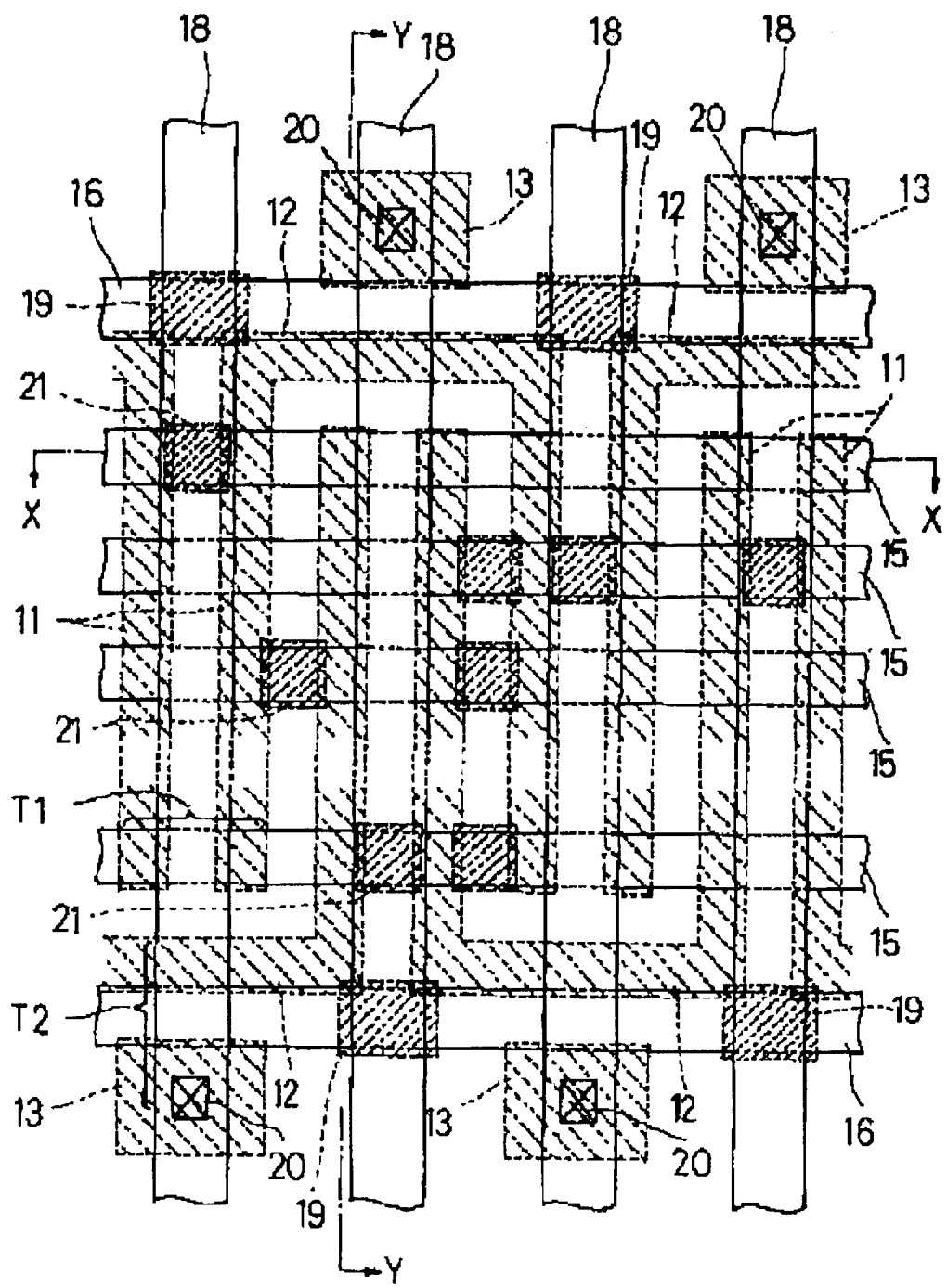
FIG. 16 shows a layout of a conventional non-volatile semiconductor memory device.
Figure 17:
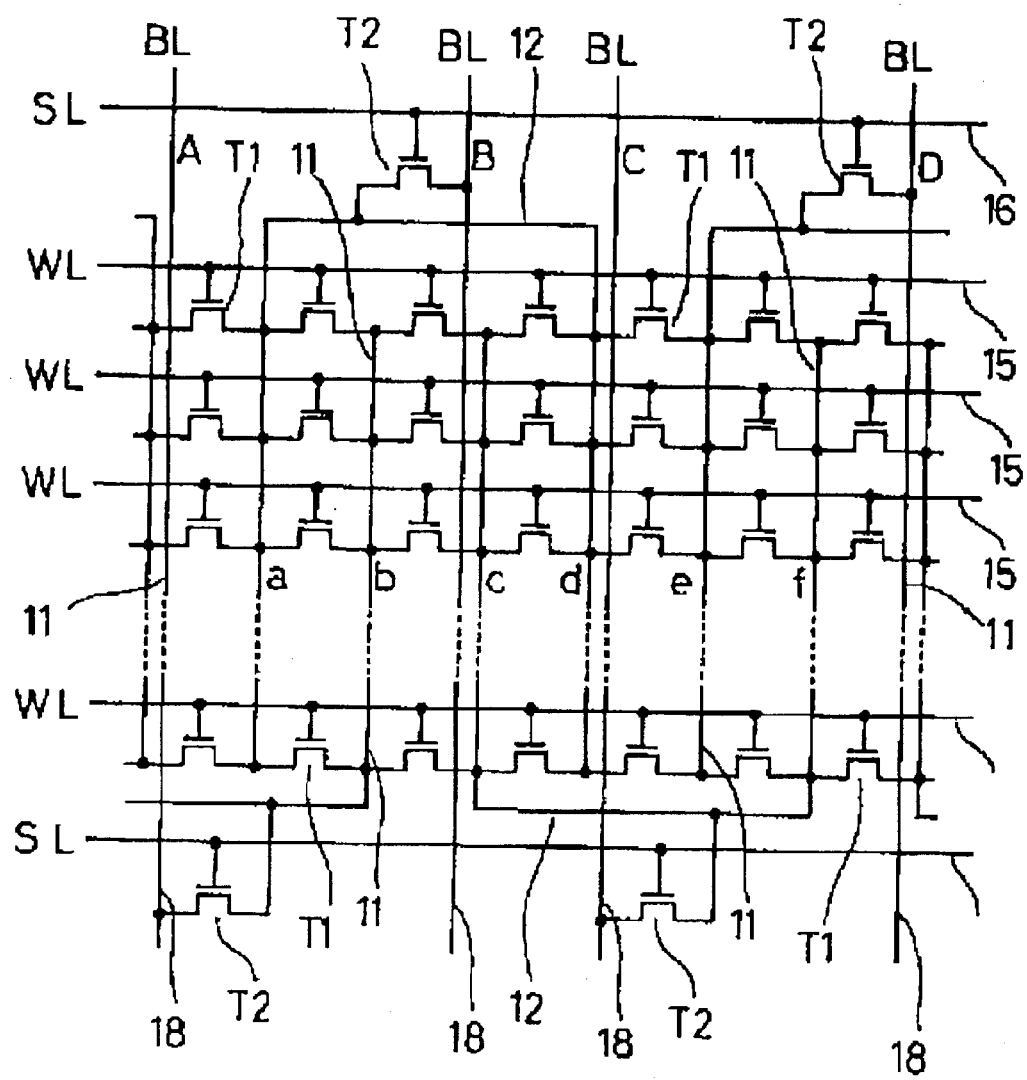
FIG. 17 is a diagram showing a circuit configuration of the conventional non-volatile semiconductor memory device.

In a further embodiment of the present invention, as shown in FIGS. 14 and 15, the paired electrically conductive regions forming a set of the sub bit lines interconnected over a wiring are provided in plural stages between the one side and the opposite side of the memory cell array, and the paired electrically conductive regions of the respective stages are interconnected by wirings (105-1, 105-2 and 105-3). There is provided a wiring (113) formed on an upper layer on the substrate in association with the set of the sub bit lines and which extends from one side of the memory cell array where the selection transistors (102) associated with the set of the sub bit lines are arranged to its opposite side across the plural stages of the paired electrically conductive regions. The wiring (113) extended across the plural stages of the paired electrically conductive regions is formed on for example the first wiring layer and is connected via through-holes (109-1, 109-2 and 109-3) to the wirings (105-1, 105-2 and 105-3) formed in for example the first wiring layer for interconnecting the paired electrically conductive regions of the respective stages.

Figure 18:
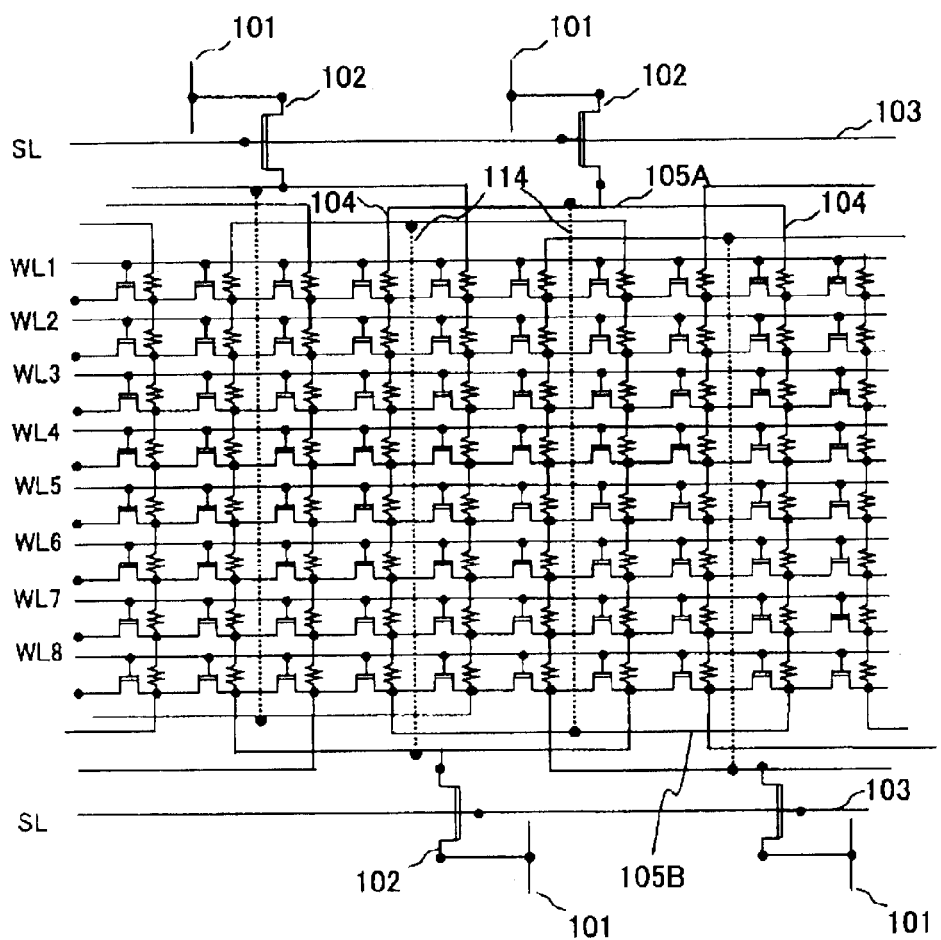
FIG. 18 is a diagram showing a circuit configuration according to a fifth embodiment of the present invention.

In a further embodiment of the present invention, as shown in FIG. 18, the ends of the paired electrically conductive regions (104) forming a set of the sub bit lines lying on the side of the selection transistor (102) associated with the set of the sub bit lines are interconnected via a first wiring (105A) on the upper substrate layer, while the ends of the paired electrically conductive regions (104) lying on the ends longitudinally opposite to the one ends are interconnected via a second wiring (105B) on the upper substrate layer. The first wiring and the second wiring are interconnected by a third wiring (114) on the upper substrate layer. The third wiring (114) is formed on for example a wiring layer lying above the first and second wiring layers (105A and 105B), and is connected via for example a through-hole with a mid portion of the first and second wiring layers (105A and 105B).

In a further embodiment of the present invention, as shown in FIG. 18, the ends of the paired electrically conductive regions (104) forming a set of the sub bit lines lying on the side of the selection transistor (102) associated with the set of the sub bit lines are interconnected via a first wiring (105A) on the upper substrate layer, while the ends of the paired electrically conductive regions (104) lying on the ends longitudinally opposite to the one ends are interconnected via a second wiring (105B) on the upper substrate layer. The paired electrically conductive regions have both longitudinal ends thereof interconnected via a third wiring (112) forming an upper substrate layer.

Figure 20:
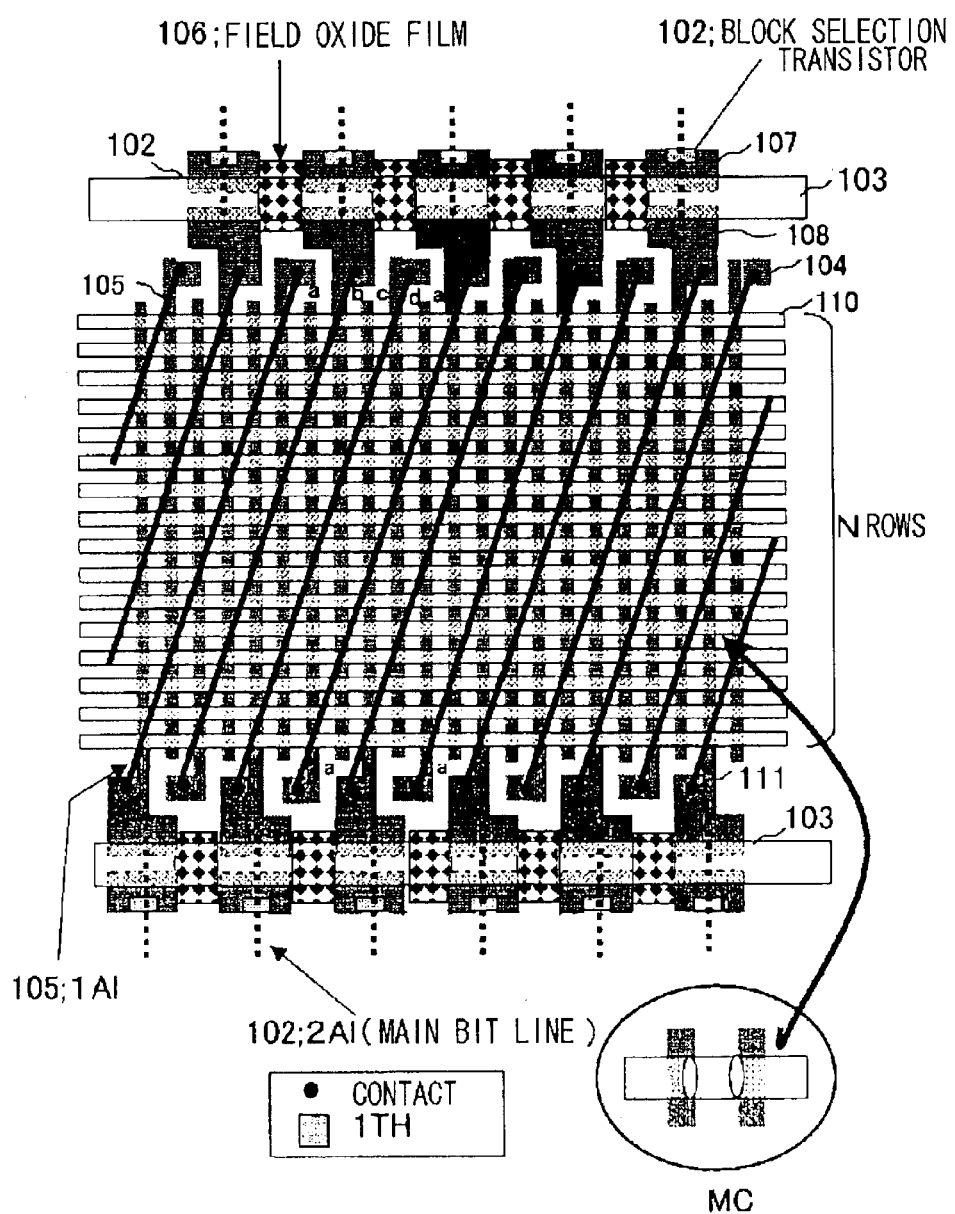
FIG. 20 is a diagram showing a layout according to a seventh embodiment of the present invention.
Figure 21:
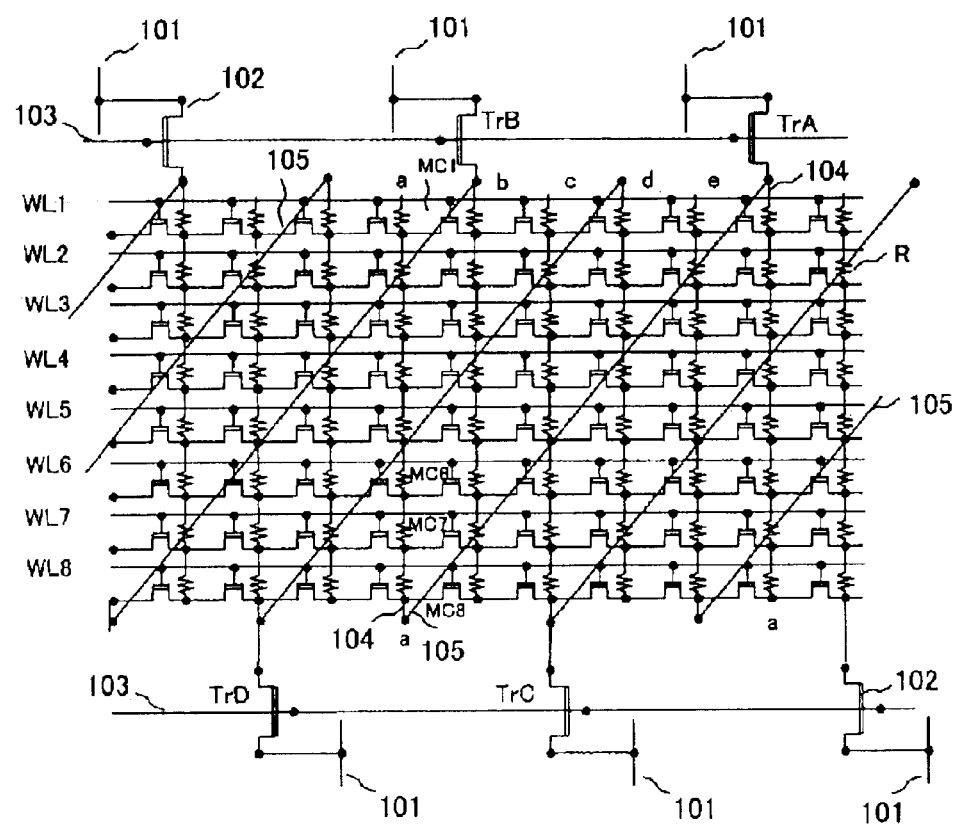
FIG. 21 is a diagram showing a circuit configuration according to a seventh embodiment of the present invention.

In a further embodiment of the present invention, as shown in FIGS. 20 and 21, the wiring for interconnecting two electrically conductive regions (104) is formed by a wiring (105) which is arranged on an upper substrate layer for interconnecting the one end (termed one side end) of one of the two paired electrically conductive regions forming one set of the sub bit lines and the end of the other electrically conductive region lying on the longitudinally opposite side. In this embodiment, similarly to the aforementioned embodiment, the selection transistors (102) for connecting to the main bit line 101 associated with the set of the sub bit lines are arranged on both sides of the memory cell array, and a plural number of sets of the sub bit lines connected to the selection transistors arranged on one side of the memory cell array and a plural number of sets of the sub bit lines connected to the selection transistors arranged on the opposite side of the memory cell array are arranged alternately. The configuration according the present invention overcomes position dependency of the write current to the memory cell and the readout current from the memory cell. In this embodiment, a plural number of stages of sets of the sub bit lines, in which the diametrically opposite ends of the paired electrically conductive regions are interconnected by the upper layer wiring, may be provided between the selection transistors on one side and those on the opposite side.

Figure 6A:
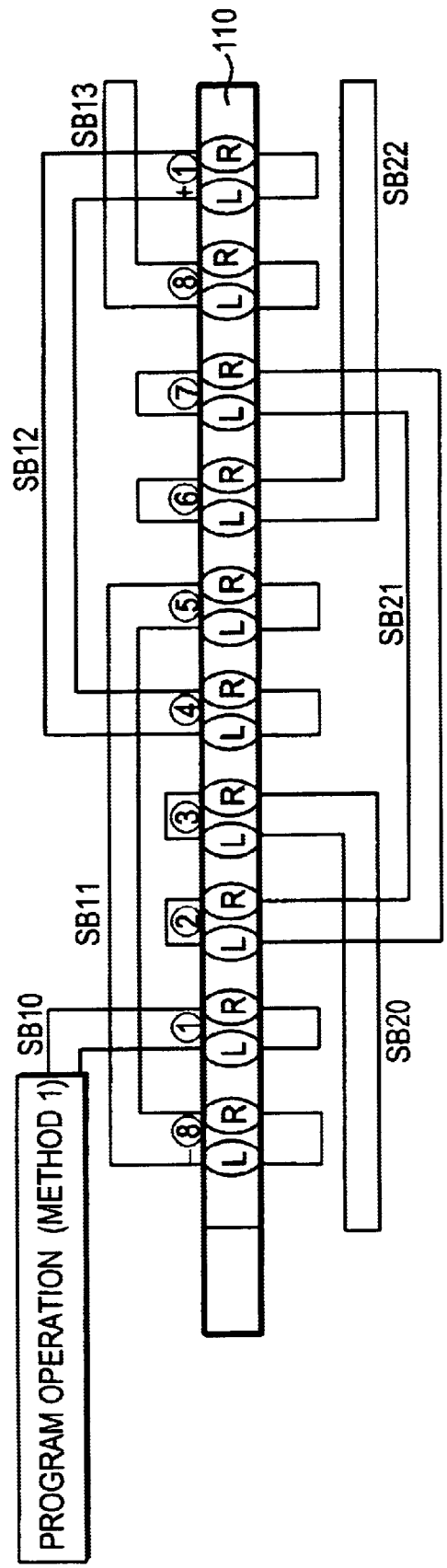

In a method of the present invention, in programming the semiconductor storage device, a ground potential is applied to a first one of two neighboring electrically conductive regions associated with a selected memory cell (for example, (4) in FIG. 6a; in the drawing, the figure is enclosed with a circle), a preset positive voltage is applied to a second electrically conductive region ((5) in FIG. 6) and a preset positive voltage Vg to a gate electrode (110) associated with the selected memory cell and, when writing in the memory cell, a voltage between the positive voltage applied to the second electrically conductive region and the ground potential is applied to a third electrically conductive region neighboring to the second electrically conductive region to which the positive voltage is applied ((6) in FIG. 6a), the third electrically conductive region lying on the opposite side to the second electrically conductive region to which the positive voltage is applied. This control suppresses the programming to the neighboring cell.

Figure 7A:
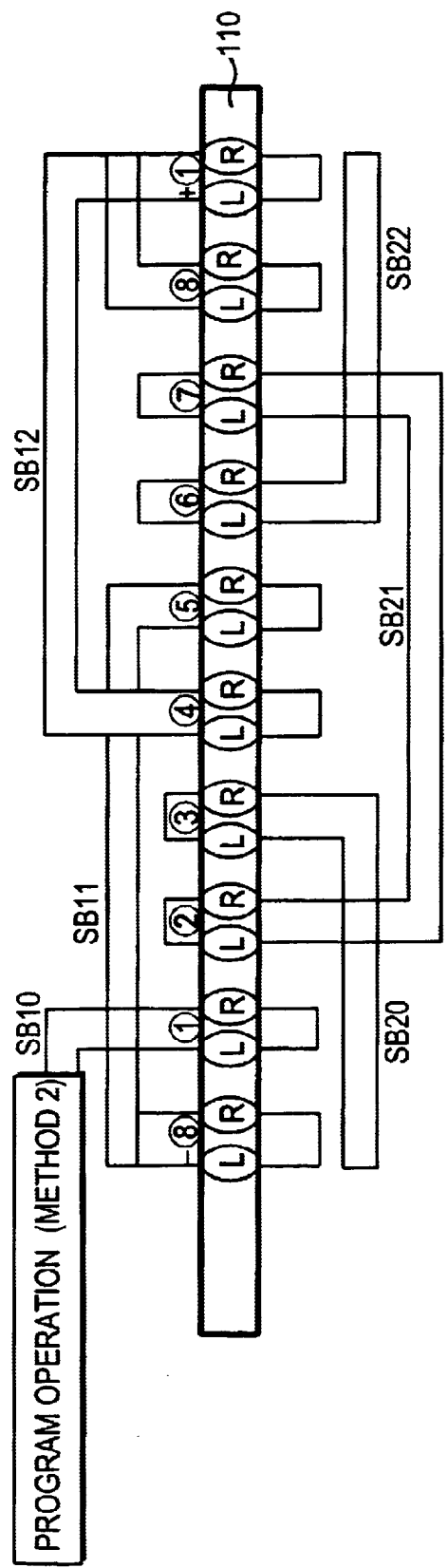

In an embodiment of the method of the present invention, in programming the semiconductor storage device, the ground potential is applied to the first one ((4) in FIG. 7a, in the drawing, the numeral 4 is enclosed with a circle) of the two neighboring electrically conductive regions corresponding to the selected memory cell, while a preset positive voltage is applied to the gate electrode associated with the memory cell and a preset positive voltage is applied to the gate electrode associated with the memory cell. In writing the memory cell, a positive voltage of the same level as that of the second electrically conductive region ((5) in FIG. 7a) is applied to an electrically conductive region (6 and 1 in FIG. 7a) neighboring to the second electrically conductive region ((5) in FIG. 7a) supplied with the positive voltage, and to an electrically conductive region forming sub bit lines having an electrically conductive region other than the first electrically conductive region ((4) in FIG. 7a), the electrically conductive region forming sub bit lines having an electrically conductive region other than the first electrically conductive region being from the electrically conductive regions ((6) and (4) in FIG. 7a) neighboring to the second electrically conductive region ((5) in FIG. 7a) supplied with a positive voltage and the electrically conductive regions ((1) in FIG. 7a) neighboring to a third electrically conductive region (−(8) in FIG. 7a) forming a set of the sub bit lines by being paired to the second electrically conductive region ((5) in FIG. 7a), and a voltage between the positive voltage applied to the second electrically conductive region ((5) in FIG. 7a) and the ground potential is applied to at least one ((2), and (7) in FIG. 7a) of the first electrically conductive region ((4) in FIG. 7a), a fourth electrically conductive region (+(1) in FIG. 7a) forming a set of sub bit lines by being paired with the first electrically conductive region and the electrically conductive region to which is applied the positive voltage (−(8), (1), (5) and 6 of FIG. 7a). By this control, the programming to the neighboring cell is inhibited, while the write current may be prevented form decreasing. It is noted that similar operations and effects shown in FIG. 7b may be derived even if the electrically conductive region corresponding to the fourth electrically conductive region is in floating state(shown as F in FIG. 7b).

Figure 8A:
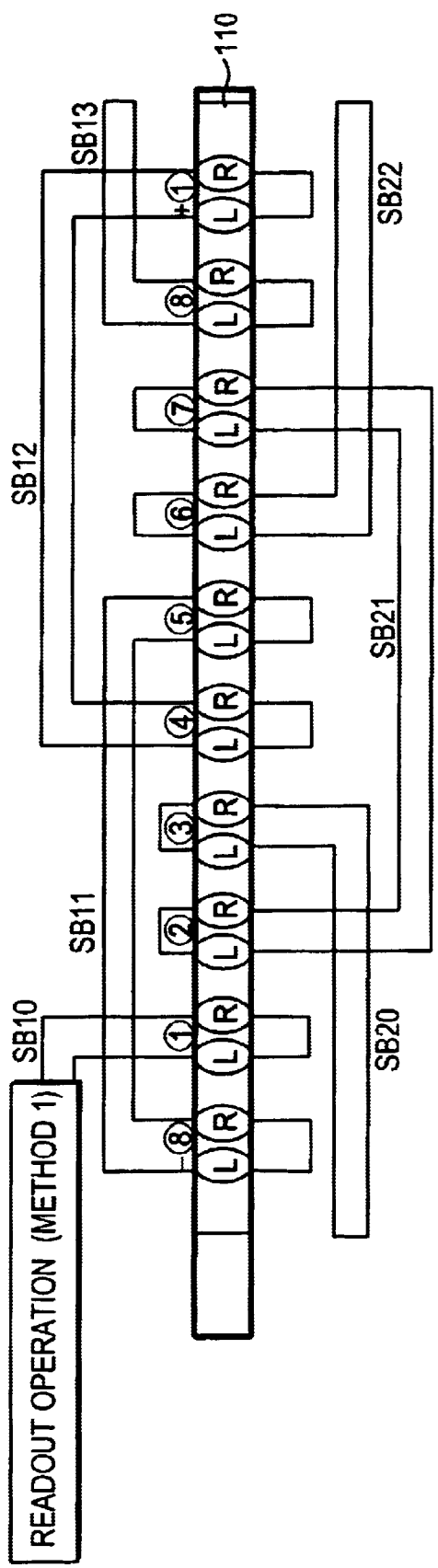
FIGS. 8a and 8b illustrate read operation in an embodiment of the present invention.

In a preferred method of the present invention, in reading operation in the semiconductor storage device, the ground potential is applied to the first one ((5) in FIG. 8*a*) of the two neighboring electrically conductive regions corresponding to the selected memory cell, while a preset positive voltage ((4) in FIG. 8*a*) is applied to the second electrically conductive region, and a preset positive voltage Vg is applied to the gate electrode of the memory cell. In reading out the memory cell, the positive voltage of the same level as that of the second electrically conductive region is applied to the third electrically conductive region ((3) in FIG. 8*a*) neighboring to the second electrically conductive region supplied with the positive voltage, with the third electrically conductive region lying on the opposite side relative to the first electrically conductive region. By this control, it is possible to prevent current leakage in the opposite direction in readout to suppress delay of the sense operation.

Figure 9A:
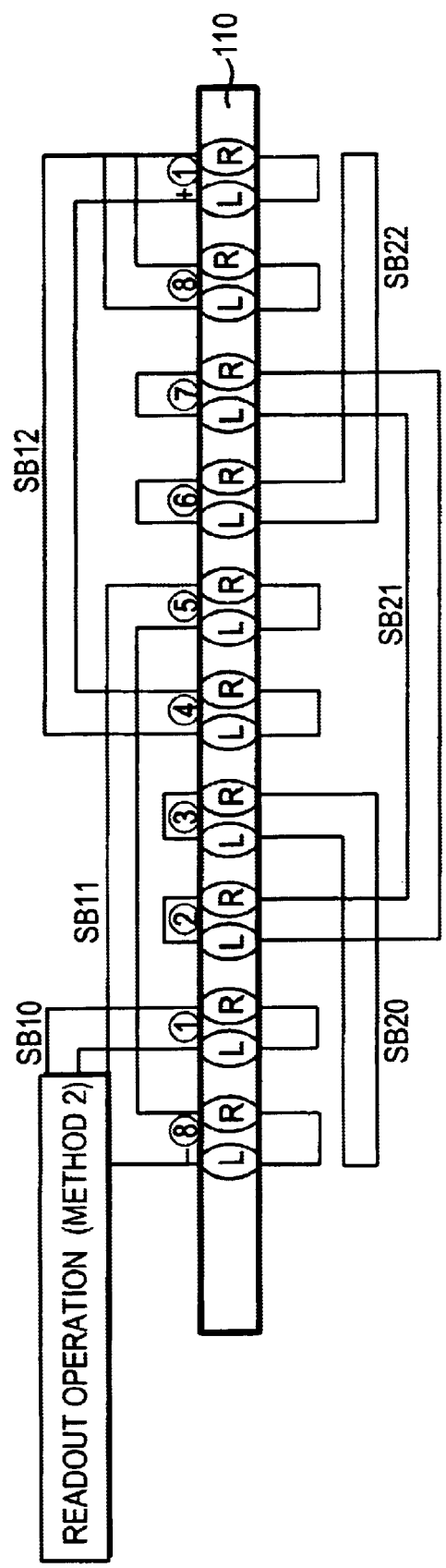
FIGS. 9a and 9b illustrate read operation in an embodiment of the present invention.

In a preferred embodiment of the method of the present invention, in read operation in the semiconductor storage device, a ground potential is applied to a first one ((5) in FIG. 9*a*) of two neighboring electrically conductive regions associated with a selected memory cell, a preset positive voltage is applied to a second electrically conductive region ((4) in FIG. 9*a*), and a preset positive voltage Vg is applied to a gate electrode associated with the selected memory cell. When reading out from the memory cell, a positive voltage of the same level as that applied to the second electrically conductive region is applied to an electrically conductive region ((3) and (5) in FIG. 9*a*) neighboring to the second electrically conductive region ((4) in FIG. 9*a*) supplied with the positive voltage, and to an electrically conductive region ((3) and (8) in FIG. 9*a*) forming sub bit lines having an electrically conductive region other than the first electrically conductive region ((5) in FIG. 9*a*), the electrically conductive region forming sub bit lines having an electrically conductive region other than the first electrically conductive region being from the electrically conductive regions ((8) in FIG. 9*a*) neighboring to a third electrically conductive region (+(1) in FIG. 9*a*) by being paired to the second electrically conductive region (4 in FIG. 9*a*). In addition, a ground potential to at least one of the first electrically conductive region ((5) in FIG. 9*a*), an electrically conductive region arranged between a fourth electrically conductive region (−(8) in FIG. 9*a*) forming a set of sub bit lines by being paired with the first electrically conductive region and the electrically conductive region ((3), (4), (8) and +(1) in FIG. 9*a*) to which is applied the positive voltage. By this control, it is possible to prevent current leakage and interference current in the opposite direction during readout.

Figure 22:
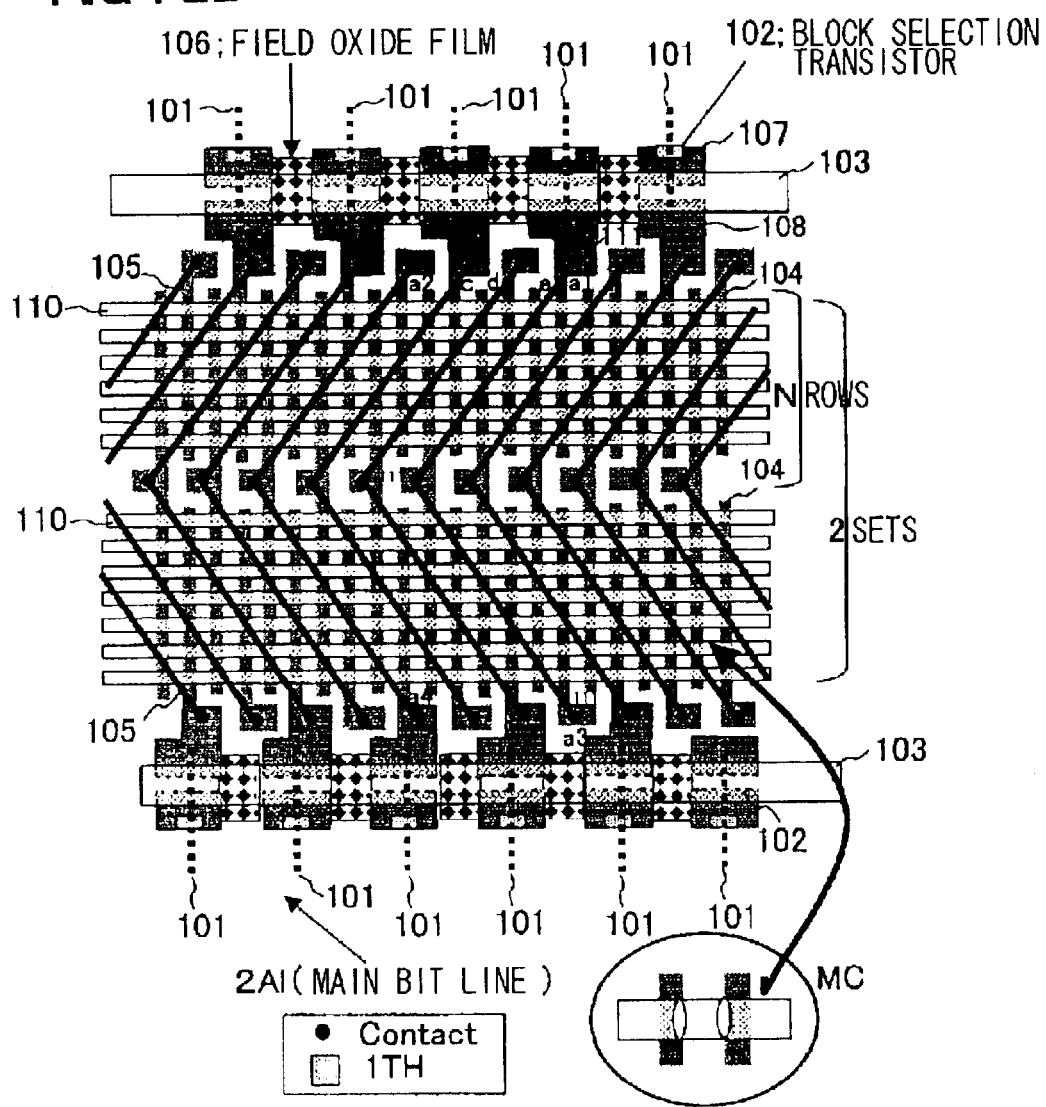
FIG. 22 is a diagram showing a layout according to an eighth embodiment of the present invention.
Figure 24:
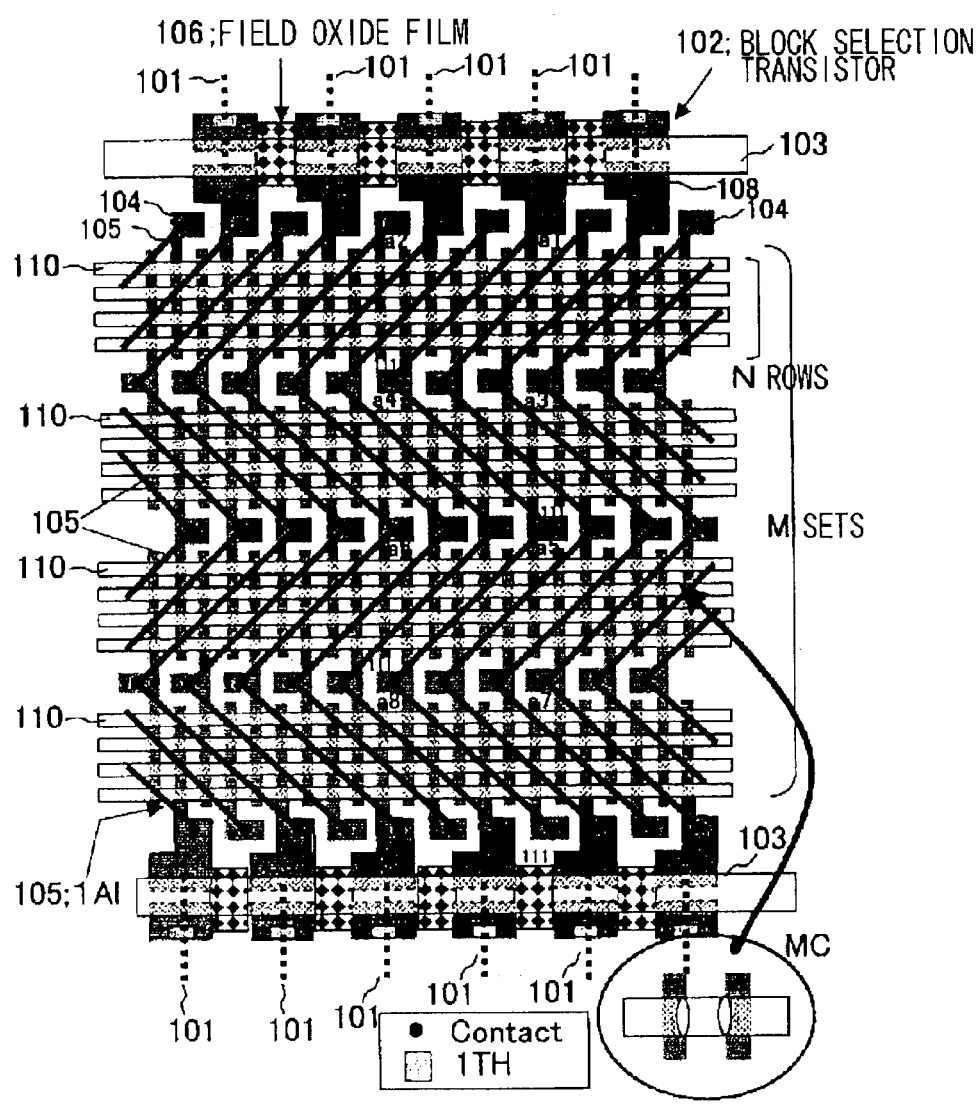
FIG. 24 is a diagram showing a layout according to a ninth embodiment of the present invention.

In a modification of the present invention, shown in FIGS. 22 and 24, there are provided a plurality of electrically conductive regions (104 in FIGS. 22 and 24) extending parallel to one another on a substrate surface forming a memory cell region, while two of the electrically conductive regions are connected as a pair to form a set of sub bit lines. The one set of the sub bit lines is connected to a main bit line (101 in FIGS. 22 and 24) via a selection transistor (102 in FIGS. 22 and 24). A plurality of the selection transistors (102) are arranged facing to one another on both longitudinal end sides of the memory cell array. The memory cell array is formed by a plurality of (M) sets, each set being composed of a plurality of (N) word lines (110). The paired electrically conductive regions each forming the set of sub bit lines being M sets of electrically conductive regions corresponding to the M sets forming the memory cell array. For each of the M sets of paired electrically conductive regions ((a1, a2) and (a3, a4) in FIG. 22, (a1, a2), (a3, a4), (a5, a6) and (a7, a8) in FIG. 24,), the end on one longitudinal end side of one of the paired electrically conductive regions and the end on the other longitudinal end side of the other of the paired electrically conductive regions are interconnected via a wiring (105) on an upper layer on the substrate. The paired electrically conductive regions of each of the M sets are connected common to one of the selection transistors (102) via the wiring (105) on an upper layer on the substrate.

In an embodiment of the present invention, the end of one (a1 in FIG. 22) of the paired electrically conductive regions of one set is on the same line as the one of the paired electrically conductive regions and is isolated from the end of one (a3 in FIG. 22) of the paired electrically conductive regions of the other set neighboring to one the set. The end of the other of the paired electrically conductive regions of the set is on the same line as the other (a2 in FIG. 22) of the paired electrically conductive regions and is connected to the end of the other (a4 in FIG. 22) of the paired electrically conductive regions of the other set neighboring to the one set via electrically conductive regions forming a junction. The wiring is connected via a contact (111) to a junction of the ends of the other of the paired electrically conductive regions of one set and the other set neighboring thereto, and is connected via a contact (111) to the ends longitudinally opposite to the isolated ends of the paired electrically conductive regions (a1, a3) of one the set and the other set neighboring thereto.

In an embodiment of the present invention, the ends of the first lines of the electrically conductive regions of the first and second sets of the paired electrically conductive regions (a1 and a3 in FIG. 24) of the M sets of the paired electrically conductive regions, connected to one selection transistor, are isolated and when the ends of the second lines thereof (a2 and a4 in FIG. 24) are connected together, the ends of the second lines of the electrically conductive regions (a3 and a5 in FIG. 24) of the second and third sets of the paired electrically conductive regions are connected together, the ends of the second lines of the electrically conductive regions (a4 and a6 in FIG. 24) of the second and third sets of the paired electrically conductive regions are isolated from each other, the ends of the second lines of the electrically conductive regions (a5 and a7 in FIG. 24) of the second and third sets of the paired electrically conductive regions are isolated from each other, the ends of the second lines of the electrically conductive regions (a6 and a8 in FIG. 24) of the third and fourth sets of the paired electrically conductive regions are connected together and the lines the ends of which are isolated and the lines the ends of which are interconnected are alternately switched from one set of the M sets to another.

Figure 26:
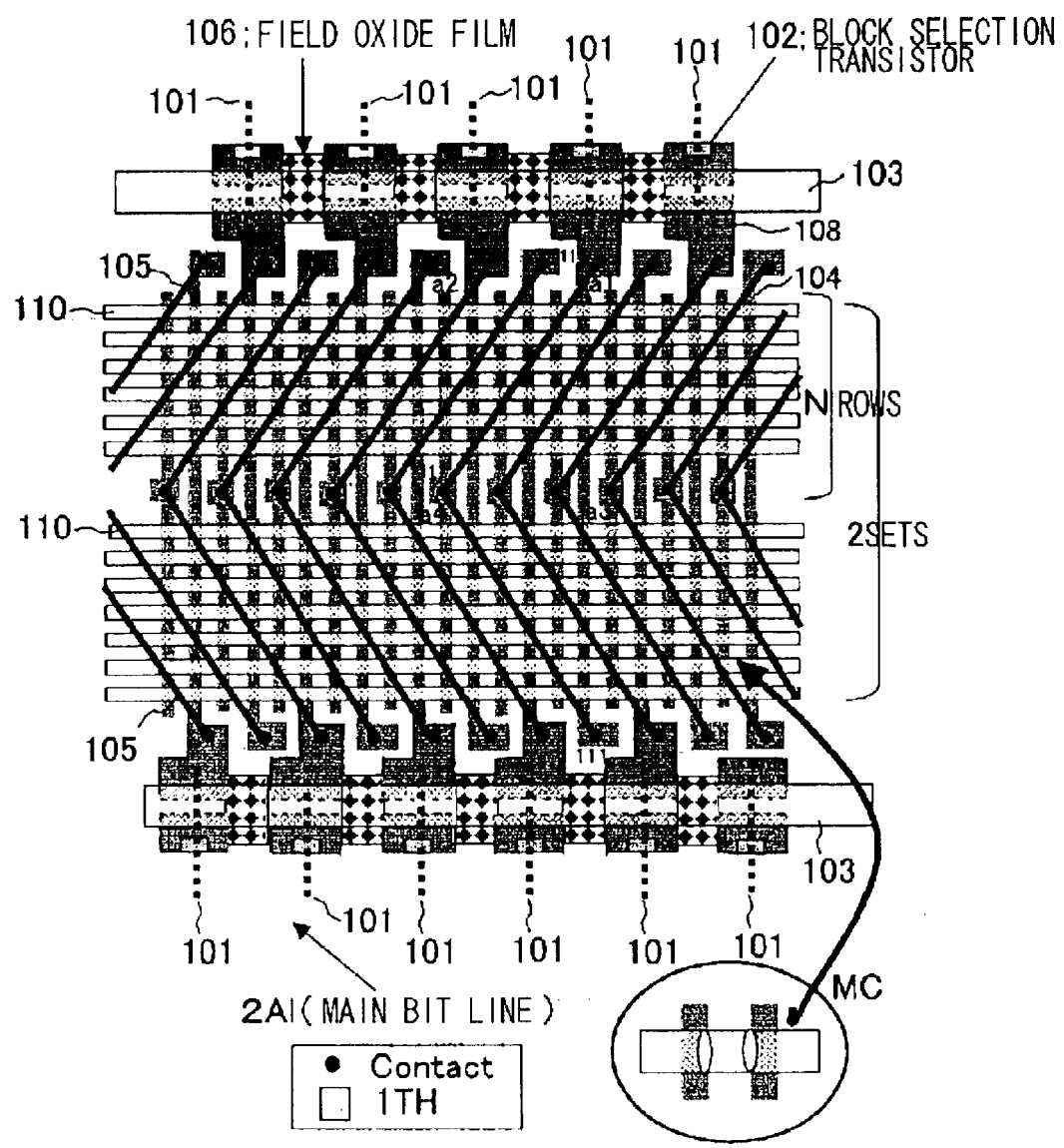
FIG. 26 is a diagram showing a layout according to a tenth embodiment of the present invention.

Referring to FIG. 26 showing an embodiment of the present invention, of the M sets of the paired electrically conductive regions, connected common to the one selection transistor, the end of one of the paired electrically conductive regions of one the set is on the same line as the one of the paired electrically conductive regions and is isolated from the end of one of the paired electrically conductive regions of the other set neighboring to the set. The end of the other of the paired electrically conductive regions of one the set is on the same line as the other of the paired electrically conductive regions and is connected to the end of the other of the paired electrically conductive regions of the other set neighboring to the one set via electrically conductive regions forming a junction. The wiring is connected via a contact to a junction of the ends of the other of the paired electrically conductive regions (a2 and a4 in FIG. 26) of one set and the other set neighboring thereto, and is connected via a contact (111) to the ends longitudinally opposite to the isolated ends of the paired electrically conductive regions (a1 and a3 in FIG. 26) of one set and the other set neighboring thereto.

Figure 28:
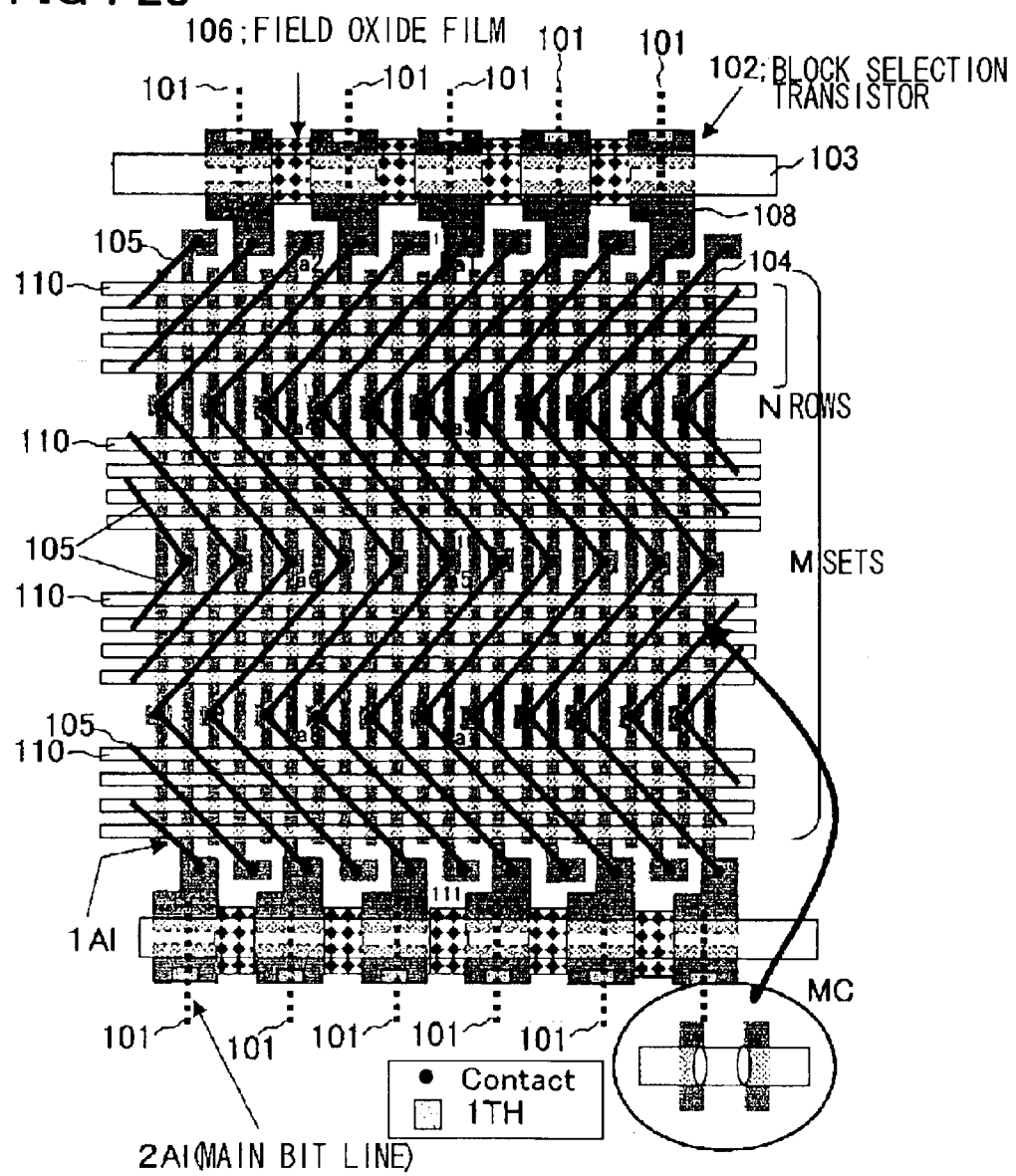
FIG. 28 is a diagram showing a layout according to an eleventh embodiment of the present invention.

In an embodiment of the present invention, of the M sets of the paired electrically conductive regions, connected common to one selection transistor, where M is for example 4, the wiring (105 in FIG. 28) is connected to the longitudinally opposite side end o a junction (formed by an electrically conductive region) of the first line of the electrically conductive regions of the first set (105 in FIG. 28) via contact 111, while the junction (formed by an electrically conductive region) of the first line of the electrically conductive region (a3 in FIG. 28) of the second set to the electrically conductive region a1 of the first set is connected to the longitudinally opposite end via contact 111, while being connected via contact 111 to a junction (formed by an electrically conductive region) of the ends of the second line of the electrically conductive regions of the paired electrically conductive regions of the third and fourth sets (a6 and a8 in FIG. 28). The junction (formed by an electrically conductive region) of the first line of the electrically conductive region (a3 in FIG. 28) of the second set to the electrically conductive region a1 of the first set is connected via contact 111 to the junction (formed by an electrically conductive region) of the ends of the second line of the electrically conductive regions (a6 and a8 in FIG. 28). The above junction (formed by an electrically conductive region) of the first line of the electrically conductive region of the fourth set (a7 in FIG. 28) to the electrically conductive region (a5) of the third set is connected to the longitudinally opposite junction via a contact (111).

Referring to the drawings, preferred embodiments of the present invention are now explained for further detailed explanation of the above-descried embodiments of the invention. FIG. 1 schematically shows an illustrative layout structure of a semiconductor memory device according to the present invention, and specifically illustrates a portion (block) of a memory cell array of a programmable and non-volatile semiconductor memory device. In an embodiment of the present invention, shown in FIG. 1, a memory cell array, comprised of an array of a plural number of memory cells MC, is of a hierarchical bit line structure comprised of a number of main and sub bit lines. The sub bit lines are comprised of a plural number of electrically conductive regions, also termed N+ buried lines, formed by N+ diffusion layers, and extended parallel to one another on a silicon substrate surface, as an example. A plural number of main bit lines 101, for example, aluminum lines, are formed on patterning on a wiring layer provided on the substrate, and are connected to sub bit lines via selection transistors 102 (also termed block selector transistors or block selection transistors) controlled on or off through a selection control line connected to the gates of the transistors.

More specifically, a first group of the electrically conductive regions 104 (for example, a, b, e, . . . ) are extended parallel to one another, in a memory cell array area on the substrate surface, for extending from one side to its opposite side of the memory cell array, while a second group of the electrically conductive regions 104 (for example, c, d, . . . ) are extended parallel to one another for extending from the opposite side to the one side of the memory cell array.

A plural number of (herein N) gate electrodes 110 are formed on an insulating film, for extending parallel to one another in a direction perpendicular to the extending direction of the electrically conductive regions 104.

Two of the electrically conductive regions 104, belonging to the same set, form one set of sub bit lines. One of the two electrically conductive regions, forming sub bit lines, is connected to a diffusion layer of the selection transistor 102 that has a gate connected the selection line. To the other diffusion layer 107 of the selection transistor 102 is connected the main bit line 101 of the wiring layer forming an upper substrate layer.

Each of the paired electrically conductive regions 104, forming together one set of the sub bit lines, and which are spaced apart from each other, is connected, by a contact 111, on one end located on the side connected to the selection transistors 102, to a wiring 105 provided on a first aluminum wiring layer (1A1) forming an upper substrate layer.

Between the paired electrically conductive regions a and a, among a first group, which forms one set of the sub bit lines, there are provided each electrically conductive region b and e of the paired electrically conductive regions forming two sub bit lines, each connected via a selection transistor to each of two main bit lines provided on both sides of the main bit line, to which the one set of the sub bit lines are connected via a selection transistor, and each electrically conductive region c and d of the paired electrically conductive regions, forming two sub bit lines, totaling at four electrically conductive regions. The two sub bit lines are respectively connected to two main bit lines neighboring to each other via selection transistors arranged on the opposite side of the selection transistor connected to the one set of the sub bit lines. These electrically conductive regions are arranged with the identical pitch in the order of a, b, c, d and e. This pattern of the sub bit lines is repeated in the region between selection transistors arranged oppositely.

Above the substrate, on which the electrically conductive regions 104 are formed, a plural number of, herein N, gate electrodes 110 are formed parallel to one another, with the interposition of an insulating film (an ONO film as later explained, or a gate insulating film) to intersect the electrically conductive regions 104. The gate electrode 110 is of the salicide structure in which metal silicide is formed on both polycrystalline silicon and source-drain diffusion layers by a self-aligned process. The gate electrodes 110 are to serve as word lines. A preset voltage is selectively applied to a row, specified by a row decoder, not shown. On both sides of the N gate electrodes 110 (on both the upper and lower sides of the memory cell array in FIG. 1), selective gate electrodes 103 of e.g., made up of polycrystalline silicon or metal salicide similar to that described above are arranged lying across the electrically conductive regions 107 and 108. That is, the selecting transistor 102 is formed which has the selective gate electrode 103, electrically conductive region 107 and the electrically conductive region 108, as a gate, as a source and as a drain, respectively.

In the present embodiment, isolation between the selecting transistors 102 is preferably achieved by a field oxide film 106. In comparison with isolation by an impurity doped region, formed by e.g., ion implantation, the selection transistor 102 can be made high-voltage proof more strongly to prevent the lowering of the voltage supplied to the electrically conductive regions of the memory cell as a write target at the time of writing.

In transistors, each composing a memory cell MC, the gate electrodes 110, arranged in common from row to row, form word lines WL, and are selectively activated by a row decoder, not shown. In the selection transistors 102, the respective selective gate electrodes 103 are used in common and form selective control lines SL.

The main bit lines 101 are formed on a second aluminum wiring layer 2A1, formed via an insulating layer on the first aluminum wiring layer 1A1, interconnecting the electrically conductive regions 104, and are selectively activated responsive to column selection signals produced by a column decoder, not shown. That is, two main bit lines, for example, are specified, in association with address data, to apply the power supply voltage and the grounding voltage. The selection transistor 102, which is connected to the specified main bit line 101, is also turned on to connect the electrically conductive regions 104, forming the sub bit lines, to the main bit line 101 to selectively activate the two neighboring columns of the electrically conductive regions 104.

The main bit lines 101, provided on the second aluminum wiring layer 2A1 on an upper layer on the substrate, are connected to the first aluminum wiring layer 1A1 through a through-hole (TH) 109, while being connected through a contact, not shown, to the diffusion layer 107 of the selection transistor 102. The diffusion layer 108 of the selection transistors 102 is extended on the substrate surface to form one of the electrically conductive regions 104 forming the sub bit line pair. The electrically conductive regions 104 are formed on the substrate surface simultaneously as the diffusion layers 107 and 108.

In the present embodiment, the memory cell MC includes an ONO (oxide-nitride-oxide) film, comprised of a first oxide film, a nitride film and a second oxide film, on a channel region in a gap between the neighboring electrically conductive regions 104. The ONO film acts an electron trapping film to form storage nodes. On the second oxide film of the ONO film is formed a gate electrode 110, extending in a direction perpendicular to the longitudinal direction of the electrically conductive regions, in common for the plural memory cells of one row, to form a word line.

Figure 2:
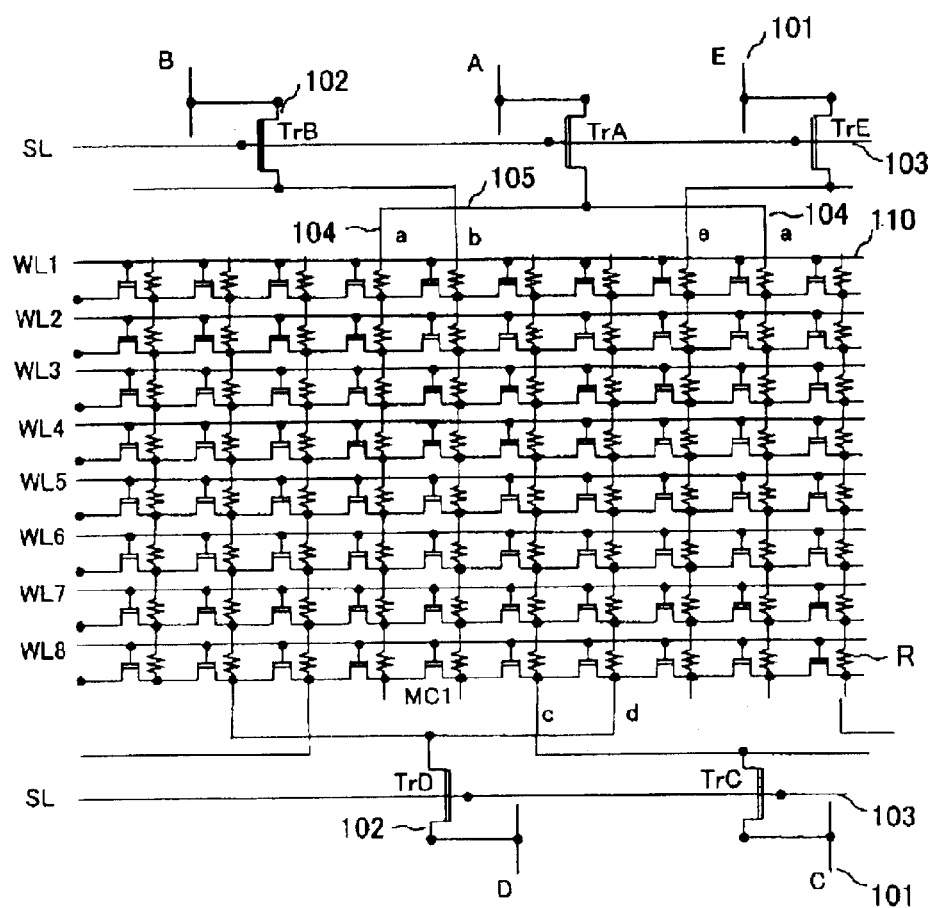
FIG. 2 is a diagram showing a circuit configuration of an embodiment of the present invention.

FIG. 2 shows a circuit configuration of the memory cell array of an embodiment of the present invention, an illustrative layout for which is shown in FIG. 1. In FIG. 2, a reference numeral 101 is a main bit line, 102 is a selection transistor, 103 is a selection controlling line SL, 104 is an sub bit line (electrically conductive region), 105 is a wiring for interconnecting the electrically conductive regions of the sub bit lines and 110 is a word line WL. In the N+ diffusion layer, forming the sub bit line, the region between the memory cells is depicted with a unit resistance value R. When the selection controlling line SL is at a high level, the selection transistor 102 is turned on to connect the main bit line to the associated sub bit lines. In a region between the electrically conductive regions a and a, which form a set of the sub bit lines, connected to the main bit line A via selection transistor TrA forming one of the selection transistors of the first set on one side of a memory cell array composed of plural memory cells, the right electrically conductive region b and the left electrically conductive region e of the paired electrically conductive regions forming two sets of the sub bit lines connected respectively to the two main bit lines B and E connected in turn to the two neighboring selection transistors TrB and TrE on both sides of the selection transistor TrA are arranged inwardly of the paired electrically conductive regions a and a, while the left electrically conductive region c and the right electrically conductive region d of the paired electrically conductive regions, forming two sets of the sub bit lines connected to the two main bit lines C and D through the selection transistors TrC and TrD, in turn forming the second group of the selection transistors positioned on the opposite side of the memory cell array, are arranged inwardly of the paired electrically conductive regions b and e.

Between the paired electrically conductive regions b and e connected respectively to the other selection transistors TrB and TrE, arranged on the one side of the memory cell array, there are arranged four electrically conductive regions connected to the other selection transistor (each one of the electrically conductive regions connected in a pair to the selection transistor on one side and each one of the electrically conductive regions connected in a pair to the selection transistor on the opposite side), such that the layout structure in which four sets of the sub bit lines are arranged alternately is repeated along the word line direction.

For example, if the memory cell MC1, the gate electrode of which is connected to the word line WL8 and which is connected to the electrically conductive regions a and b, is selected, the selection gate line SL is set to a high level, the associated block is selected, the word line WL8 is set to a high level and the main bit lines A and B are supplied with a power supply voltage or the ground voltage. As illustrative of the memory cell MC, used in an embodiment of the present invention, the exemplary structure and operation of the MONOS (Metal-ONO-silicon) type memory cell is now explained.

Figure 3:
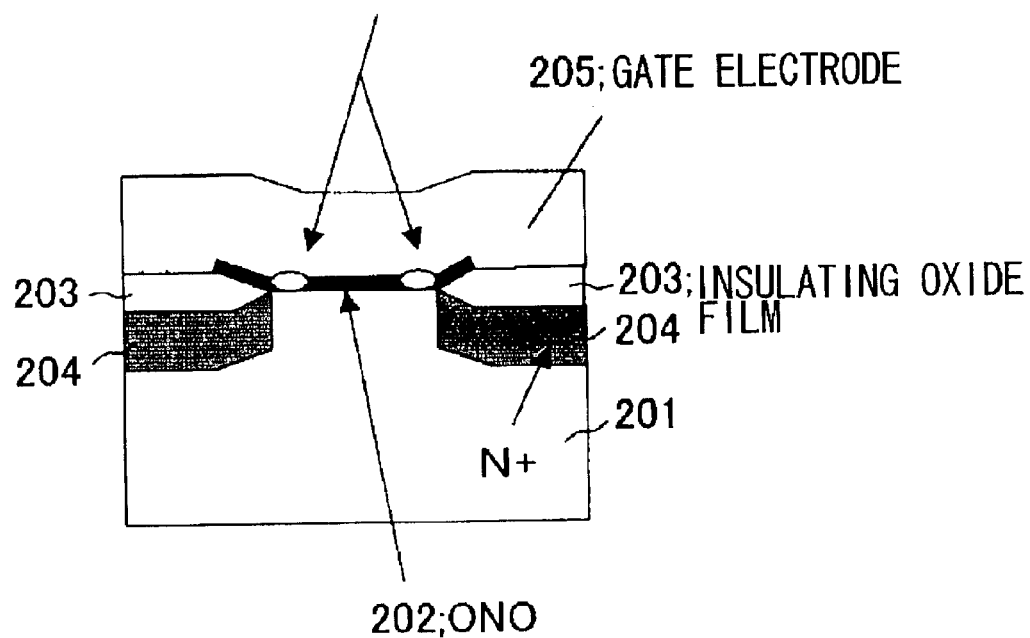
FIG. 3 schematically shows the structure of a memory cell having an ONO film and a 2-bit storage node.

FIG. 3 schematically shows the structure of a MONOS type memory cell. A silicon substrate 201 is provided with an N+ diffusion layer 204, operating as a source and a drain. An insulating oxide film 203 is formed thereon. An ONO film 202 is formed astride a surface exposing the substrate 201 and the lateral edge of an insulating oxide film 203, and a gate electrode 205 is formed for extending in a direction perpendicular to the longitudinal direction of the N+ diffusion layer 204. The ends of the N+ diffusion layers 204 of the ONO film serve as storage nodes for trapping the electrons, such that the 2-bit information is stored in each cell. The ONO film is comprised of an oxide film (such as a silicon oxide film), as a first layer, a nitride layer (such as a silicon nitride film), as a second layer, and an oxide film (such as a silicon oxide film) as a third layer. For details of the memory cell, provided with the ONO film, reference is had to for example the disclosure of the JP patent Kohyo JP-P2001-512290A.

Figure 4A:
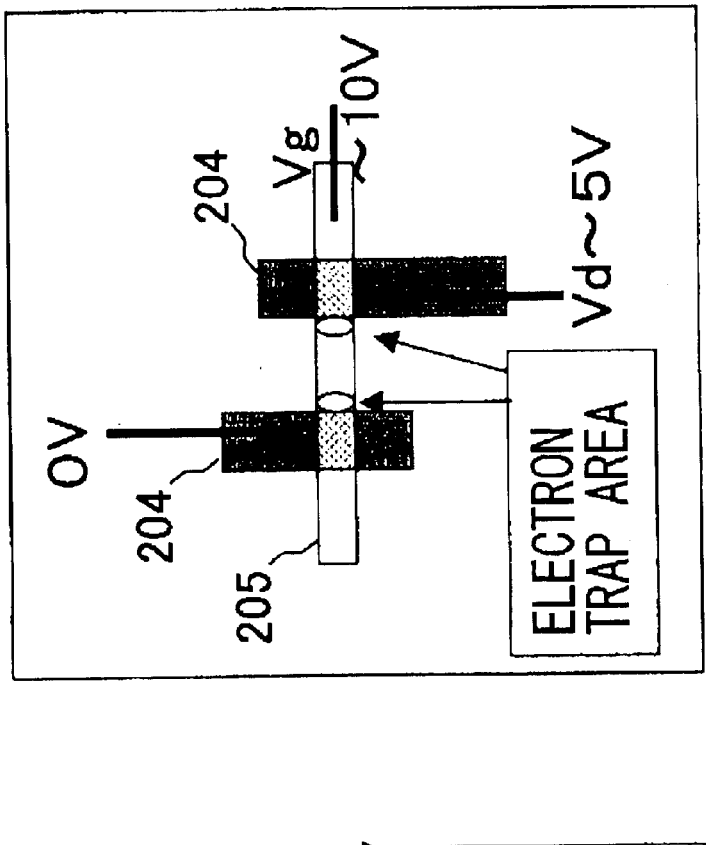
FIGS. 4a and 4b illustrate a program for the memory cell of FIG. 3.
Figure 4B:
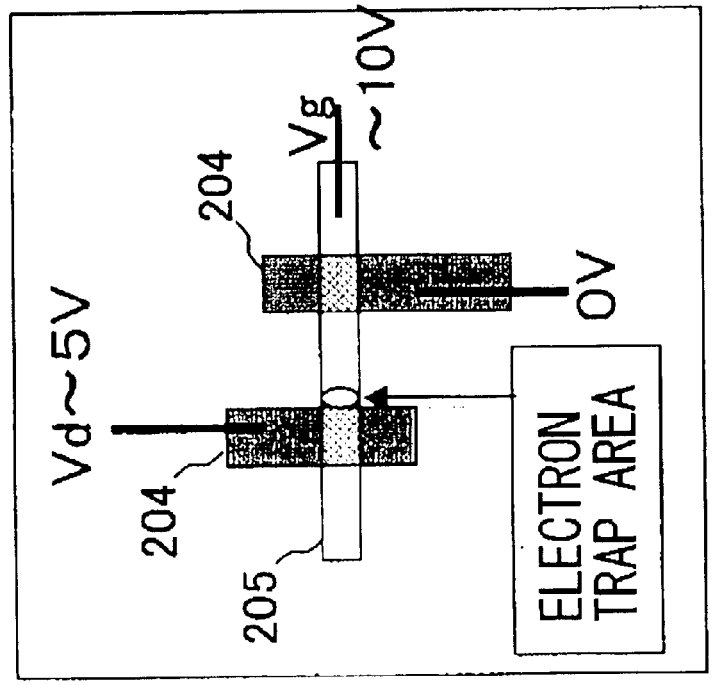

FIGS. 4a and 4b schematically show the memory cell programming (write operation). A write voltage Vd is applied to the N+ diffusion layer 204 on one of the two storage nodes, specifically the write side storage node, 0 V is applied to the N+ diffusion layer 204 on the other storage node and Vg (10V) is applied to the gate electrodes 205. This causes channel hot electrons to flow into the nitride film of the ONO film. These electrons are then locally captured in an electron trap area. If programming is to be made in the left bit storage node in the drawing, Vd of the left side electrically conductive region is set to 5V (Vd=5V), Vg of the gate electrodes 205 is set to 10 V (Vg=10V) and the voltage of the right side N+ diffusion layer 204 is set to 0V, as shown in FIG. 4a. If programming is to be made in the right side storage node, after writing the lest side bit, the voltage Vd of the right side N+ diffusion layer 204 is set to 5V (Vd=5V), the voltage Vg of the gate electrodes 205 is set to 10 V (Vg=10V) and the voltage of the left N+ diffusion layer 204 is set to 0V, as shown in FIG. 4b. Meanwhile, since the nitride film is electrically non-conductive, the captured electrical charges are localized in the vicinity of the electrically conductive region where the high electrical voltage is applied, thus forming a localized electron trapping region. The threshold voltage is raised to for example 4V in only the lower portion of the electron trap region of the entire channel length, while the threshold voltage is substantially unchanged in the remaining portion of the entire channel length extending to below the gate.

Figure 5A:
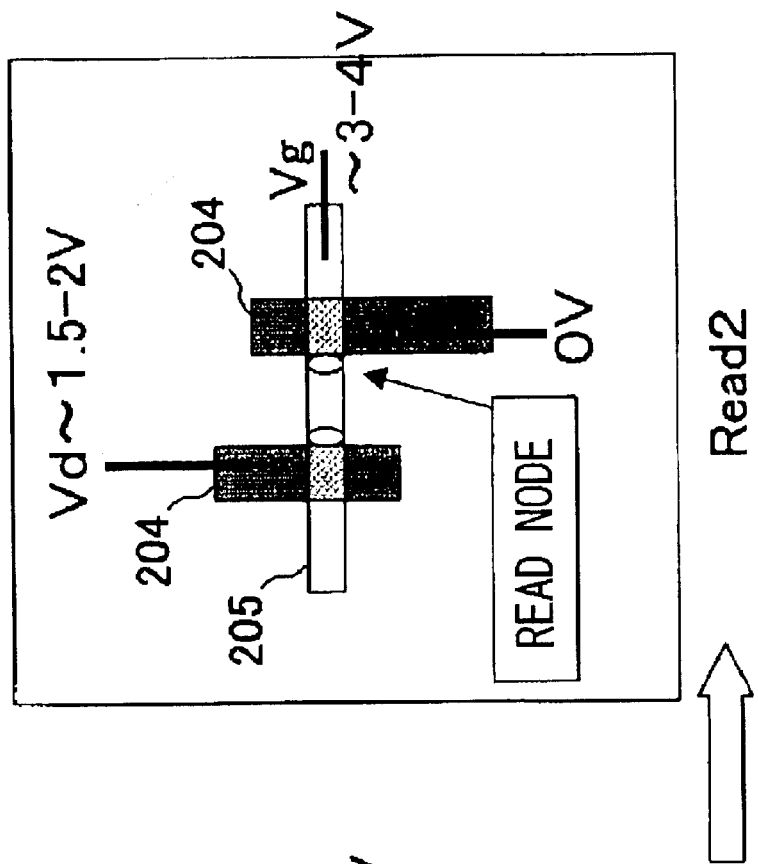
FIGS. 5a and 5b illustrate read operation from the memory cell of FIG. 3.
Figure 5B:
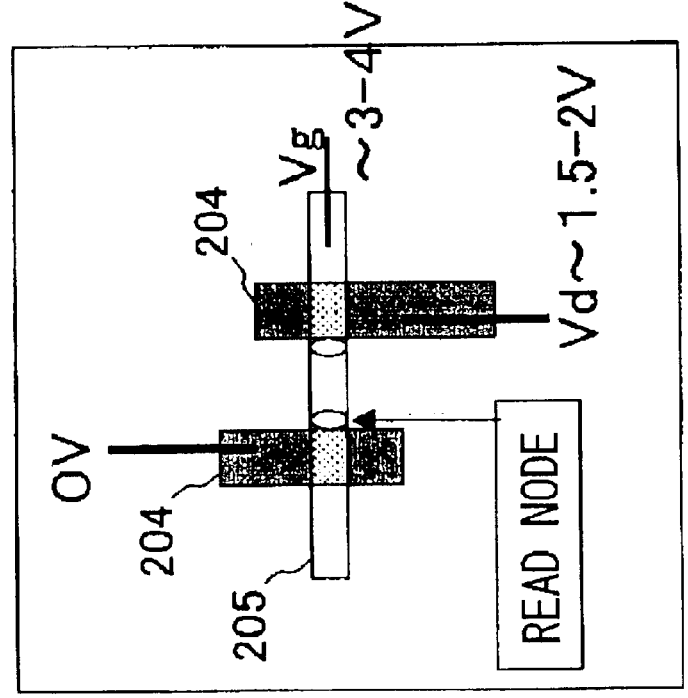

FIGS. 5a and 5b schematically illustrate the memory cell reading (readout). For reading, 0V is applied to an electrically conductive region of one of the two storage nodes, that is, a read side storage node. The voltage of 1.5 to 2V is applied to the electrically conductive region of the other storage node, while the voltage of 3 to 4 V is applied to the gate electrode. If the left side bit storage node is to be read, 0V is applied to the left side N+ diffusion layer 204, the voltage Vd of 1.5 to 2V is applied to the right N+ diffusion layer 204 and the voltage Vg of 3 to 4V is applied to the gate electrode, as shown in FIG. 5a. If the right side bit storage node is to be read, 0V is applied to the right side N+ diffusion layer 204, the voltage Vd of 1.5 to 2V is applied to the left N+ diffusion layer 204 and the voltage Vg of 3 to 4V is applied to the gate electrode, as shown in FIG. 5b.

If, during readout, the gate voltage Vd is applied to the electrically conductive region, the electrons are drawn from the electrically conductive region and begins to flow towards the drain. In case of the readout storage node being in a pre-programmed state, no channel current or only a small quantity of current is allowed to flow. That is, with the voltage of 3 to 4V applied to the gate electrode and Vd=2V, the electrically conductive region of the readout node is grounded, an inversion mode prevails in the channel portion directly below the portion which has trapped no electrons, while an electrically nonconductive state (non-inversion mode) is generated in the channel portion directly below the electron trapping region. That is, if no electrons are trapped in the readout side storage node (read node), the channel current begins to flow towards the electrically conductive region of 0V from the electrically conductive region where the voltage Vd=1.5 to 2V is applied. If electrons are trapped in one storage node, no channel current flows from the electrically conductive region, where the voltage Vd=1.5 to 2V is applied, towards the electrically conductive region of 0V. It should be noted that, contrary to a routine MOS transistor, the source or the drain is not fixed in the two N+ diffusion layers 204 of the memory cell.

FIG. 6 illustrates the program operation of an embodiment of the present invention. Referring to FIG. 6a, there are arranged, between the left electrically conductive region −(8) of the sub bit line SB11 connected to the main bit line on the upper side of the memory cell array (in the drawing, the numeral is shown encircled) and the right electrically conductive region (5) (these being connected via wiring 105 in FIG. 1), a right side (1) of the electrically conductive region of the left neighboring sub bit line SB10 and a left side (4) of the electrically conductive region of the right neighboring sub bit line SB12. In addition, left and right electrically conductive regions (2) and (3) of the opposite side sub bit lines SB21 and SB20 are arranged so that equally spaced electrically conductive regions are arranged in the sequence of −(8), (1), (2), (3), (4) and (5) when looking from the left side of the drawing. In similar manner, there are arranged, between the left and right electrically conductive region (4) and +(1) of the sub bit line SB12, a right side (5) of the electrically conductive region of the left neighboring sub bit line SB11 and a left side (8) of the electrically conductive region of the right neighboring sub bit line SB13. In addition, right and left electrically conductive regions (7) and (6) of the opposite side sub bit lines SB21 and SB22 are arranged so that equally spaced electrically conductive regions are arranged in the sequence of (4), (5), (6), (7), (8) and +(1) when looking from the left side of the drawing. It should be noted that the left and right electrically conductive regions 104 of e.g., SB11 are connected via contacts to the wiring of the first aluminum wiring layer 1A1 forming an upper layer on the substrate.

In FIG. 6, the substrate surface portion below the ONO film below the gate electrode 110, between the electrically conductive region −(8) of the sub bit line SB11 and the electrically conductive region (1) of the sub bit line SB10, between the electrically conductive region (1) of the sub bit line SB10 and the electrically conductive region (2) of the sub bit line SB21, between the electrically conductive region (2) of the sub bit line SB21 and the electrically conductive region (3) of the sub bit line SB20, between the electrically conductive region (3) of the sub bit line SB20 and the electrically conductive region (4) of the sub bit line SB12, between the electrically conductive region (4) of the sub bit line SB12 and the electrically conductive region (5) of the sub bit line SB11, between the electrically conductive region (5) of the sub bit line SB11 and the electrically conductive region (6) of the sub bit line SB22, between the electrically conductive region (6) of the sub bit line SB22 and the electrically conductive region (7) of the sub bit line SB21, between the electrically conductive region (7) of the sub bit line SB21 and the electrically conductive region (8) of the sub bit line SB13, and between the electrically conductive region (8) of the sub bit line SB13 and the electrically conductive region +(1) of the sub bit line SB12, serve as channels. The left and right storage nodes associated with the respective electrically conductive regions of the sub bit lines are denoted as L and R, respectively.

FIG. 6b shows the operation of the programming for the left and right storage nodes, associated with the respective electrically conductive regions of FIG. 6a, in a list. In this figure, the first column depicts the storage node for writing, (−(8)R being a R node of the electrically conductive region −(8)), the second column denotes paired electrically conductive regions and the columns from −(8) to +(1) denote the voltages applied to the respective electrically conductive regions, where H is 5V, L is 0V, M is an intermediate voltage of 2.5V and F represents floating) and arrows between the electrically conductive regions denote current directions.

For programming data in a storage node of the electrically conductive region (5)L, the voltage for the electrically conductive region −(8) is H (5V), the voltage for the electrically conductive region (4) is L (0V) and the gate voltage Vg is 10V.

That is, the selection transistor 102 is turned on to select two main bit lines, connected to the sub bit lines SB11 and SB12, by column selection signals, not shown, to send the voltages H of 5V and L of 0V to the two main bit lines connected to the sub bit lines SB11 and SB12 from a driver circuit of a sense amplifier connected to the main bit line.

The voltages supplied to the respective electrically conductive regions are supplied from the main bit line, with the selection transistors 102 then being turned on.

In the present embodiment, a voltage between the high (H) voltage (5V) and the ground potential L (0V), for example, an intermediate voltage M (2.5V), is applied to the electrically conductive region 6 neighboring to the electrically conductive region 5, that is the left electrically conductive region of the sub bit line SB22. By a column selection signal, not shown, the main bit line connected to the sub bit line SB22 is selected, such that, in the read/write circuit, the intermediate voltage M (2.5V) is applied from a driver circuit for driving the main bit line, not shown, to the main bit line connecting to the sub bit line SB22.

By way of a Comparative Example, the case in which the intermediate voltage M (2.5V) is not applied to the electrically conductive region 6 is explained. In this case, 0V is applied to the electrically conductive region +(1), such that, due to the potential difference between this region and the electrically conductive region 5 to which the high (H) voltage (5V) is applied, programming may possibly occur in the R nodes of the electrically conductive region 5 through to 8. If the electrically conductive region 6 is at 0V (ground potential), programming occurs in the R node of the electrically conductive region 5.

Conversely, in the present embodiment, in which the intermediate voltage M is applied to the electrically conductive region neighboring to the electrically conductive region where the high voltage H (5V) is applied, it is possible to avoid programming in the other cells.

Meanwhile, the electrically conductive regions 7 and 8 are in a floating (F) state, in which case the driver for driving the main bit line connecting to the sub bit lines SB21 and SB23 through the selection transistor 102 is turned off (output is in a high impedance state).

The programming in the L node of the electrically conductive region 5 has been described in the foregoing. The programming in the other nodes occurs in similar manner. Of course, the relationship of correspondence between the electrically conductive region of the cell as a target for writing and the voltage applied to the electrically conductive regions of the other sub bit lines may be stored as table data in a read-only memory device so that a write circuit, not shown, in the semiconductor memory device, may drive the selected main bit line and the neighboring main bit line with a required voltage based on the selected memory cell and the content of the table data (table lookup method).

Figure 7B:
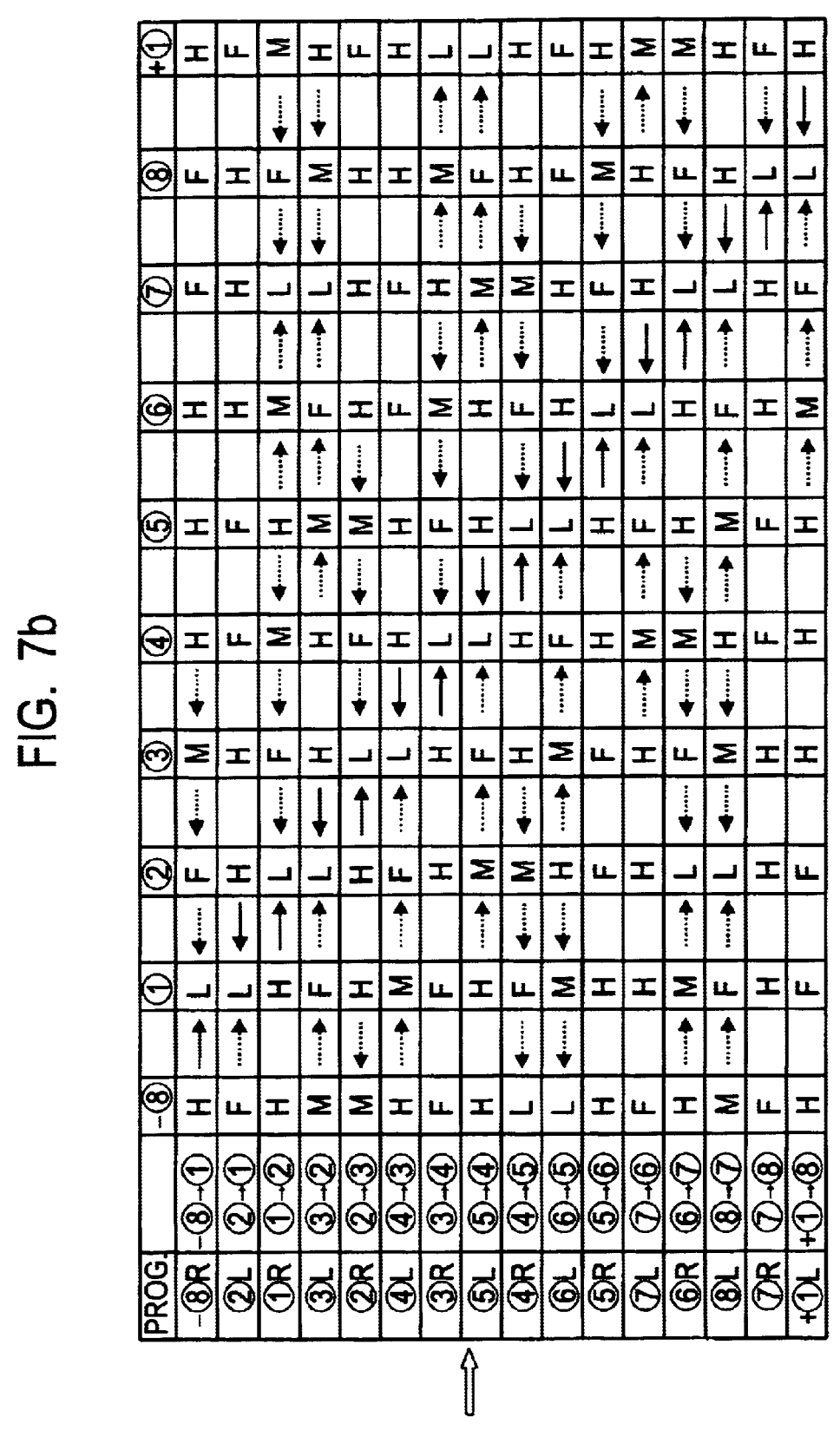

FIGS. 7a and 7b illustrate a modification of the above-described embodiment of the present invention. The present modification is the same in a structure as the above-described embodiment with the exception that the present modification is designed to prevent writing leakage current at the time of programming.

In programming data in e.g., the L storage node of the electrically conductive region 5, the voltage of the electrically conductive regions (5) and −(8) of the sub bit line SB11 is set to H (5V), that of the electrically conductive region 4 of the sub bit line SB12 is set to L (0V) and that Vg of the gate electrode 110 is set to 10V.

At this time, current leakage in an opposite direction to that from the electrically conductive region 5 to the electrically conductive region 4 occurs to produce increased write current and voltage drop.

In the present embodiment, a high (H) voltage (5V) is applied to the electrically conductive regions 6, 1 forming sub bit lines SB10 and SB22 having the electrically conductive regions other than the electrically conductive region 4 among the electrically conductive regions 6 and 4 neighboring to the electrically conductive region 5 to which is applied the high H voltage (5V) and the electrically conductive region 1 neighboring to the electrically conductive region −(8) paired to the electrically conductive region 5 to form a set of sub bit lines SB11, in order to prevent current leakage in the opposite direction. Moreover, a voltage between the high (H) voltage (5V) and the ground potential L (0V), for example, the intermediate voltage M (2.5V), is applied to at least one of the electrically conductive region (4), to which is applied the ground potential L (0V), the electrically conductive region +(1), paired to the electrically conductive region (4) to form a set of sub bit lines and the electrically conductive regions arranged between the electrically conductive regions −(8), (1), (5) and (6) to which is applied the high (H) voltage (5V), in order to prevent writing to the other cells. In the embodiment shown in FIG. 7b, the intermediate voltage M (2.5V) is applied to the electrically conductive region (2) between the electrically conductive region (1) to which is applied the high (H) voltage (5V) and the electrically conductive region (4) to which is applied the ground potential L (0V) and to the electrically conductive region (7) between the electrically conductive region (6) to which is applied the high (H) voltage (5V) and the electrically conductive region +(1) to which is applied the ground potential L (0V). The electrically conductive region (2) and the electrically conductive region (7), paired to each other, form a set of the sub bit lines SB21. On the right sides of the electrically conductive regions −(8) and (5), to which the high (H) voltage (5V) is applied, there are sequentially arranged the electrically conductive regions (1), and (6), to which is applied the high (H) voltage (5V), electrically conductive regions (2), and (7), to which is applied the intermediate voltage M (2.5V), electrically conductive regions (3), and (8) in the floating state and the electrically conductive regions (4), and +(1), to which is applied L (0V), in order to suppress the leakage current in the direction opposite to the write current as well as to suppress writing to other cells. This prevents the occurrence of the decreasing writing current and the increasing output current to the write circuit.

Figure 8B:
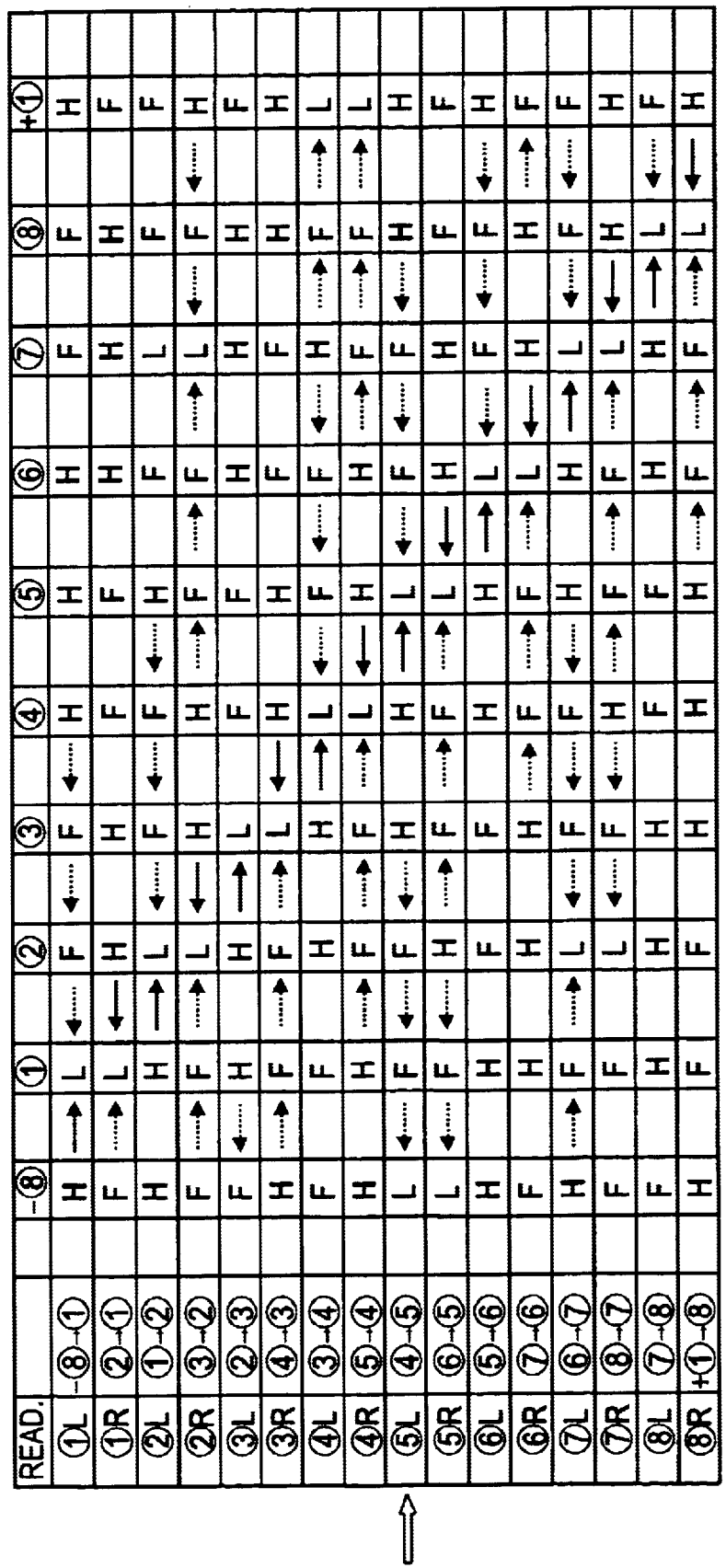

Referring to FIGS. 8a and 8b, readout of the storage node in an embodiment of the present invention is explained.

As shown in FIGS. 8a and 8b, in reading out data from the L node of the electrically conductive region (5), the selection transistor, connecting to the sub bit lines SB12 and SB11, is selected, the high (H) voltage (1.5V) is applied to the electrically conductive region (4), the electrically conductive region (5) is set to L (0V) and the voltage Vg of the gate electrode is set to 4V. If no electrons are trapped, the channel current flows from the electrically conductive region (4) to the electrically conductive region (5). In order to prevent current leakage from the electrically conductive region (4) in the opposite (reverse) direction, that is from (4) to (3), the electrically conductive region (3) is at an equivalent potential H (1.5V) to the electrically conductive region (4). By prohibiting current leakage in the opposite direction, it is possible to avoid the decreasing readout current in readout, as well as to shorten the sense time.

Figure 9B:
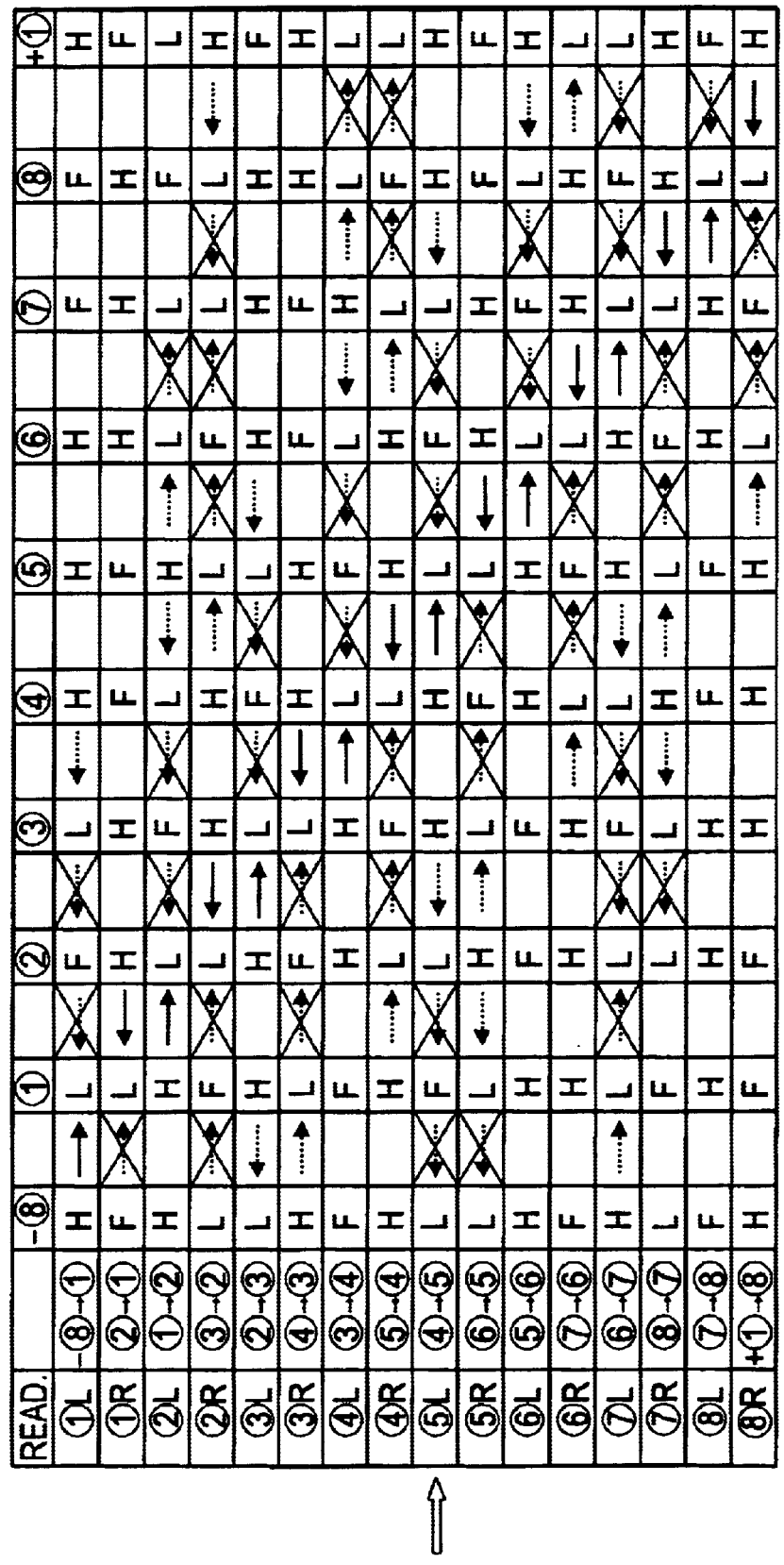

Referring to FIGS. 9a and 9b, an alternative storage node readout method, in an embodiment of the present invention, is explained.

As shown in FIGS. 9a and 9b, in reading out data from the L node of the electrically conductive region (5), the selection transistor connecting to the sub bit lines SB12 and SB11 is selected (turned on). The high (H) voltage (1.5V) is applied to the electrically conductive region (4), the electrically conductive region (5) is set to L (0V) and the gate electrode is set to Vg=4V. As aforementioned, the channel current flows from the electrically conductive region (4) to the electrically conductive region (5), if no electrons have been trapped.

At this time, in order to prevent current leakage from the electrically conductive region (4) in the opposite or reverse direction (from (4) to (3)), H (1.5V) which is the same as the potential of the electrically conductive region (4) is applied to the electrically conductive region (8) neighboring to the electrically conductive region (4) and to the electrically conductive region (8) neighboring to the electrically conductive region +(1) which is paired to the electrically conductive region (4) to form a set of sub bit lines.

When the current flows from the electrically conductive region (3) to the electrically conductive region −(8), the potential of the electrically conductive region –(8) is increased to raise the source potential of the selected memory cell, that is the potential of the electrically conductive region (5). The increase in the source potential decreases the readout current to affect the reading of the storage node.

In the present embodiment, in order to prevent the increasing of source potential of the memory cell being read (potential of the electrically conductive region (5)), the electrically conductive region arranged between the electrically conductive region (5), the electrically conductive region –(8), paired to the electrically conductive region (5) to form a set of sub bit lines and the electrically conductive regions (4), (3), (8) and (1), to which is applied the positive (H) voltage (1.5V), is set to L (0V) for shielding to eliminate the current flowing into the source (also termed interference current). In the embodiment, shown in FIG. 9b, the ground potential L (0V) is applied to the electrically conductive region (2) between the electrically conductive regions –(8) and (3) and to the electrically conductive region (7) between the electrically conductive regions (5) and (8), with the paired electrically conductive regions (2) and (7) forming a pair of the sub bit lines SB21.

An alternative embodiment of the present invention is now explained. FIG. 10 is a diagram showing a layout structure according to the second embodiment of the present invention. The embodiment shown in FIG. 10 corresponds to the structure shown in FIG. 1 in which the ends at the other end of the memory cell array of the paired electrically conductive regions 104, connected at an end of the memory cell array to the wiring 105 via contact 111, are also connected via contact 111 to the wiring 105 of the first aluminum wiring layer 1A1. By connecting the paired electrically conductive regions 104, forming the sub bit lines, at both of the longitudinal ends thereof, it is possible to reduce the resistance of the electrically conductive regions 104 connecting to the memory cells.

FIG. 11 is a diagram showing a circuit configuration of a memory cell array according to the second embodiment of the present invention, an illustrative layout of which is shown in FIG. 10. Referring to FIG. 11, the circuit of the present embodiment corresponds to that of FIG. 2 except that the ends of the electrically conductive regions a and a forming a set of sub bit lines, connected to the main bit line A via selection transistor TrA, longitudinally opposite to the ends thereof connected to the selection transistor TrA, are also interconnected via wiring 105 of the first aluminum wiring layer 1A1. In similar manner, the other paired electrically conductive regions are interconnected by the wiring 105 of the first aluminum wiring layer 1A1 at the longitudinally opposite sides to the sides thereof connected to the selection transistor.

In the above-described structure, if eight memory cells are connected to one of the sub bit lines, the resistance across the memory cells of the respective sub bit lines (electrically conductive regions) is R, and the selected main bit lines are A and B, the write current from both electrically conductive regions a, a connected by the wiring 105 flows via main bit line A and selected transistor TrA through the selected memory cell when the word line WLn is at the H level and the selected memory cell is the line n memory cell, where n is an integer from 1 to 8.

The resistance value of the sub bit line of the selected memory cell, when looking from the selecting transistor, is a parallel connected resistance of nR and (8–n)R+8R, such that the combined resistance is given as follows:

$n(16-n)R/16$

With the memory cell remotest from the selecting transistor, n=8, at which time the resistance value of the sub bit line is 4R or one half the resistance in the case of the first embodiment.

In the present embodiment, programming and readout occur as measures are taken to prevent writing in other cells during programming, to prevent the decreasing write current, to prevent the current leakage in the reverse direction during readout and to reduce the interference current.

FIG. 12 shows a structure according to a third embodiment of the present invention. In the present embodiment, the paired electrically conductive regions, connected to the wiring 105 of the first aluminum wiring layer 1A1 via contact 111 at one longitudinal end of the memory cell array have the opposite side longitudinal ends connected to the wiring 105 of the first aluminum wiring layer 1A1 through the contact 111, as in the second embodiment described above. In addition, the longitudinal ends of the respective electrically conductive regions are connected to the wirings 112A and 112B of the first aluminum wiring layer 1A1 and the second aluminum wiring layer 2A1.

With this structure of the present embodiment, the resistance of the sub bit line may be diminished. Turning to the structure of the wirings 112A and 112B, these wirings are provided in association with the electrically conductive regions 104 neighboring to each other, and specifically arranged in different layers, namely a second aluminum wiring layer and a first aluminum wiring layer. The wirings 112A and 112B are arranged alternately and equally spaced in association with the electrically conductive region 104 forming the sub bit line of the memory cell array.

The wiring 112B of the first aluminum wiring layer 1A1 is connected by the contact 111 to one end of the electrically conductive region 104. At the opposite end of the electrically conductive region 104, the paired electrically conductive regions are connected to the wiring 105 of the first aluminum wiring layer 1A1 adapted for connecting the paired electrically conductive regions 104 by the contact 111. The wiring 112A of the second aluminum wiring layer 2A1 has its one end connected to the electrically conductive region 104 via a through-hole 109 and a contact, not shown, while having its opposite end connected through the through-hole to the wiring 105 of the first aluminum wiring layer 1A1. The wiring 105, connected to the wiring 112A by the through-hole, is the wiring of the first aluminum wiring layer 1A1 which connects the paired electrically conductive regions by contact connection.

As for the main bit lines, main bit lines 101A and 101B of a second aluminum wiring layer 2A1 and a third aluminum wiring layer 3A1 are provided alternately.

FIG. 13 shows an equivalent circuit of a memory cell array according to the third embodiment of the present invention, an illustrative layout of which is shown in FIG. 12. In each of the paired electrically conductive regions, an end connected to the selection transistor 102 is connected via wiring 112 to its own longitudinally opposite end. The longitudinally opposite ends of the remaining electrically conductive regions are similarly connected to each other via a wiring 112 on the upper substrate layer.

The resistance value of the electrically conductive region in the memory cell of the selected nth row, when looking from the selecting transistor, is a parallel resistance of nR and (8–n)R, such that we have as a combined resistance n(8–n)R/8.

With the remotest memory cell, when looking from the selecting transistor, n=8, in which case the resistance value of the sub bit line is 0. The row with the maximum resistance value is n=4, with the resistance value being 2R.

In the present embodiment, writing and readout occur as measures are taken to prevent writing in other cells during writing, to prevent the decreasing write current, to prevent the current leakage in the reverse direction during readout and to reduce the interference current.

A fourth embodiment of the present invention is now explained. FIG. 14 shows a structure according to the fourth embodiment of the present invention. FIG. 15 shows an equivalent circuit of a memory cell array of the fourth embodiment, an illustrative layout of which is shown in FIG. 15. Referring to FIG. 15, a cell array is split into plural stages from its one longitudinal end to its other longitudinal end, each stage having, as its splitting unit, electrically conductive regions 104 (a, a), forming one set of sub bit lines, each one electrically conductive region (b, e), forming two sets of sub bit lines, connected via respective selecting transistors to two main bit lines arranged on both sides of the main bit line to which the aforementioned one set of sub bit lines are connected via the selection transistor 102, and each one (c, d) of electrically conductive regions of two sets of sub bit lines respectively connected to two neighboring main bit lines via selection transistor arranged on the opposite side of the selection transistor to which the set of the sub bit lines is connected, with the sum total of the four sub bit lines being arranged between the electrically conductive regions 104 (a, a).

In the embodiment shown in FIG. 14, the memory cell array is made up by four stages, with four gate electrodes 110 (word lines WL) in each stage corresponding to the splitting unit of the cell array. In the present embodiment, there is provided in the second aluminum wiring layer 2A1 a wiring 113 extending across the splitting units of the respective stages, along the longitudinal direction of the electrically conductive region 104, in association with a set of the electrically conductive regions. This wiring 113 is connected via through-holes 109-1, 109-2 and 109-3, to wirings 105-1, 105-2 and 105-3 of the first aluminum wiring layer 1A1, respectively. These wirings 105-1, 105-2 and 105-3 interconnect the paired electrically conductive regions forming a set of sub bit lines of the splitting unit of each stage. The wiring 105-2 of the first aluminum wiring layer 1A1 is connected to the paired electrically conductive regions of the upper and lower stages of the splitting units. Meanwhile, the wiring 105-2 of the first aluminum wiring layer 1A1, connecting the paired electrically conductive regions, contained in the second and third stages of the splitting units of the cell array, are co-owned by these second and third stages of the splitting units.

In the present embodiment, the paired electrically conductive regions, forming sub bit lines, connected to the selection transistors arranged on both longitudinal ends of the memory cell array, are split into plural splitting units, with the plural, herein four, word lines as units, and the wire 113 of the second aluminum wiring layer is extended across the respective stages of the electrically conductive regions 104 of the splitting units of the cell array, so as to be connected via throughholes to the wirings 105-1, 105-2 and 105-3 interconnecting the paired electrically conductive regions of the respective stages. The wirings 105-1, 105-2 and 105-3, interconnecting the electrically conductive regions of the respective stages of the spitting units, are at the same potential, such that the potential difference from stage to stage across the end closest to the selection transistor and the end remotest therefrom, if any, is of a negligible magnitude. The sub bit line is also of a reduced resistance.

A further embodiment of the present invention is now explained. FIG. 18 shows a circuit structure for illustrating a fifth embodiment of the present invention. In the present embodiment, shown in FIG. 18, the ends (termed one side ends) of paired electrically conductive regions 104 forming a set of sub bit lines, each end located on the side to which the selection transistor is connected, are interconnected through a wiring 105A of the first aluminum wiring layer 1A1, while the ends of the paired electrically conductive regions lying on the longitudinally opposite side to the one side ends are interconnected via a wiring 105B of the second aluminum wiring layer 2A1. In the present embodiment, the second aluminum wiring layer 2A1 is provided with a wiring 114, extending longitudinally of the electrically conductive region 104, this wiring 114 being connected to a mid portion of the wiring 105A via a through-hole. The main bit line 101, connected to the selection transistor 102, is provided to the second aluminum wiring layer. In the present embodiment, the resistance of the sub bit line, comprised of the electrically conductive region 104 (N+ diffusion layer) is diminished to improve characteristics of the write current and the read current. In the present embodiment, as in the previous embodiment, device isolation across the selection transistors 102 is by a field oxide film to improve voltage withstand characteristic of the selection transistor 102 as well as to prevent the decreasing write voltage applied to the memory cell in writing. In the present embodiment, programming and readout again occur as the voltage to the sub bit line of the row neighboring to the selected row is controlled to prevent writing in other cells during writing, to prevent the decreasing write current, to prevent the current leakage in the reverse direction during readout and to reduce the interference current, as described above.

Figure 19:
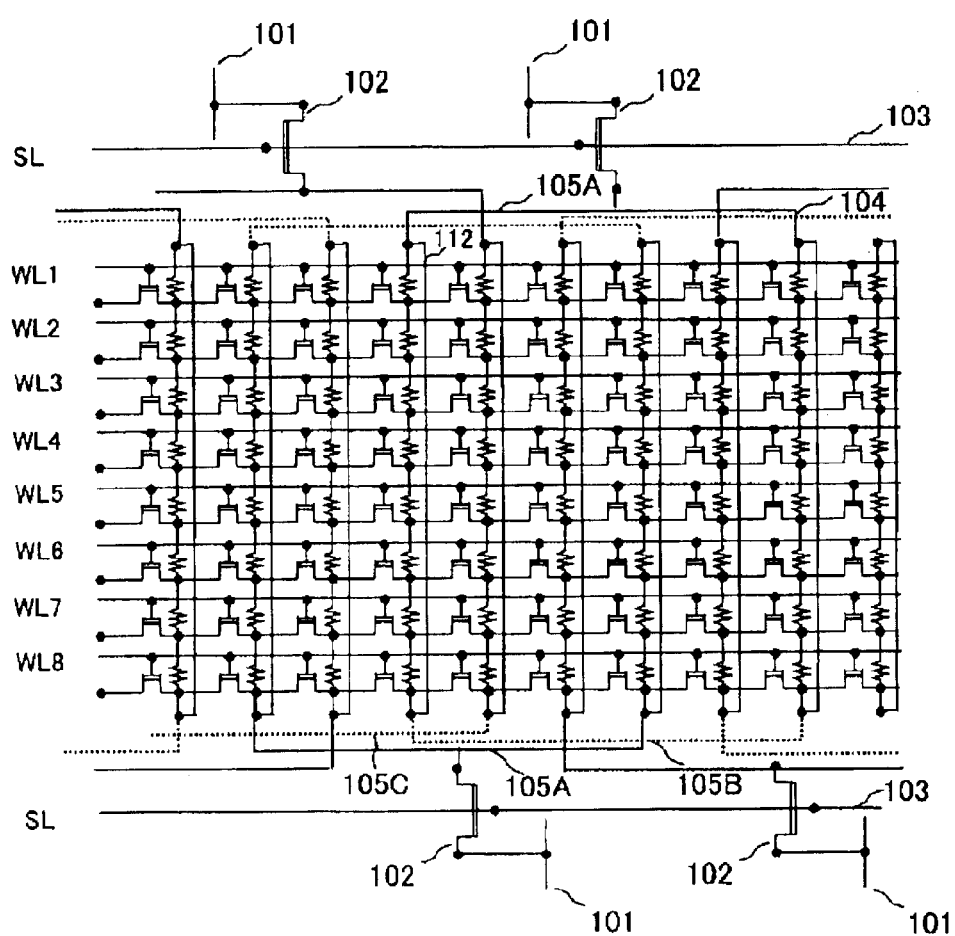
FIG. 19 is a diagram showing a circuit configuration according to a sixth embodiment of the present invention.

FIG. 19 shows the circuit configuration of a sixth embodiment of the present invention. In the present embodiment, shown in FIG. 19, the ends of paired electrically conductive regions 104, forming a set of sub bit lines, each end located on the side to which the selection transistor is connected, are interconnected through a wiring 105A of the first aluminum wiring layer 1A1, while the longitudinal ends of the electrically conductive region 104 are interconnected by a wiring 105A of the first aluminum wiring layer. The ends of the paired electrically conductive regions lying on the longitudinally opposite side to the first-stated ends are interconnected via a second or third aluminum wiring layer 105B (105C). In the present embodiment, programming and readout again occur as the voltage to the sub bit line of the row neighboring to the selected row is controlled to prevent writing in other cells during programming, to prevent the decreasing write current, to prevent the current leakage in the reverse direction during readout and to reduce the interference current, as described above.

A further embodiment of the present invention is now explained. FIG. 20 shows a layout for illustrating a seventh embodiment of the present invention. FIG. 21 is a diagram showing an equivalent circuit of the structure shown in FIG. 20. In FIG. 20, the parts or components corresponding to those shown in FIG. 1 are designated by the same reference numerals. Referring to FIGS. 20 and 21, the point of difference of the present seventh embodiment from the embodiment shown in FIGS. 1 and 2 is explained.

In the above-described embodiment, the ends of paired electrically conductive regions 104, forming a set of sub bit lines, each end located on the side to which the selection transistor is connected, are interconnected through the wiring 105 of the first aluminum wiring layer. In the present seventh embodiment, the end of one of the electrically conductive region 104 of the paired electrically conductive regions is connected to the longitudinally opposite end of the other electrically conductive region via a wiring 105 forming an upper layer on a substrate. More specifically, the end of the electrically conductive region of the paired electrically conductive regions forming a set of sub bit lines, which end is connected to the selection transistor 102, is connected to the end of the other electrically conductive region longitudinally opposite to the selection transistor 102, via e.g., the wiring 105 of the first aluminum wiring layer, so as to be astride plural electrically conductive regions.

As shown in FIG. 21 by way of illustration, there are arranged, between paired electrically conductive regions a and a forming a set of sub bit lines, connected to the selection transistor 102 (TrA), two sub bit lines b and e connected to the selection transistor neighboring to the selection transistor 102 (TrA), and two sub bit lines c and d connected to the opposite side selection transistors 102 (TrC and TrD), while the end of one of paired electrically conductive regions a and a forming a set of sub bit lines, which ends is connected to the selection transistor TrA of the one electrically conductive region, is connected to the end of the other electrically conductive region 104 by for example the first aluminum wiring layer via the wiring arranged across the sub bit lines b, c, d and e. This wiring 105 is arranged as a diagonal line interconnecting a set of diametrically opposite end points of a rectangle defined by the two electrically conductive regions. Of the four ends of the rectangle defined by the two electrically conductive regions, the two end points, excluding the two ends interconnected by the wiring 105 are open ends. It is noted that one of the two ends interconnected by the wiring is connected to the selection transistor 102.

In the present embodiment, the sum resistance of the source and the drain (two electrically conductive regions) of the memory cell transistor is equal for any memory cell of the memory cell array, without regard to its position (in the row or column), thus eliminating position dependency of the memory cell current (write current or the readout current).

Referring to FIGS. 20 and 21, a specified embodiment is explained. When a memory cell MC8, having electrically conductive regions of the sub bit lines a and b as paired diffusion layers (source/drain) and connected to a word line WL8 is selected, the diffusion layer on the side sub bit line a is connected to the selection transistor TrA through a wiring 105, the resistance of which is substantially negligible as compared to the resistance of the N+ diffusion layer. The diffusion layer on the side sub bit line b of the memory cell is connected to the selection transistor TrB via resistance 8R of the electrically conductive region 104. The resistance 8R is a series connection of eight resistors R, such that the sum of the resistance values of the electrically conductive regions is 8R. On the other hand, the diffusion layer on the side sub bit line a is connected to the selection transistor TrA through a wiring 105 and a resistor R, while the diffusion layer on the side sub bit line b of the memory cell MC7 is connected to the selection transistor TrB via resistance 7R of the electrically conductive region b. The sum of the resistance values of the electrically conductive regions a and b, connected to the memory cell MC7, is 8R. Similarly, the sum of the resistance values of the electrically conductive regions a and b is 8R.

With an eye to the longitudinal direction of the sub bit lines, the resistance value of the diffusion layer of the memory cell is the same without dependency on the word lone position. The same may be the of the memory cells between the sub bit lines b and c, c and d, d and e and e and a. Thus, with the present embodiment, position-dependent variations of the memory cell current in the memory cell array may be resolved.

In the present embodiment, programming and readout occur as the voltage to sub bit lines neighboring to the selected row is controlled in such a manner as to prevent writing in other cells during writing, to prevent the decreasing write current, to prevent the current leakage in the reverse direction during readout and to reduce the interference current, as described above. Of course, the memory cell array of the present embodiment may be comprised of a plural number of stages each including paired electrically conductive regions made up by a set of sub bit lines both longitudinal ends of which are interconnected by a diagonal line on the upper substrate layer, with the paired electrically conductive regions extending from the selection transistor on the one longitudinal side to that on the opposite side of the cell array.

Figure 23:
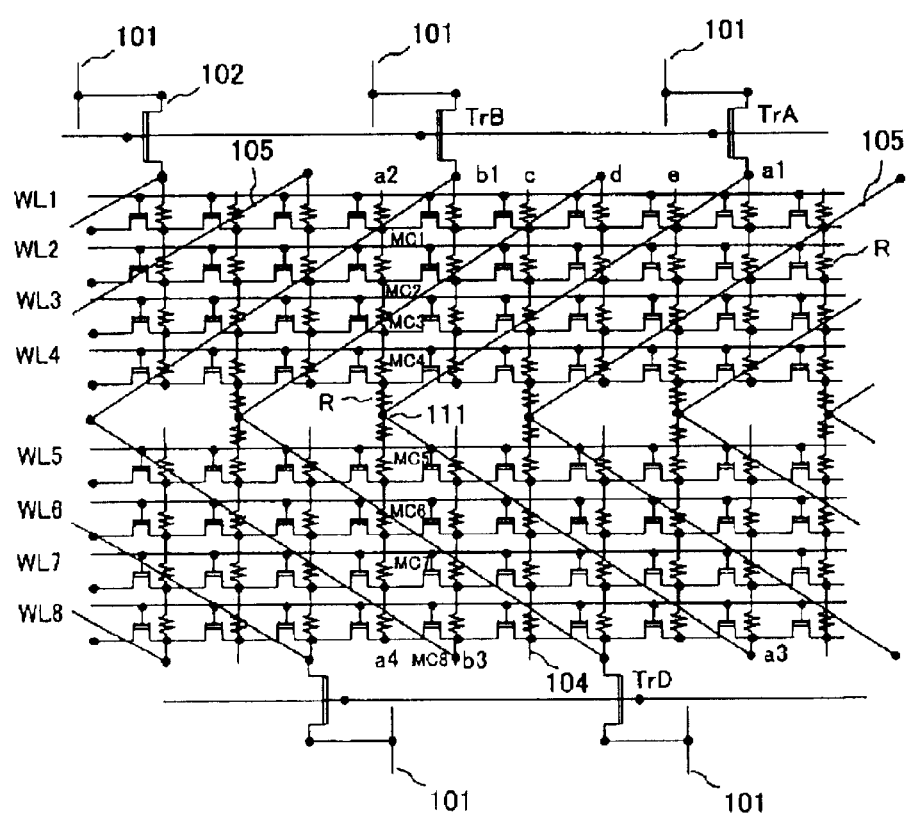
FIG. 23 is a diagram showing a circuit configuration according to the eighth embodiment of the present invention.

FIG. 22 illustrates a layout for illustrating an eighth embodiment of the present invention. FIG. 23 illustrates an equivalent circuit configured as shown in FIG. 22, in which the same parts or components as those shown in FIG. 20 are denoted by the same reference numerals. Meanwhile, in FIG. 23, N in FIG. 22 is set to 4 (N=4). The eighth embodiment of the present invention is explained with reference to FIGS. 22 and 23. In the eighth embodiment, the parts or components which are the same as those of the seventh embodiment shown in FIGS. 20 and 21 are not explained and only the point of difference from the above-described seventh embodiment are explained.

In the eight embodiments, the ends of the electrically conductive regions are interconnected by wirings 105 of the first aluminum-wiring layer. Moreover, the two electrically conductive regions 104, forming a set of sub bit lines, are split into two sets or stages, each set or stage comprising a plural number N of word lines, as a unit.

One of the paired electrically conductive regions, forming sub bit lines, connected to a given selection transistor 102, is separated into two sets of electrically conductive regions a1 and a3, arrayed on the same column, with the other of the paired electrically conductive regions, forming sub bit lines, is made up by two sets of electrically conductive regions a2 and a4, arrayed on the same column. The ends of the electrically conductive regions a2 and a4 are not separated from each other, but are interconnected by an electrically conductive region forming a junction. In the present embodiment, the resistance value across both ends of the electrically conductive region forming the junction across the electrically conductive regions a2 and a4 is equivalent to the resistance value of an electrically conductive region corresponding to the length of an electrically conductive region of a length of two rows of memory cells of the word line, such as the electrically conductive regions a1 and a3.

The electrically conductive region a1 has its one end connected to a diffusion layer 108 of the selection transistor 102, while having its longitudinally opposite end as the opened end. The electrically conductive region a3 has its one end lying towards the open end of the electrically conductive region a1 as an open end, while including a contact area on one longitudinal end opposite to its open end. A contact region is provided centrally of the junction (electrically conductive region) of the electrically conductive regions a2 and a4 interconnected without interruptions. The resistance value of the from the center of the junction (electrically conductive region) to the end of the electrically conductive region a2 or a4 is equivalent to the resistance value of the length of one row of memory cells of the word line 110, such as the electrically conductive region a1 or a2.

The wiring 105 of the first aluminum wiring layer has its one end connected via contact 111 to the diffusion layer 108 of the selection transistor 102 of the electrically conductive region a1, and extends in an oblique direction, over N word lines 110 of the first set and four electrically conductive regions 104, with the opposite end of the wiring 105 being connected through contact 111 to a mid portion of the junction of the electrically conductive region a2 and a4.

The wiring 105 of the first aluminum wiring layer is extended in an oblique direction, over N word lines 110 of the first set and four electrically conductive regions 104, so as to be connected to one end of the electrically conductive region a3 through contact 111. That is, the wiring 105 is extended in a chevron shape, with the bend of the chevron lying at the contact connection to the center position of the junction between the electrically conductive regions a2 and a4, for connection with the ends of the electrically conductive region a1 or a3. The same structure is used for the electrically conductive regions b, c, d and e positioned between the paired electrically conductive regions a1 and a3.

Referring to FIG. 23, by way of an example, there are arranged sub bit lines b1, c, d and e, between the paired electrically conductive regions a1 and a2, forming a set of sub bit lines connected to the selection transistor 102 (TrA). As for the paired electrically conductive regions a1 and a2, one ends of the electrically conductive regions a1 and a3 and a central portion forming the junction of the electrically conductive regions a2 and a4, which represents the same electrically conductive region as the electrically conductive regions a2 and a4, are interconnected by wirings 105 of the first aluminum wiring layer. That is, the first set of the paired electrically conductive regions a1 and a2 and the second set of the paired electrically conductive regions a3 and a4 are connected in parallel with respect to the diffusion layer 108 of the selection transistor 102 (TrA).

In the present embodiment, the sum resistance of the source and the drain of the memory cell transistor up to the selection transistor 102 is equal for any memory cell of the memory cell array, without regard to the cell position (in the row or column), thus eliminating position dependency of the memory cell current (write current or the readout current).

Referring to FIG. 23, a specified embodiment is explained. When a memory cell MC4, having electrically conductive regions of the sub bit lines a2 and b1 as paired diffusion layers (source/drain) and having its gate connected to a word line WL4 is selected, the diffusion layer on the side sub bit line a2 is connected to the selection transistor TrA through a wiring 105, the resistance of which is substantially negligible as compared to the resistance of the N+ diffusion layer, and through a unit resistance R of the resistance of the electrically conductive region a2, that is the resistance of the electrically conductive region corresponding to one row interval of the memory cells. The diffusion layer on the side sub bit line b1 of the memory cell MC4 is connected to the selection transistor TrB via resistance 4R of the electrically conductive region b1. The resistance 4R is a series connection of eight resistors R. Thus, the sum of the resistance values of the electrically conductive regions a2 and b1, connected to the paired diffusion layers of the memory cell MC4 up to the respective selection transistors TrA and TrB is 5R.

On the other hand, the diffusion layer on the side sub bit line a2 of the memory cell MC3, having the electrically conductive regions a2, b1 as paired diffusion layers and having the gate connected to the word line WL3, is connected to the selection transistor TrA via wiring 105 and resistor 2R, while the diffusion layer on the side electrically conductive region b1 of the memory cell MC3 is connected to the selection transistor TrB through a resistor 3R of the electrically conductive region b1. The sum of the resistance values of the electrically conductive regions a2 and b1, connected to the memory cell MC1, is 5R.

The resistance value of the electrically conductive region a4, connected to the memory cell MC8, connected in turn to the second stage word line WL8, is 5R, that is a resistance corresponding to five resistors from the contact 111 as a junction between the electrically conductive regions a2 and a4. Since the electrically conductive region b3 is connected via wiring 105 to the selection transistor TrB, the sum of the resistance values up to the selection transistors TrA and TrB of the electrically conductive regions a4 and b3 is 5R.

The same may be the of the memory cells MC5 to MC7 of the other rows and of the memory cells between optional two rows of the electrically conductive regions a2 and b1, such that the resistance sum up to the corresponding selection transistors 102 of the electrically conductive regions connecting to the diffusion layers of the memory cells is equal to 5R. In this manner, the resistance value between the diffusion layer of the memory cell and the selection transistor is constant without dependency on the memory cell locations.

The resistance value of the diffusion layer of the memory cell is constant without dependency on the memory cell location, as described above. With the structure of the present embodiment, any variations dependent on the location of the memory cell current in the memory cell may be eliminated. With the structure in which, by designing the memory cell array so that sub bit lines connected to the sole selection transistor are split with plural word lines as a unit and the paired sub bit lines are interconnected by the wirings, the resistance value of the sub bit line connected to the diffusion layer of the memory cell can be reduced further as compared to that in the above-described seventh embodiment.

Figure 25:
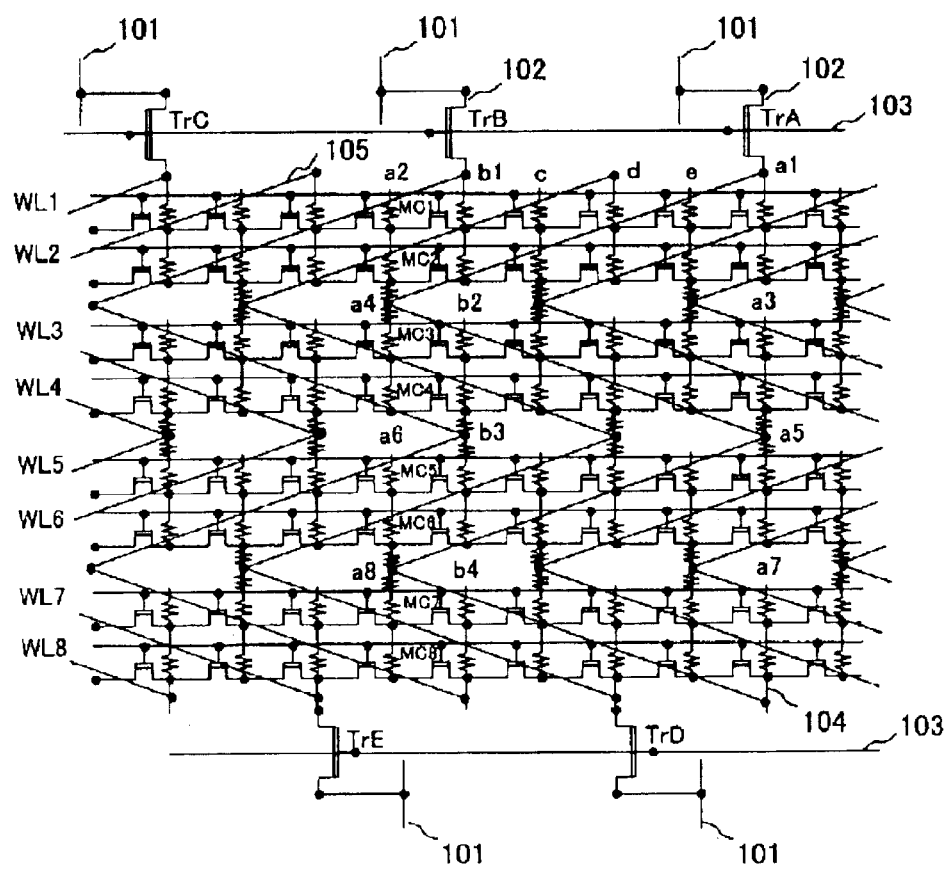
FIG. 25 is a diagram showing a circuit configuration according to the ninth embodiment of the present invention.

FIG. 24 shows a layout structure for illustrating a ninth embodiment of the present invention. FIG. 25 illustrates an equivalent circuit configured as shown in FIG. 24. Meanwhile, in FIG. 25, N and M in FIG. 24 are set to 2 and 4, respectively (N=4 and M=4). In FIG. 24, the same parts or components as those shown in FIG. 20 are denoted by the same reference numerals. The ninth embodiment of the present invention is explained with reference to FIGS. 24 and 25.

In the present ninth embodiment, the paired electrically conductive regions, forming the sub bit lines, are split into M sets, where M is an even number not less than 4, in the longitudinal direction, with N word lines as unit. If M=2 in FIG. 24, the resulting structure corresponds to the eighth embodiment described above. In the following, M is set to 4 (M=4) for simplicity.

Of the paired electrically conductive regions, forming sub bit lines, commonly connected to the sole selection transistors 102, the one electrically conductive regions are formed by four stages of the electrically conductive regions a1, a3, a5 and a7 on the same column, with the other electrically conductive regions being formed by the electrically conductive regions a2, a4, a6 and a8 on the same column.

One end of the electrically conductive region a1 of the first stage is connected to the diffusion layer 108 of the selection transistor 102, with the other end opposite to the one end in the longitudinal direction being an open end.

One end of the electrically conductive region a2 of the first stage is an open end, while the other end thereof longitudinally opposite to the one end is connected to the electrically conductive region a4 of the second stage via an electrically conductive region forming a junction to the electrically conductive region a4. The resistance across both ends of the electrically conductive region forming the junction is two resistance units or 2R, where 1R is the resistance of the electrically conductive region of a length corresponding to an interval of one row of memory cells.

One end of the electrically conductive region a3 of the second stage is an open end, while the other end thereof longitudinally opposite to the one end is connected to the electrically conductive region a5 of the third stage via an electrically conductive region forming a junction and includes a contact area in a junction area to the electrically conductive region a5.

The end of the electrically conductive region a4 of the second stage a4, connected to the electrically conductive region a2, is an open end.

The end of the electrically conductive region a5 of the third stage a5, connected to the electrically conductive region a3, is an open end.

One end of the electrically conductive region a6 of the third stage is an open end, while the longitudinally opposite end to the one end is connected to the electrically conductive region a8 of the fourth stage via an electrically conductive region as a junction and includes a contact region in a junction to the electrically conductive region a8.

On end of the electrically conductive region a7 of the fourth stage is an open end, while the longitudinally opposite end to the one end includes a contact region.

The end of the electrically conductive region a8 of the fourth stage, opposite to its side connecting to the electrically conductive region a6 is an open end.

The wiring 105 of the first aluminum wiring layer is connected to the side of the electrically conductive region a1 connected to the selection transistor 102, via contact 111, while being connected via contact 111 to the junction of the electrically conductive regions a2 and a4.

The junction between the electrically conductive regions a2 and a4 is connected via wiring 105 and contact 111 to the junction between the electrically conductive regions a3 and a5.

The junction between the electrically conductive regions a3 and a5 is connected via wiring 105 and contact 111 to the junction between the electrically conductive regions a6 and a8.

The junction between the electrically conductive regions a6 and a8 is connected via wiring 105 and contact 111 to one end of the electrically conductive region a7. The same may be true of the electrically conductive region between the electrically conductive regions a1 and a2.

In this manner, the wiring 105 is arranged obliquely in the memory cell array and is arranged as its orientation is switched from a group of N word lines as a unit. That is, the pattern configuration of the wiring 105 is alternately switched between "<" and ">"

Referring to FIG. 25, a specified embodiment is explained. The diffusion layer towards the sub bit line a2 of the memory cell MC1, having the first stage electrically conductive regions a2 and b1 as the diffusion layer pair (source/drain) and which is connected to the word line WL1, is connected to the selection transistor TrA via wiring 105, the resistance of which as compared to the resistance of the N+ diffusion layer can be substantially disregarded, and via resistance 2R corresponding to two units of the electrically conductive regions. The diffusion layer of the memory cell towards the sub bit line b1 is connected to the selection transistor TrB via resistance R corresponding to one unit of the electrically conductive region. The sum resistance up to the selection transistors TrA and TrB of the electrically conductive regions a2 and b1, connected to the diffusion layer pair of the memory cell MC1, is equal to 3R. In similar manner, the diffusion layer of the memory cell MC2, having the first stage electrically conductive regions a2 and b1 as the diffusion layer pair (source/drain) and which is connected to the word line WL2, is connected to the selection transistor TrA via wiring 105 and an electrically conductive region of resistance R, while the diffusion layer of the memory cell towards the sub bit line b1 is connected to the selection transistor TrB through a resistance 2R (a series connection of two resistors R). The sum resistance up to the selection transistors TrA and TrB of the electrically conductive regions a2 and b1, connected to the diffusion layer pair of the memory cell MC2, is equal to 3R.

The resistance value of the electrically conductive region a8, connected to the diffusion layer of the memory cell MC8, connected to the fourth-stage word line WL8, is 3R. Since the electrically conductive region b4, connected to the diffusion layer of the memory cell MC8, is connected to the selection transistor TrB via wiring 105, the sum resistance of the electrically conductive regions a8 and b4, connected to the diffusion layer pair of the memory cell MC8, is 3R. The same may be the of the other memory cells MC5 to MC7, with the sum of the resistance value to the associated selection transistors of the two electrically conductive regions connected to the diffusion layer pair being 3R.

In the ninth embodiment of the present invention, the resistance value of the diffusion layers of the memory cell is constant, without dependency on the memory cell position, such that any variations dependent on the location of the memory cell current in the memory cell may be eliminated. In the ninth embodiment of the present invention, the resistance value of each of M sets of the paired electrically conductive regions connected in parallel to the diffusion layer of one selection transistor 102 through the wiring 105 is set so as to be lower than that in the eighth embodiment, so that the resistance value of the sub bit line connected to the diffusion layer of the memory cell may be smaller than that in the eighth embodiment.

Figure 27:
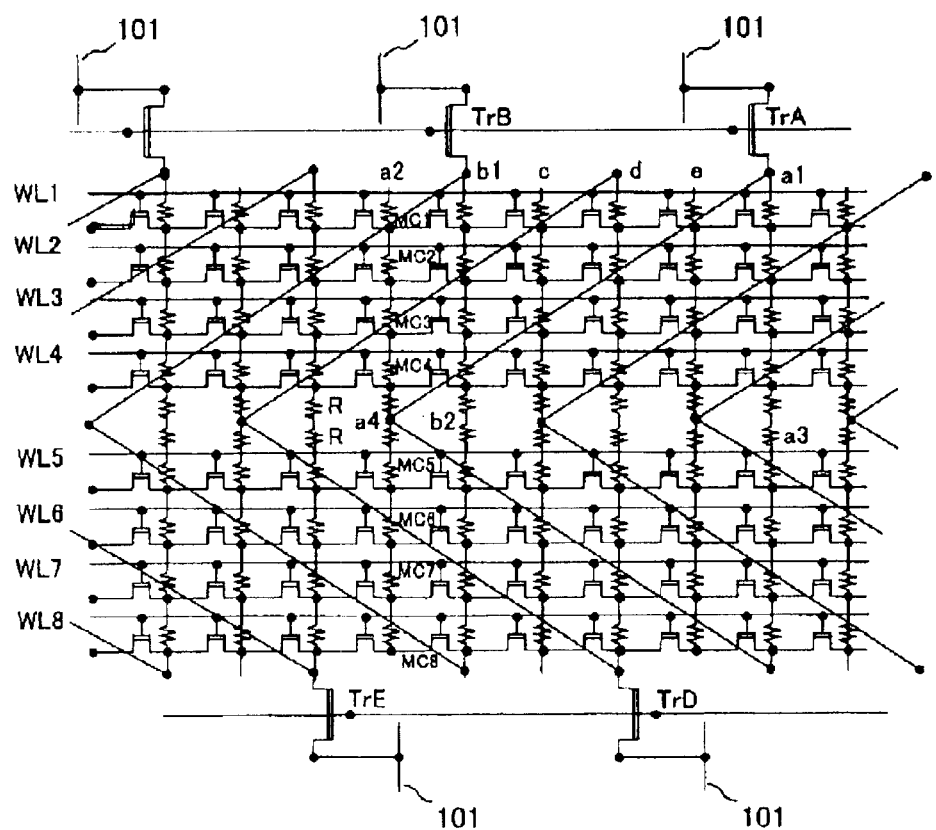
FIG. 27 is a diagram showing a circuit configuration according to the tenth embodiment of the present invention.

FIG. 26 shows a layout for illustrating a tenth embodiment of the present invention. FIG. 27 illustrates an equivalent circuit configured as shown in FIG. 26. Meanwhile, in FIG. 26, N in FIG. 24 is set to 4 (N=4). In FIG. 26, the same parts or components as those shown in FIG. 22 are denoted by the same reference numerals. The tenth embodiment of the present invention is explained with reference to FIGS. 26 and 27.

In the tenth embodiment of the present invention, the electrically conductive regions, having ends interconnected by the wirings 105 of the first aluminum wiring layer to form a set of sub bit lines, are split in the longitudinal direction into two sets, with N word lines as a unit. In the above-described eighth embodiment, shown in FIG. 22, one of the two electrically conductive regions of the pair of the electrically conductive regions is split between the first and second stages of the electrically conductive regions of the same column. In the present tenth embodiment of the present invention, in one of the two electrically conductive regions of the pair of the electrically conductive regions of the two columns, forming a set of sub bit lines, the first set of the electrically conductive regions a1 and the second set of the electrically conductive regions a3 are interconnected via an electrically conductive region forming a junction. That is, the first set of the electrically conductive regions a1 and the second set of the electrically conductive regions a3 are not split and are interconnected as one through an electrically conductive region. The resistance value across both ends of the electrically conductive region forming the junction between the first set of the electrically conductive regions a1 and the second set of the electrically conductive regions a3 is the resistance of two units or 2R, where R is a resistance value of the electrically conductive region corresponding to one row interval of the memory cells. The same applies for the resistance value across both ends of the electrically conductive region forming the junction between the first set of the electrically conductive regions a2 and the second set of the electrically conductive regions a4.

One end of the first-stage electrically conductive region a1 is connected to the diffusion layer 108 of the selection transistor 102. The one end of the electrically conductive region a1 and its longitudinally opposite end are interconnected as one via a junction to one end of the second stage electrically conductive region a3. The end of the electrically conductive region a3 opposite to the one end includes a contact area.

One end of the electrically conductive region a2 forming the first set of the electrically conductive regions with the electrically conductive region a1 is an open end, while the other end longitudinally opposite to the one end is connected to one end of the second stage electrically conductive region a4 via a junction, and includes a contact area in the junction. The other end longitudinally opposite to the second stage electrically conductive region a4 is an open end.

The wiring 105 of the first aluminum wiring layer is connected via a contact 111 to the side of the electrically conductive region a1 connected to the selection transistor 102, and is connected through the contact 111 to a junction between the electrically conductive region a3 and the electrically conductive region a4 astride the N word lines of the first stage and plural electrically conductive regions. The junction between the electrically conductive region a2 and the electrically conductive region a4 is connected through the contact 111 to the end of the electrically conductive region a3 through the contact 111 astride second stage N word lines and plural electrically conductive regions. That is, the wiring 105 is extended in a chevron shape as a pattern shape, with the contact 111 to the junction between the electrically conductive region a2 and the electrically conductive region a4 as center.

Referring to FIG. 27, for illustrating a specified embodiment, when a memory cell MC4, having the electrically conductive regions a2, b1 of the sub bit line as paired diffusion layers (source/drain) and which is connected to the word line WL4, is selected, the diffusion layer of the memory cell towards the electrically conductive region a2 is connected through the resistance R of one unit of the electrically conductive region to the selection transistor TrA through a wiring 105, the resistance of which can be substantially disregarded as compared to the resistance of the N+ diffusion layer. The diffusion layer towards the electrically conductive region b1 of the memory cells is connected to the selection transistor TrB though a resistance 4R corresponding to four units of the electrically conductive regions, with the sum resistance up to the selection transistors TrA and TrB of the electrically conductive regions a2, b1 connected to the memory cell MC4 being 5R.

The resistance value of the electrically conductive region a4 connected to the diffusion layer of the memory cell MC8 connected in turn to the second stage word line WL8 is 5R, while the electrically conductive region b2 is connected via wiring 105 to the selection transistor TrB, so that the sum of the resistances of the electrically conductive regions a4 and b2 is 5R. In similar manner, for each of the other memory cells MC5 to MC7, the sum of the resistance values up to the selection transistor 102 of the electrically conductive regions a4 and b2 connected to the diffusion layer pairs of the memory cells is 5R.

Figure 29:
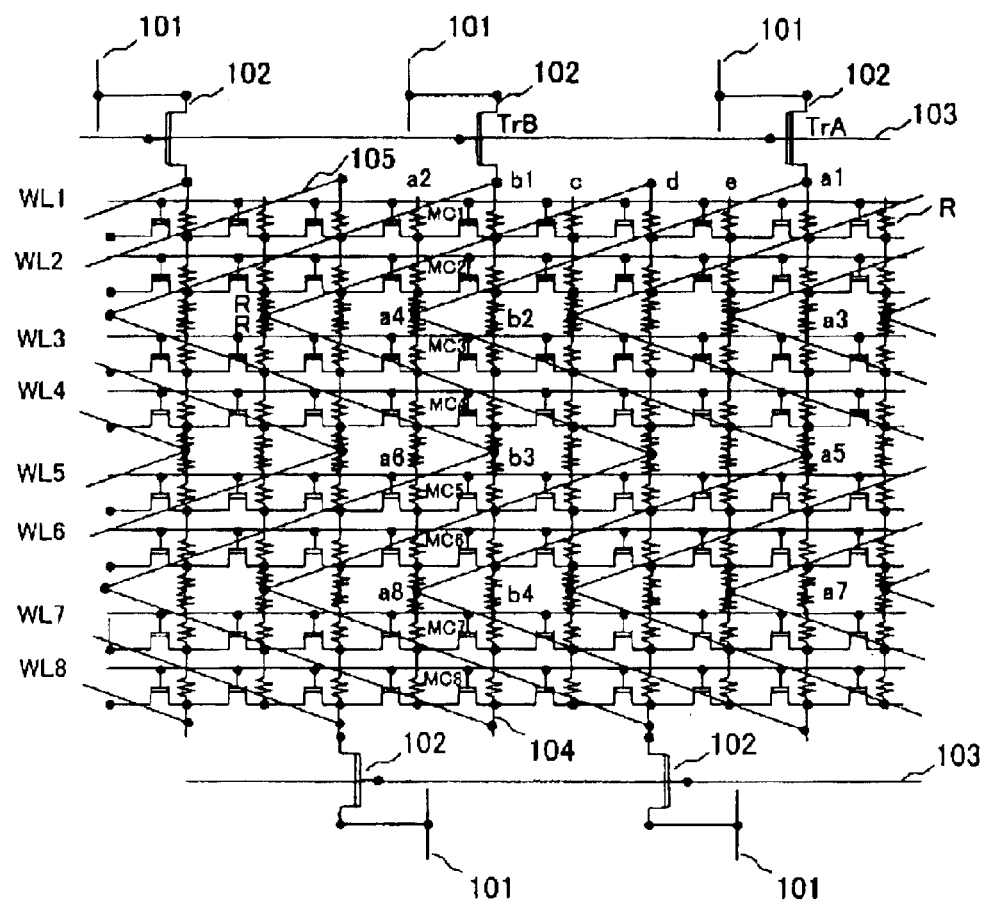
FIG. 29 is a diagram showing a circuit configuration according to the eleventh embodiment of the present invention.

FIG. 28 shows a layout for illustrating an eleventh embodiment of the present invention. FIG. 29 illustrates an equivalent circuit configured as shown in FIG. 28. Meanwhile, in FIG. 29, N and M in FIG. 28 is set to 2 and 4, respectively. In FIG. 28, the same parts or components as those shown in FIG. 24 are denoted by the same reference numerals. As for the eleventh embodiment of the present invention, only the point of difference from the ninth embodiment is explained, while the explanation of the same portions as those of the eighth embodiment shown in FIGS. 24 and 25 is omitted.

In the eleventh embodiment of the present invention, the memory cell array is split into M sets, with a plural number (N) of word lines as a unit. In each of the M sets, each set being a pair of two columns of the electrically conductive regions 104 connected commonly to one selection transistor 102 and which form a set of sub bit lines, the electrically conductive regions on the same column are not split (interrupted) and the respective sets are interconnected as one by an electrically conductive region (junction) of the resistance 2R twice the unit resistance. As for the M sets of the paired electrically conductive regions, each pair forming a set of the sub bit lines and which is commonly connected by a sole selection transistor, the plural electrically conductive regions on the same columns (the electrically conductive regions a1, a3, a5 and a7 on the same column and the electrically conductive regions a2, a4, a6 and a8 on a different same column) are provided with contact regions, which are provided to every other column in the longitudinal direction.

One end of the first stage electrically conductive region a1 is connected to the diffusion layer 108 of the selection transistor 102, while the other end thereof opposite to the one end is connected to one end of the second stage electrically conductive region a3 via a resistance 2R of the electrically conductive region forming the junction.

The one end of the first stage electrically conductive region a2 is an open end, while the other end thereof opposite to the one end is connected to one end of the second stage electrically conductive region a4 via a resistance 2R of the electrically conductive region forming the junction. A contact area is provided partway on the connecting portion.

The other end of the second stage electrically conductive region a3, longitudinally opposite to the one end, is connected to one end of the third stage electrically conductive region a5 via a resistance 2R of the electrically conductive region forming the junction. A contact area is provided partway on the connecting portion.

The other end of the second stage electrically conductive region a4, longitudinally opposite to the one end, is connected to one end of the third stage electrically conductive region a6 via a resistance 2R of the electrically conductive region forming the junction.

The other end of the third stage electrically conductive region a5, longitudinally opposite to the one end, is connected to one end of the fourth stage electrically conductive region a7 via a resistance 2R of the electrically conductive region forming the junction.

The other end of the third stage electrically conductive region a6, longitudinally opposite to the one end, is connected to one end of the fourth stage electrically conductive region a8 via a resistance 2R of the electrically conductive region forming the junction. A contact area is provided partway on the connecting portion.

The other end of the fourth stage electrically conductive region a7 is provided with a contact area.

The other end of the fourth stage electrically conductive region a8 is an open end.

The wiring 105 of the first aluminum wiring layer is connected via contact 111 to the side of the electrically conductive region a1 connected to the selection transistor, and is connected to the junction of the electrically conductive regions a2 and a4 via contact 111.

A mid portion of the connecting portion of the electrically conductive regions a2 and a4 is connected via wiring 105 and contact 111 to the junction between the electrically conductive regions a3 and a5.

A mid portion of the connecting portion of the electrically conductive regions a3 and a5 is connected via wiring 105 and contact 111 to the junction between the electrically conductive regions a6 and a8.

A mid portion of the connecting portion of the electrically conductive regions a3 and a5 is connected via wiring 105 and contact 111 to the end of the electrically conductive region a7. The wiring 105 is meanderingly arranged in the memory cell array in the oblique direction, with N word lines as a unit, as it changes its orientation with N word lines as a unit.

Referring to FIG. 29, a specified embodiment is explained. FIG. 29 shows an equivalent circuit in case N=2 and M=4 in FIG. 28.

When a memory cell MC2, having the electrically conductive regions a2, b1 of the first set as paired diffusion layers (source/drain) and which is connected to the word line WL2, is selected, the diffusion layer of the memory cell towards the electrically conductive region a2 is connected is connected to the selection transistor TrB through the resistance R of one unit of the electrically conductive region to the selection transistor TrA through a wiring 105, the resistance of which can be substantially disregarded as compared to the resistance of the N+ diffusion layer. The diffusion layer towards the electrically conductive region b1 of the memory cells is connected to the selection transistor TrB though a resistance 2R corresponding to two units of the electrically conductive regions, with the sum resistance up to the selection transistors TrA and TrB of the electrically conductive regions a2 and b1 connected to the diffusion layer pair of the memory cell MC4 being 3R.

The resistance value of the electrically conductive region a8 connected to the diffusion layer of the memory cell MC8 connected to the fourth set of the word line WL8 is 3R. On the other hand, since the electrically conductive region b4 is connected by the wiring 105 to the selection transistor TrB, the sum of the resistances up to the respective selection transistors TrA and TrB of the electrically conductive regions a8 and b4 connected to the diffusion layer pair of the memory cell MC8 is 3R. Similarly, for each of the other memory cells MC5 to MC7, the sum of resistance values up to the selection transistor of the electrically conductive region connected to the diffusion layer pair of the memory cell MC8 is 3R. In this manner, the resistance value of the sub bit line connected to the diffusion layer of the memory cell may be diminished as compared to that in the above-described eighth embodiment.

In the above-described eighth to eleventh embodiments, writing and readout again occur as the voltage to the sub bit line of the row neighboring to the selected row is controlled to prevent writing in other cells during writing, to prevent the decreasing write current, to prevent the current leakage in the reverse direction during readout and to reduce the interference current, as described above. Of course, the memory cell array of the present embodiment may be comprised of a plural number of stages each including paired electrically conductive regions made up by a set of sub bit lines both longitudinal ends of which are interconnected by a diagonal line on the upper substrate layer, with plural stages of the paired electrically conductive regions being provided for extending from the selection transistor on the one longitudinal side to that on the opposite side of the cell array, as in the fourth embodiment described above.

Although the present invention has been explained with reference to preferred embodiments thereof, the present invention is not limited to these specified embodiments and may comprise a variety of modifications or changes which might be accomplished by those skilled in the art within the scope of the invention as defined in the appended claims. For example, although the above description is based on the programmable and readable non-volatile semiconductor memory device, the present invention may also be applied to a read-only semiconductor memory device. In addition, although the above description is based on a memory cell having an ONO film having two electron trapping regions for independently memorizing two bits in one cell, the preset invention is not limited to this configuration, and may be applied to a configuration for storing one bit in one cell or to an MOS transistor, an optional MONOS transistor or to a stack gate transistor.

The meritorious effects of the present invention are summarized as follows.

According to the present invention, the sets of the sub bit lines, connected to the selection transistors provided on both sides of the memory cell array, are formed by two electrically conductive regions, and the sets of the sub bit lines are arranged in an interchanged fashion, so that it is possible to reduce the resistance values of the electrically conductive regions at the remote ends from the selection transistor, and to prevent the increasing chip area despite the increasing memory capacity.

According to the present invention, one ends or the opposite ends of the paired electrically conductive regions, forming a set of sub bit lines, are interconnected by wirings to lower the resistance of the electrically conductive regions from the selection transistor to the memory cell.

Moreover, according to the present invention, both ends of the electrically conductive regions are interconnected by wirings to lower the resistance of the electrically conductive regions.

According to the present invention, paired electrically conductive regions forming a set of sub bit lines are split into plural stages and the paired electrically conductive regions of the respective stages are connected by the wiring of the wiring layers to provide for substantially equal potential for the paired electrically conductive regions of the respective stages.

Additionally, according to the present invention, since device isolation across the selection transistors is achieved by the field oxide film, the selection transistor is able to withstand higher voltage, while it is possible to prevent the lowering of the voltage supplied at the time of writing to the electrically conductive region of the memory cell as a target of writing.

According to the present invention, a preset voltage is applied to the neighboring electrically conductive regions at the time of writing to inhibit writing in other cells as well as to inhibit the writing current from being decreased.

According to the present invention, a preset voltage is applied to the neighboring electrically conductive regions at the time of readout to prevent the readout current from being decreased due to current leakage in the reverse direction as well as to suppress generation of the interference current.

Moreover, according to the present invention, since the sum of the resistances of the electrically conductive regions is constant without dependency on the memory cell locations, it is possible to suppress localized variations in write characteristics or variations in the readout current. That is, according to the present invention, one end of two electrically conductive regions of a set of sub bit lines, connected to the selection transistor, and the opposite end of the other electrically conductive region, are connected to form a diagonal line by a wiring of the upper substrate layer, so that the location dependency of the resistance sum of the diffusion layer of the memory cell in the memory cell array may be resolved to overcome location dependency of the readout and write characteristics.

In addition, according to the present invention, the sub bit lines are split into plural groups, in each of which the resistance sum of the electrically conductive regions is rendered constant without dependency on the memory cell location, such that it is possible to suppress the resistance sum to a lower value to suppress localized variations in the write characteristics or in the readout current.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device comprising a memory cell array in which a plurality of memory cells are arranged in an array: and
a plurality of selection transistors arranged respectively on one side and on another side opposing to said one side of sad memory cell array; wherein
two electrically conductive regions formed in separation from each other on the substrate surface are interconnected to form a set of sub bit lines, the set of the sub bit lines being connected to one main bit line via an associated one of the selection transistors; and wherein
there are arranged, in a region in the memory cell array area defined between a pair of electrically conductive regions composing one set of said sub bit lines, each one of paired electrically conductive regions forming two sets of sub bit lines respectively connected via selection transistors to two main bit lines on both sides adjacent to a main bit line associated with the set of the sub bit lines, and each one of paired electrically conductive regions forming two sets of sub bit lines respectively connected to the two neighboring main bit lines via selection transistors on the opposite side of the memory cell array, totaling at four sub bit lines.

2. A semiconductor memory device comprising a plurality of electrically conductive regions extending parallel to one another on a substrate surface forming a memory cell array area; wherein
two of the plural electrically conductive regions are connected as a pair to form a set of sub bit lines;
each set of the sub bit lines are connected to a main bit line via an associated selection transistor;
a plurality of said selection transistors are arranged on both ends of said memory cell array, in an opposing relation to one another; and
a plural number of sets of said sub bit lines respectively connected to plural selection transistors on one end of said memory cell array and a plural number of sets of said sub bit lines respectively connected to plural selection transistors on the opposite end of said memory cell array are arranged alternately wherein, of respective longitudinal ends of the paired electrically conductive regions of the set of sub bit lines, the ends lying on the side of the selection transistor associated with the set of sub bit lines (referred to as one side ends) are interconnected via a wiring arranged on an upper layer on the substrate.

3. The semiconductor memory device as defined in claim 2, wherein the opposite side ends of the paired electrically conductive regions of the set of sub bit lines, lying on the longitudinally opposite side to the one side ends, are interconnected via a wiring arranged on an upper layer on the substrate.

4. The semiconductor memory device as defined in claim 2, wherein at least one of the paired electrically conductive region forming the set of the sub bit lines has one side end and longitudinally opposite side end interconnected via a wiring arranged on an upper layer on the substrate.

5. The semiconductor memory device as defined in claim 2, wherein each of the paired electrically conductive regions forming the set of the sub bit lines has one side end and longitudinally opposite side end interconnected via a wiring arranged on an upper layer on the substrate.

6. A semiconductor memory device comprising a plurality of electrically conductive regions extending parallel to one another on a substrate surface forming a memory cell array area; wherein
two of the plural electrically conductive regions are connected as a pair to form a set of sub bit lines;
each set of the sub bit lines are connected to a main bit line via an associated selection transistor;
a plurality of said selection transistors are arranged on both ends of said memory cell array, in an opposing relation to one another; and
a plural number of sets of said sub bit lines respectively connected to plural selection transistors on one end of said memory cell array and a plural number of sets of said sub bit lines respectively connected to plural selection transistors on the opposite end of said memory cell array are arranged alternately, wherein the paired electrically conductive regions forming the set of the sub bit lines are split in a plurality of stages and provided between one side of the memory cell array and the side thereof opposite to the one side;
a wiring formed on an upper layer on the substrate in association with the set of the sub bit lines, said wiring extending across a plurality of stages of the paired electrically conductive regions, from one side connected to the selection transistor associated with the set of the sub bit lines to the opposite side;
the wiring lying extending across a plurality of stages of the paired electrically conductive regions being connected to the wiring interconnecting the electrically conductive regions of the respective stages.

7. A semiconductor memory device comprising a plurality of electrically conductive regions extending parallel to one another on a substrate surface forming a memory cell array area; wherein
two of the plural electrically conductive regions are connected as a pair to form a set of sub bit lines;
each set of the sub bit lines are connected to a main bit line via an associated selection transistor;
a plurality of said selection transistors are arranged on both ends of said memory cell array, in an opposing relation to one another; and a plural number of sets of said sub bit lines respectively connected to plural selection transistors on one end of said memory cell array and a plural number of sets of said sub bit lines respectively connected to plural selection transistors on the opposite end of said memory cell array are arranged alternately, wherein, of respective longitudinal ends of the paired electrically conductive regions of the set of sub bit lines, the ends lying on the side of the selection transistor associated with the set of sub bit lines (referred to as one side ends) are interconnected via a first wiring arranged on an upper layer on the substrate, and wherein the ends longitudinally opposite to the one lateral side end, are interconnected by a second wiring arranged on an upper layer on the substrate; and the first wiring and the second wiring are interconnected via a third wiring arranged on an upper layer on the substrate.

8. A semiconductor memory device comprising a plurality of electrically conductive regions extending parallel to one another on a forming a memory cell array area; wherein two of the plural electrically conductive regions are connected as a pair to form a set of sub bit lines;

each set of the sub bit lines are connected to a main bit line via an associated selection transistor;

a plurality of said selection transistors are arranged on both ends of said memory cell array, in an opposing relation to one another; and a plural number of sets of said sub bit lines respectively connected to plural selection transistors on one end of said memory cell array and a plural number of sets of said sub bit lines respectively connected to plural selection transistors on the opposite end of said memory cell array are arranged alternately, wherein, of respective longitudinal ends of the paired electrically conductive regions of the set of sub bit lines, the ends lying on the side of the selection transistor associated with the set of sub bit lines (referred to as one side ends) are interconnected via a first wiring arranged on of an upper layer of the substrate, and wherein the ends longitudinally opposite to the one lateral side end, are interconnected by a second wiring arranged on of an upper layer of the substrate;

both longitudinal ends of the electrically conductive region being interconnected via a third wiring arranged on of an upper layer of the substrate.

9. A semiconductor memory device comprising a of electrically conductive regions extending parallel to one another on a substrate surface forming a memory cell array area; wherein two of the plural electrically conductive regions are connected as a pair to form a set of sub bit lines;

each set of the sub bit lines are connected to a main bit line via an associated selection transistor;

a plurality of said selection transistors are arranged on both ends of said memory cell array, in an opposing relation to one another; and a plural number of sets of said sub bit lines respectively connected to plural selection transistors on one end of said memory cell array and a plural number of sets of said sub bit lines respectively connected to plural selection transistors on the opposite end of said memory cell array are arranged alternately, wherein one end of one of the paired electrically conductive regions forming the set of sub bit lines, is connected to the longitudinally opposite end of the other of the paired electrically conductive regions by a wiring provided on an upper layer on the substrate.

10. The semiconductor memory device as defined in claim 9, wherein one end of one of the paired two electrically conductive regions forming the set of sub bit lines is interconnected to another end of the other of the paired electrically conductive regions by a wiring provided on an upper layer on the substrate, said one end of the one of the paired electrically conductive region located on one side connected to the selection transistor, said another end longitudinally opposite to said one end.

11. A semiconductor memory device comprising a plurality of electrically conductive regions extending parallel to one another on a substrate surface forming a memory cell array area; wherein two of the plural electrically conductive regions are connected as a pair to form a set of sub bit lines;

each set of the sub bit lines are connected to a main bit line via an associated selection transistor;

a plurality of said selection transistors are arranged on both ends of said memory cell array, in an opposing relation to one another; and a plural number of sets of said sub bit lines respectively connected to plural selection transistors on one end of said memory cell array and a plural number of sets of said sub bit lines respectively connected to plural selection transistors on the opposite end of said memory cell array are arranged alternately, wherein there are provided a plurality of stages of paired electrically conductive regions forming one set of said sub bit lines from a selection transistor on one side of the memory cell array to a selection transistor on the opposite side of the memory cell array, the paired electrically conductive regions being formed by interconnecting one side end of one electrically conductive region to another end of the other electrically conductive region, by a wiring provided on an upper layer on the substrate, said another end being longitudinally opposite to the one end.

12. A semiconductor memory device comprising:

a first group of electrically conductive regions composed of a plural number of electrically conductive regions extending parallel to on another on a memory cell array region on a substrate surface, from one side of the memory cell array to the opposite side thereof, and a second group of electrically conductive regions composed of a plural number of electrically conductive regions extending parallel to one another from the other end to the one end of the memory cell array;

each of a plurality of gate electrodes extending parallel to one another via an insulating film on the substrate surface in a direction perpendicular to a direction along which the electrically conductive regions are extended, each gate electrode composing a word line;

two of the electrically conductive regions of the plural electrically conductive regions belonging to the same set being paired to form a set of sub bit lines;

one of the paired electrically conductive regions forming one set of the sub bit lines being connected to one of the paired diffusion layers of the selection transistor, the gate of which is connected to a selection control line, the other diffusion layer of the selection transistor being connected to a main bit line formed on an upper layer out the substrate;

the paired electrically conductive regions forming the set of the sub bit lines having respective ends on the side connected to the selection transistor (termed one side ends) via a contact to one wiring on an upper layer on the substrate; and wherein between the paired electrically conductive regions forming the set of the sub bit lines, there are arranged each one of paired electrically conductive regions forming two sets of the sub bit lines, connected via selection transistors to two main bit lines lying on both sides of the main bit line to which the set of the sub bit lines are connected via selection transistor and each one of paired electrically conductive regions forming two sets of the sub bit lines, respectively connected to two main bit lines neighboring to each other via a selection transistor lying opposite to the selection transistor connected to the set of the sub bit lines, totaling at four electrically conductive regions.

13. The semiconductor memory device as defined in claim 12, wherein the paired electrically conductive regions forming the set of the sub bit lines are connected to the first wiring formed on an upper layer on the substrate by a contact at respective ends connected to the selection transistor associated with the set of the sub bit lines (termed one side ends), while being connected by a contact to a second wiring formed on an upper layer on the substrate at respective ends longitudinally opposite to the one side ends of the paired electrically conductive regions.

14. The semiconductor memory device as defined in claim 12, wherein the longitudinal ends of the paired electrically conductive regions are interconnected via a wire provided on an substrate upper layer.

15. The semiconductor memory device as defined in claim 12, wherein there are arranged, for each splitting unit of cell arrays, a structure in which, between the paired electrically conductive regions forming one set of the sub bit lines, there are arranged, each one of paired electrically conductive regions forming two sets of the sub bit lines, connected via selection transistors to two main bit lines lying on both sides of the main bit line to which the set of the sub bit lines are connected via selection transistors and each one of paired electrically conductive regions forming two sets of the sub bit lines, respectively connected to two neighboring main bit lines via selection transistors the opposite side to the selection transistor connected to said one set of the sub bit lines, rotating at four electrically conductive regions, there being arranged a plurality of stages of the splitting units of the cell arrays from one end to the opposite end of the memory cell array;

there are arranged a plurality of wrings on an upper layer on the substrate, each wring formed in association with said one set of the sub bit lines, extending from one side connected to the selection transistor to the opposite side, across the paired electrically conductive regions of the splitting units of the plural stages; and wherein the wiring extended across the paired electrically conductive regions of the splitting units of the plural stages of the cell array is connected to each of wirings interconnecting the paired electrically conductive regions forming the sets of the sub bit lines of the splitting units of the plural stages.

16. The semiconductor memory device as defined in claim 12, wherein the selection transistors are isolated from one another by a field oxide film.

17. The semiconductor memory device as defined in claim 15, wherein there are provided cell arrays sharing the wiring interconnecting the paired electrically conductive regions composing the one set of sub bit lines by two splitting units.

18. A semiconductor memory device comprising a first group of electrically conductive regions composed of a plural number of electrically conductive regions extending parallel to one another on a memory cell array region on a substrate surface from one side of the memory cell array to the opposite side thereof, and a second group of electrically conductive regions composed of a plural number of electrically conductive regions extending parallel to one another from the other end to the one end of the memory cell array;

each of group of gate electrodes, each gate electrode extending parallel to one another via an insulating film on the substrate surface in a direction perpendicular to the extending direction of the electrically conductive regions, to form a word line;

two of the electrically conductive regions of the plural electrically conductive regions belonging to the same group being paired to form a set of sub bit lines;

one of the paired electrically conductive regions forming one set of the sub bit lines being connected to one of the paired diffusion layers of the selection transistor to the gate of which is connected a selection control line, the other diffusion layer of the selection transistor being connected to a main bit line on an upper layer on the substrate;

the end of the paired electrically conductive regions forming the set of the sub bit lines, lying on the side of one electrically conductive region connected to the selection transistor (termed one side end) is connected via a contact to one wiring of the wiring layer on a upper substrate layer to the longitudinally opposite end of the other electrically conductive region; and wherein there are arranged, between the paired electrically conductive regions forming the set of the sub bit lines, each one of paired electrically conducive regions forming two sets of the sub bit lines, connected via selection transistors to two main bit lines lying on both sides of the main bit line to which the set of the sub bit lines are connected via selection transistor and each one of paired electrically conductive regions forming two sets of the sub bit lines, respectively connected to two main neighboring bit lines via a selection transistor connected to the set of the sub bit lines, totaling at four electrically conductive regions.

19. A semiconductor memory device comprising a plurality of electrically conductive regions extending parallel to one another on a substrate surface forming a memory cell array area; wherein two of the plural electrically conductive regions are connected as a pair to form a set of sub bit lines;

each set of the sub bit lines are connected to a main bit line via an associated selection transistor;

a plurality of said selection transistors are arranged on both ends of said memory cell array, in an opposing relation to one another; and a plural number of sets of said sub bit lines respectively connected to plural selection transistors on one end of said memo cell array and a plural number of sets of said sub bit lines respectively connected to plural selection transistors on the opposite end of said memory cell array are arranged alternately, further comprising a power supply for applying a ground potential and a preset positive voltage to first and second ones of two neighboring electrically conductive regions associated with a selected memory cell, respectively, and preset positive voltage to a gate electrode associated with the selected memory cell and for applying, when writing in the memory cell, a voltage between the positive voltage applied to the second electrically conductive region and the ground potential of a third electrically conductive region neighboring to the second electrically conductive region to which the positive voltage is applied, the third electrically conductive region lying on the opposite side to the first electrically conductive region.

20. A semiconductor memory device comprising a plurality of electrically conductive regions extending parallel to one another on a substrate surface forming a memory cell array area; wherein two of the plural electrically conductive regions are connected as a pair to form a set of sub bit lines;

each set of the sub bit lines are connected to a main bit line via an associated selection transistor;

a plurality of said selection transistors are arranged on both ends of said memory cell array, in an opposing relation to one another; and a plural number of sets of said sub bit lines respectively connected to plural selection transistors on one end of said memory cell array and a plural number of sets of said sub bit lines respectively connected to plural selection transistors on the opposite end of said memory cell array are arranged alternately, further comprising a power supply for applying a ground potential and a preset positive voltage to first and second ones of two electrically conductive regions associated with a selected memory cell, and a preset positive voltage to a gate electrode associated with the selected memory cell and for applying, when writing in the memory cell, a positive voltage of the same level as that of the second electrically conductive region, to an electrically conductive region neighboring to the second electrically conductive region supplied with the positive voltage, and to an electrically conductive region forming sub bit lines having an electrically conductive region other than the first electrically conductive region, the electrically conductive region forming sub bit lines having an electrically conductive region other than the first electrically conductive region being from the electrically conductive regions neighboring to a third by being electrically conductive region forming set of the sub bit lines by paired to the second electrically conductive region; and for applying a voltage between the positive voltage applied to the second electrically conductive region and the ground potential to at least one of the first electrically conductive region, fourth electrically conductive region forming one set of sub bit lines by being paired with the first electrically conductive region and an electrically conductive region arranged between electrically conductive regions to which is applied the positive voltage.

21. A semiconductor memory device comprising a plurality of electrically conductive regions extending parallel to one another on a forming a memory cell array area; wherein two of the plural electrically conductive regions are connected as a pair to form a set of sub bit lines;

each set of the sub bit lines are connected to a main bit line via an associated selection transistor;

a plurality of said selection transistors are arranged on both ends of said memory cell array, in an opposing relation to one another; and a plural number of sets of said sub bit lines respectively connected to plural selection transistors on one end of said memory cell array and a plural number of sets of said sub bit lines respectively connected to plural selection transistors on the opposite end of said memory cell array are arranged alternately, further comprising a power supply for applying a ground potential and a preset positive voltage to first and second ones of two neighboring electrically conductive regions associated with a selected memory cell, a preset positive voltage to a gate electrode associated with the selected memory cell and for applying, when reading out from the memory cell, a voltage of the same level as the second electrically conductive region to third electrically conductive regions among electrically conductive regions neighboring to the second electrically conductive region supplied with the positive voltage, said third electrically conductive regions lying on an adjacent column located on a side opposite to the first electrically conductive region.

22. A semiconductor memory device comprising a plurality of electrically conductive regions extending parallel to one another on a substrate surface forming a memory cell array area; wherein two of the plural electrically conductive regions are connected as a pair to form a set of sub bit lines;

each set of the sub bit lines are connected to a main bit line via an associated selection transistor;

a plurality of said selection transistors are arranged on both ends of said memory cell array, in an opposing relation to one another; and a plural number of sets of said sub bit lines respectively connected to plural selection transistors on one end of said memory cell array and a plural number of sets of said sub bit lines respectively connected to plural selection transistors on the opposite end of said memory cell array are arranged alternately, further comprising a power supply for applying a ground potential and a preset positive voltage to first and second ones of two neighboring electrically conductive regions associated with a selected memory cell, and a preset positive voltage to a gate electrode associated with the selected memory cell and or applying, when reading out from the memory cell, a voltage of the same level as the second electrically conductive region to an electrically conductive region neighboring to the second electrically conductive region supplied with the positive voltage, and to an electrically conductive region forming sub bit lines having an electrically conductive region other than the first electrically conductive region, the electrically conductive region forming sub bit lines having an electrically conductive region other than the first electrically conductive region being from the electrically conductive regions neighboring to a third by being electrically conductive region forming a set of the sub bit lines by paired to the second electrically conductive region; and for applying a ground voltage to at least one of the first electrically conductive region and an electrically conductive region arranged between a fourth electrically conductive region forming a set of sub bit lines by being paired with the first electrically conductive region and the electrically conductive region to which is applied the positive voltage.

23. A semiconductor memory device comprising a plurality of electrically conductive regions extending parallel to one another on a substrate surface forming a memory cell array area; wherein two of the plural electrically conductive regions are connected as a pair to form a set of sub bit lines;

each set of the sub bit lines are connected to a main bit line via an associated selection transistor;

a plurality of said selection transistors are arranged on both ends of said memory cell array, in an opposing relation to one another; and a plural number of sets of said sub bit lines respectively connected to plural selection transistors on one end of said memory cell array and a plural number of sets of said sub bit lines respectively connected to plural selection transistors on the opposite end of said memory cell array are arranged alternately, operating as a programable non-volatile semiconductor storage device, wherein a memory cell formed in two neighboring electrically conductive regions includes, intermediate the substrate surface and the gate electrode an ONO film composed of a first oxide film, a nitride film and a second oxide film.

24. The semiconductor memory device as defined in claim 23, operating as a programmable non-volatile semiconductor storage device, wherein two storage nodes are provided for one memory cell and wherein two bit data are stored in one the memory cell.

25. A method of controlling write operation in a semiconductor storage device in which a set of sub bit lines are formed by interconnecting a pair of electrically conductive regions extending parallel to each other on substrate surface, a plurality of selection transistors for connecting a set of sub bit lines to an associated main bit line are arranged on both longitudinal end side of a memory cell array; and in which a plurality of sets of sub bit lines respectively connected to the selection transistors arranged on one and on the other longitudinal end sides of the memory cell array are arranged alternately; said method comprising the steps of:

applying a ground potential and a preset positive voltage to first and second ones of two neighboring electrically conductive regions associated with a selected memory cell, and a preset positive voltage to a gate electrode associated with the selected memory cell; and applying, when writing in the memory cell, a voltage between the positive voltage applied to the second electrically conductive region and the ground potential to a third electrically conductive region neighboring to the second electrically conductive region to which the positive voltage is applied, the third electrically conductive region lying on the opposite side to the first electrically conductive region.

26. A method of controlling trite operation in a semiconductor storage device in which a set of sub bit lines are formed by interconnecting a pair of electrically conductive regions extending parallel to each other on substrate surface, a plurality of selection transistors for connecting a set of sub bit lines to an associated main bit line are arranged on both longitudinal end side of a memory cell array; and in which a plurality of sets of sub bit lines respectively connected to the selection transistors arranged on one and on the other longitudinal end sides of the memory cell array are arranged alternately; said method comprising the step of:

applying a ground potential and a preset positive voltage to first and second ones of two electrically conductive regions associated with a selected memory cell, and a preset positive voltage to a gate electrode associated with the selected memory cell; and applying, when writing in the memory cell, a positive voltage of the same level as that of the second electrically conductive region, to an electrically conductive region neighboring to the second electrically conductive region supplied with the positive voltage, and to an electrically conductive region forming sub bit lines having an electrically conductive region other than the first electrically conductive region among the electrically conductive regions neighboring to a third by being electrically conductive region forming a set of the sub bit lines by paired to the second electrically conductive region; and applying a voltage between the positive voltage supplied with the positive voltage and the ground voltage to at least one of the first electrically conductive region and an electrically conductive region arranged between a fourth electrically conductive region forming a set of sub bit lines by being paired with the first electrically conductive region and the electrically conductive region to which is applied the positive voltage.

27. A method of controlling read operation in a semiconductor storage device in which a set of sub bit lines are formed by interconnecting a pair of electrically conductive regions extending parallel to each other on substrate surface, a plurality of selection transistors for connecting a set of sub bit lines to an associated main bit line are arranged on both longitudinal end side of a memory cell array; and in which a plurality of sets of sub bit lines respectively connected to the selection transistors arranged on one and on the other longitudinal end sides of the memory cell array are arranged in an interchanged fashion; the method comprising the steps of:

applying a ground potential and a preset positive voltage respectively to first and second ones of two neighboring electrically conductive regions associated with a selected memory cell, and a preset positive voltage to a gate electrode associated with the selected memory cell; and applying, when reading out from the memory cell, a positive voltage of the same level applied to the second electrically conductive region to third electrically conductive region neighboring to the second electrically conductive region to which the positive voltage is applied, the third electrically conductive region lying on the opposite side to the first electrically conductive region.

28. A method of controlling read operation in a semiconductor storage device in which a set of sub bit lines are formed by interconnecting two paired electrically conductive regions extending parallel to each other on substrate surface, a plurality of selection transistors for connecting a set of sub bit lines to an associated main bit line are arranged on both longitudinal end side of a memory cell array; and in which a plurality of sets of sub bit lines respectively connected to the selection transistors arranged on one and on the other longitudinal end sides of the memory cell array are arranged in an interchanged fashion; the method comprising the steps of:

applying a ground potential and a preset positive voltage respectively to first and second ones of two neighboring electrically conductive region associated with a selected memory cell, a preset positive voltage to the second electrically conductive region and a preset positive voltage to a gate electrode associated with the selected memory cell, and for applying, when reading out from the memory cell, a positive voltage of the same level as that of the second electrically conductive region, to an electrically conductive region neighboring to the second electrically conductive region supplied with the positive voltage, said to an electrically conductive region forming sub bit lines having an electrically conductive region other than the first electrically conductive region, the electrically conductive region forming sub bit lines having an electrically conductive region other than the first electrically conductive region being from the electrically conductive regions neighboring to a third by being electrically conductive region forming a set of the sub bit lines by paired to the second electrically conductive region; and applying a ground potential to at least one of the first electrically conductive region and an electrically conductive region arranged between a fourth electrically conductive region forming a set of sub bit lines by being paired with the first electrically conductive region and the electrically conductive region to which is applied the positive voltage.

29. The method as defined in claim 25, wherein in a region between the sub bit lines of the set, there are arranged each one of two sets of sub bit lines, connected via selection transistors to two main bit lines lying on both sides of the main bit line to which the set of the sub bit lines are connected via selection transistor and each one of two sets of the sub bit lines, respectively connected to two main bit lines neighboring to each other via a selection transistor on the longitudinally opposite side of the memory cell array, totaling at four sub bit lines.

30. The method as defined in claim 27, wherein in a region between the sub bit lines of the set, there are arranged each one of two sets of sub bit lines, connected via selection transistors to two main bit lines lying on both sides of the main bit line to which the set of the sub bit lines are connected via selection transistor and each one of two sets of the sub bit lines, respectively to two main bit lines neighboring to each other via a selection transistor on the longitudinally opposite side of the memory cell array, totaling at four sub bit lines.

31. A semiconductor memory device comprising:

a plurality of electrically conductive regions extending parallel to one another on a substrate surface forming a memory cell region; wherein two of the electrically conductive regions are connected as a pair to form a set of sub bit lines; the one set of the sub bit lines being connected to a main bit line via a selection transistor;

a plurality of the selection transistors are arranged opposing to one another on both sides of the memory cell array;

the memory cell array is formed by a plurality or (M) sets, each set being composed of a plurality of (N) word lines as a unit;

M sets of paired electrically conductive regions, forming said one set of sub bit lines, are arranged along two lines, corresponding to the M sets forming the memory cell array;

for each of the M sets of paired electrically conductive regions, one end of one of the paired electrically conductive regions and another end of the other of the paired electrically conductive regions are interconnected via a wiring on an upper layer on the substrate, the another end being longitudinally opposite to the one end; and wherein the paired electrically conductive regions of each of the M sets are connected common to one of the selection transistors via the wiring on an upper layer on the substrate.

32. The semiconductor memo devices defined in claim 31, wherein the end of one of the paired electrically conductive regions of one the set is on the same line as the one of the paired electrically conductive regions and is isolated from the end of one of the paired electrically conductive regions of the other set neighboring to one the set;

the end of the other of the paired electrically conductive regions of one the set is on the same line as the other of the paired electrically conductive regions and is connected to the end of the other of the paired electrically conductive regions o the other set neighboring to the one set via electrically conductive regions forming a junction area; and wherein the wiring is connected via a contact to a junction of the ends of the other of the paired electrically conductive regions of one the set and the other set neighboring thereto, and is connected via a contact to the ends longitudinally opposite to the isolated ends of the paired electrically conductive regions of one the set and the other set neighboring thereto.

33. The semiconductor memory device as defined in claim 31, wherein the M is an even number not less than four;

the end of a first electrically conductive region of paired electrically conductive regions of a jth set and the end of a first electrically conductive region of the paired electrically conductive regions of a (j+1)th set, j being an integer not less than 1 and not more than M−2, are isolated from each other, the ends of the second electrically conductive regions are connected to each other, the end of the first electrically conductive region of the paired electrically conductive regions of a (j+1)th set and the end of the first electrical conductive region of the paired electrically conductive regions of a (j+2)th set are connected to each other and the end of the second electrically conductive region of the pair of electrically conductive regions of the (j+1)th set and the end of the second electrically conductive region of the pair of electrically conductive regions of the (j+2)th set are isolated from each other; and wherein the line of the paired electrically conductive regions of the M sets connected common to one selection transistor in which the ends are isolated from each other and the line of the paired electrically conductive regions of the M sets connected common to one selection transistor in which the ends are connected to each other are alternately interchanged from one set to another.

34. The semiconductor memory devices defined in claim 31, wherein the end of one of the paired electrically conductive regions of the one set is connected to the end of one of the paired electrically conductive regions of the other set lying on the same line as the one of the paired electrically conductive regions and neighboring to the one set; and wherein the wiring is connected via a contact to a junction of the ends of the first electrically conductive regions of the one and the other neighboring sets of the paired electrically conductive regions, and is connected via a contact to the ends longitudinally opposite to the junction of the second electrically conductive regions of the one and the other neighboring sets of the paired electrically conductive regions.

35. The semiconductor memory device as defined in claim 32, wherein the M is an even number not less than four and wherein as for M sets of paired electrically conductive regions, connected common to one selection transistor, the wiring is connected to a junction area between a first line of the electrically conductive regions of the jth set, j being an integer not less than 1 and not more than M−1, and a first line of the electrically conductive regions of the (j+1)th set, at a longitudinally opposite end or the junction, via a contact, and wherein the wiring is connected to a junction between the first line of the electrically conductive regions of the (j+1)th set, and the electrically conductive regions of the jth set, at a longitudinally opposite junction or end, via a contact, the wiring being connected via a contact to a junction between the ends of the second lines of the jth set and the ends of the electrically conductive regions o the (j+1)th set.

36. The semiconductor memory device as defined in claim 31, wherein there arranged between two of the paired electrically conductive regions, two electrically conductive regions associated with each one of two set of the sub bit lines, connected via selection transistors to two main bit lines lying on both ides of the main bit line to which the set of the sub bit lines are connected via selection transistor and two electrically conductive regions associated with each one of two sets of the sub bit lines respectively connected to two neighboring main bit lines via a selection transistor lying on the opposite side of the memory cell array, totaling at four electrically conductive regions.

37. The semiconductor memory device as defined in claim 31, further comprising a power supply for applying a ground potential to a first one of two neighboring electrically conductive regions associated with a selected memory cell, a preset positive voltage to a gate electrode associated wish the selected memory cell and for applying, when writing in the memory cell, a voltage intermediate the positive voltage applied to the second electrically conductive region and the ground potential to a third electrically conductive region neighboring to the second electrically conductive region to which the positive voltage is applied, the third electrically conductive region lying on the opposite side to the second electrically conductive region to which the positive voltage is applied.

38. The semiconductor memory device as defined in claim 31, further comprising a power supply for applying a ground potential to a first one of two neighboring electrically conductive regions associated with a selected memory cell, a preset positive voltage to a gate electrode associated with the selected memory cell and for applying, when writing in the memory cell, a positive voltage of the same level as that of the second electrically conductive region, to an electrically conductive region neighboring to the second electrically conductive region supplied with the positive voltage, and to an electrically conductive region forming sub bit lines having an electrically conductive region other than the first electrically conductive region, the electrically conductive region forming sub bit lines having an electrically conductive region other than the first electrically conductive region being from the electrically conductive regions neighboring to a third by being electrically conductive region forming a set of the sub bit lines by paired to the second electrically conductive region; and for applying a ground voltage to at least one of the first electrically conductive region and an electrically conductive region arranged between a forth electrically conductive region forming a set of sub bit lines by being paired with the first electrically conductive region and the electrically conductive region to which is applied the positive voltage.

39. The memory device as defined in claim 31, further comprising a power supply for applying a ground potential to a first one of two neighboring electrically conductive regions associated with a selected memory cell, a preset positive voltage to a second electrically conductive region and a preset positive voltage to a gate electrode associated with the selected memory cell and for applying, when reading from the memory cell, a voltage of the same level as the second electrically conductive region to a third electrically conductive region neighboring to the second electrically conductive region to which the positive voltage is applied, the third electrically conductive region lying on the opposite side to the first electrically conductive region.

40. The semiconductor memory device as defined in claim 31, further comprising a power supply for applying a ground potential to a first one of two neighboring electrically conductive regions associated with a selected memory cell, a preset positive voltage to a second electrically conducive region and a preset positive voltage to a gate electrode associated with the selected memory cell and for applying, when reading out from the memory cell, a voltage of the same level as the second electrically conductive region to a third electrically conductive region neighboring to the second electrically conductive region to which the positive voltage is applied, the third electrically conductive region lying on the opposite side to the first electrically conductive region; and for applying a ground voltage to at least one of the first electrically conductive region and an electrically conductive region arranged between a fourth electrically conductive region forming a set of sub bit lines by being paired with the first electrically conductive region and the electrically conductive region to which is applied the positive voltage.

41. The semiconductor memory device as defined in claim 31, operating as a programmable non-volatile memory, wherein a memory cell formed in two neighboring electrically conductive regions includes, intermediate the substrate surface and the gate electrode, an ONO film composed of a first oxide film, a nitride film and a second oxide film.

42. A semiconductor device comprising:

a memory cell array region including a of memory cells arranged in an array format on a substrate;

a plurality of main bit lines;

a plurality of selection transistors, each arranged between the main bit line and an associated set of sub bit lines, controlled on and off by a selection control signal;

a plural number of electrically conductive regions extending parallel to one another on the memory cell array region on the substrate surface, said electrically conductive regions paired two by two to form a plural sets of sub bit lines, each set of sub bit lines connected via an associated one of the selection transistors to the main bit line, one end of one of paired electrically conductive regions forming one set of sub bit lines, diagonally interconnected to another end of the other of the paired electrically conductive regions via a wiring provided on an upper layer on the substrate, said another end being longitudinally opposite to said one end; and a plurality of gate electrodes extending parallel one another via an insulating film on the substrate surface in the memory cell array region in direction perpendicular to a direction along which the electrically conductive regions are extended, each gate electrode composing a word line, the memory cell being formed at an intersection area of the gate electrode and neighboring two electrically conductive regions.

43. The semiconductor device as defined in claim 42, wherein a plurality of said selection transistors are arranged on both ends of said memory cell array, in an opposing relation to one another; and a plural number of sets of said sub bit lines respectively connected to plural selection transistors on one end of said memory cell array and a plural number of sets of said sub bit lines respectively connected to plural selection transistors on the opposite end of said memory cell array are arranged alternately.

44. The semiconductor device as defined in claim 42, wherein there are provided a plurality of stages of paired electrically conductive regions forming one set of said sub bit lines from a selection transistor on one side of the memory cell array to a selection transistor on the opposite side of the memory cell array, the paired electrically conductive regions being formed by interconnecting one side end of one electrically conductive region to another end of the other electrically conductive region, by a wiring provided on an upper layer on the substrate, said another end being longitudinally opposite to the one end.

45. The semiconductor device as defined in claim 42, wherein the selection transistors are isolated from one another by a field oxide film.

* * * * *

UNITED STATES PATENT AND TRADEMARK OFFICE
CERTIFICATE OF CORRECTION

PATENT NO.    : 6,788,562 B2
DATED         : September 7, 2004
INVENTOR(S)   : Nishizaka et al.

It is certified that error appears in the above-identified patent and that said Letters Patent is hereby corrected as shown below:

Column 35,
Line 42, "sad" should be -- said --.

Column 36,
Line 18, "region" should be -- regions --.

Column 37,
Line 48, insert -- plurality -- between "comprising a" and "of".

Column 38,
Line 65, "layer out the substrate" should be -- layer on the substrate --.

Column 39,
Line 47, insert -- on -- between "transistors" and "the opposite".

Column 40,
Line 64, "said memo cell" should be -- said memory cell --.

Column 43,
Line 34, insert -- a -- between "on" and "substrate".
Line 58, "controlling trite" should be -- controlling write --.
Line 64, "end side" should be -- end sides --.

Column 45,
Line 50, insert -- connected -- between "respectively" and "to two".
Line 65, "plurality or" should be -- plurality of --.

Column 46,
Line 27, "regions o the" should be -- regions of the --.

Column 47,
Line 37, "both ides" should be -- both sides --.
Line 48, "associated wish" should be -- associated with --.

UNITED STATES PATENT AND TRADEMARK OFFICE
CERTIFICATE OF CORRECTION

PATENT NO. : 6,788,562 B2
DATED : September 7, 2004
INVENTOR(S) : Nishizaka et al.

It is certified that error appears in the above-identified patent and that said Letters Patent is hereby corrected as shown below:

<u>Column 48,</u>
Line 56, insert -- plurality -- between "a" and "of".

Signed and Sealed this

First Day of March, 2005

JON W. DUDAS
*Director of the United States Patent and Trademark Office*